(12) United States Patent
Fujii et al.

(10) Patent No.: US 8,372,718 B2
(45) Date of Patent: Feb. 12, 2013

(54) MANUFACTURING METHOD OF SEMICONDUCTOR DEVICE AND SEMICONDUCTOR DEVICE

(75) Inventors: Yasuhiro Fujii, Tokyo (JP); Kazumasa Yonekura, Tokyo (JP); Tatsunori Kaneoka, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/607,804

(22) Filed: Sep. 10, 2012

(65) Prior Publication Data

US 2012/0329240 A1 Dec. 27, 2012

Related U.S. Application Data

(63) Continuation of application No. 12/687,110, filed on Jan. 13, 2010, now Pat. No. 8,288,232.

(30) Foreign Application Priority Data

Feb. 9, 2009 (JP) ................................. 2009-027360

(51) Int. Cl.
*H01L 21/8234* (2006.01)
(52) U.S. Cl. .......... 438/275; 257/E21.625; 257/E21.627
(58) Field of Classification Search .................. 438/275; 257/E21.625, E21.627
See application file for complete search history.

(56) References Cited

U.S. PATENT DOCUMENTS

| 6,642,105 | B2 | 11/2003 | Kim et al. |
|---|---|---|---|
| 7,067,389 | B2 | 6/2006 | Lee et al. |
| 7,115,940 | B2 | 10/2006 | Sumino et al. |
| 7,488,662 | B2 | 2/2009 | Zhang et al. |
| 7,705,394 | B2 * | 4/2010 | Sugimae et al. ............... 257/316 |
| 2006/0008962 | A1 * | 1/2006 | Ozeki et al. ................... 438/197 |
| 2008/0280406 | A1 * | 11/2008 | Ema et al. ...................... 438/210 |
| 2009/0078987 | A1 * | 3/2009 | Takayanagi .................... 257/324 |

FOREIGN PATENT DOCUMENTS

| JP | 2004-235313 A | 8/2004 |
|---|---|---|
| JP | 2005-197652 A | 7/2005 |
| JP | 2008-016499 A | 1/2008 |

\* cited by examiner

*Primary Examiner* — Trung Q Dang
(74) *Attorney, Agent, or Firm* — Miles & Stockbridge P.C.

(57) ABSTRACT

An improvement is provided in a manufacturing yield of a semiconductor device including transistors in which gate insulating films have different thicknesses. After a high-breakdown-voltage insulating film is formed over a silicon substrate, a surface of the high-breakdown-voltage insulating film is abraded for a reduction in the thickness thereof so that a middle-breakdown-voltage insulating film is formed to be adjacent to the high-breakdown-voltage insulating film. The high-breakdown-voltage insulating film is formed by a thermal oxidation method so as to extend from an inside of the main surface of the silicon substrate to an outside thereof. The middle-breakdown-voltage insulating film is formed so as to be thinner than the high-breakdown-voltage insulating film. The high-breakdown-voltage insulating film is formed as the gate insulating film of a high-breakdown-voltage MIS transistor, while the middle-breakdown-voltage insulating film is formed as the gate insulating film of a middle-breakdown-voltage MIS transistor.

14 Claims, 43 Drawing Sheets

US 8,372,718 B2

MANUFACTURING METHOD OF SEMICONDUCTOR DEVICE AND SEMICONDUCTOR DEVICE

CROSS-REFERENCE TO RELATED APPLICATIONS

This application is a continuation of application Ser. No. 12/687,110 filed Jan. 13, 2010 now U.S. Pat. No. 8,288,232. The disclosure of Japanese Patent Application No. 2009-27360 filed on Feb. 9, 2009 including the specification, drawings and abstract is also incorporated herein by reference in its entirety.

BACKGROUND OF THE INVENTION

The present invention relates to a semiconductor device technology and, particularly to a technology which is effective when applied to a semiconductor device having transistors in which gate insulating films have different thicknesses.

In semiconductor devices, there are used integrated circuits each formed of elements having various characteristics, formed over a semiconductor substrate, and electrically coupled to each other with wiring. Integrated circuits include a logic circuit for control, a driving circuit, a memory circuit for storing information, and the like. To allow these integrated circuits to perform desired functions, types of semiconductor elements forming the integrated circuits, a wiring method, and the like are designed.

Examples of the semiconductor elements forming the integrated circuits include a field effect transistor (FET), and the like. The field effect transistor mostly has a metal insulator semiconductor (MIS) structure in which a gate electrode is formed over a semiconductor substrate via an insulating film. Note that, in the case of using a silicon dioxide film or the like as the insulating film, the resulting structure is called a metal oxide semiconductor (MOS) structure. Such MIS field effect transistors (hereinafter simply referred to as MIS transistors) are covered with an interlayer insulating film over the semiconductor substrate, and individually insulated. In addition, contact plugs are formed so as to extend through the interlayer insulating film to be electrically coupled to the terminals of the semiconductor elements. Over the interlayer insulating film, such metal wires as to electrically couple the desired contact plugs to each other are formed.

Examples of semiconductor devices examined by the present inventors include an LCD driver which is a driving semiconductor device for causing a liquid crystal display (LCD) to perform a display operation. The LCD driver has integrated circuits having various functions such as an operation control circuit, a main memory circuit, a nonvolatile memory circuit, and a power source control circuit which are mounted over one chip. Thus, the LCD driver is formed of MIS transistors having various characteristics. In particular, there are a MIS transistor which satisfies a high-speed-operation requirement, a MIS transistor which satisfies a high-breakdown-voltage requirement, a MIS transistor which serves as a component of a nonvolatile memory, and the like.

The MIS transistors that satisfy the respective requirements shown above have gate insulating films of different thicknesses. Qualitatively, a MIS transistor having a thinner gate insulating film is capable of higher-speed operation, while a MIS transistor having a thicker gate insulating film is capable of operation with a higher voltage. In the LCD driver examined by the present inventors, MIS transistors having gate insulating films which differ in thickness in the range of 2 to 100 nm are used in accordance with required characteristics. As a result, the LCD driver examined by the present inventors has a structure including gates of different heights over a semiconductor substrate.

For example, in Japanese Unexamined Patent Publication No. 2004-235313 (Patent Document 1), a technology is disclosed which forms a bird's beak of a desired size in each of the end portions of a gate insulating film covering an active region defined by an isolation portion. This allows the provision of a semiconductor device having a gate insulating film with excellent electrical characteristics.

For example, in Japanese Unexamined Patent Publication No. 2005-197652 (Patent Document 2), a technology is disclosed which forms an oxide film for high-voltage element in a high-voltage-element region, and then adjusts a pad-nitride-film strip step in a low-voltage-element/cell region to reduce the height of the oxide film for high-voltage element. This allows a reduction in the level difference between the high-voltage-element region and the low-voltage-element/cell region.

In Japanese Unexamined Patent Publication No. 2008-16499 (Patent Document 3), a technology is disclosed which performs a plasma nitridation process to inhibit the thermal oxidation a second region by a predetermined thermal oxidation process performed in a region of a semiconductor substrate located in a second region, and thereby promoting the thermal oxidation of a first region by a predetermined thermal oxidation process performed in a region of the semiconductor substrate located in the first region to a position deeper than that reached by the thermal oxidation of the second region. As a result, the position of the upper surface of a first oxide film becomes closer to that of the upper surface of a second oxide film thinner than the first oxide film, and the level difference between the first region and the second region can be significantly reduced.

PRIOR ART DOCUMENTS

Patent Documents

[Patent Document 1]
Japanese Unexamined Patent Publication No. 2004-235313
[Patent Document 2]
Japanese Unexamined Patent Publication No. 2005-197652
[Patent Document 3]
Japanese Unexamined Patent Publication No. 2008-16499

SUMMARY OF THE INVENTION

In the semiconductor devices examined by the present inventors, e.g., in the LCD driver, the MIS transistors having the gate insulating films which differ in thickness in the range of 2 to 100 nm are used. Therefore, such a plurality of MIS transistors have gates electrodes at various elevations differing in the range shown above, even though the thicknesses of the gate electrodes are the same. The plurality of MIS transistors over a semiconductor substrate are covered with an interlayer insulating film formed over the semiconductor substrate, and electrically coupled to an upper wiring layer via contact plugs in the interlayer insulating film.

To prevent a short circuit between the gate electrode of each of the MIS transistors and a first wiring layer (the lowermost one of wiring layers) located immediately thereabove, the interlayer insulating film is required to have predetermined thickness. When the elevations of the gate electrodes of the plurality of MIS transistors have differences therebetween, the thickness of the interlayer insulating film is determined to have a value that can ensure a short margin between the gate electrode at the highest elevation and the first wiring layer. However, in the LCD driver examined by the present inventors or the like, the elevations of the gate electrodes have differences therebetween that are close to 100 nm, as described above, so that the thickness of the interlayer insulating film up to the first wiring layer when viewed from the lowermost gate electrode is considerably large. When contact plugs are formed in such a thick interlayer insulating film, it is necessary to form the contact holes at a higher aspect ratio, which becomes technically difficult with the increasing miniaturization of elements. This resultantly causes a reduction in the manufacturing yield of a semiconductor device having transistors in which gate insulating films have different thicknesses.

In addition, since the integrated circuits are formed of various semiconductor elements including the plurality of MIS transistors, it is necessary to isolate these semiconductor elements over the semiconductor substrate. As such an isolation portion, there is an isolation portion having a so-called shallow trench isolation (STI) structure. The isolation portion of the STI structure has a structure in which an insulating film such as a silicon dioxide film is buried in a shallow trench formed in a semiconductor substrate. In regions (active regions) defined in the semiconductor substrate by such isolation portions, various elements are formed.

For example, in the case of forming a MIS transistor which requires a thick gate insulating film, it is necessary to perform thermal oxidation at a high temperature for a long period of time. At this time, due to the difference between the thermal expansion coefficients of a silicon dioxide film forming the STI isolation portion and single-crystal silicon forming an adjacent active region, a stress occurs. It has been proved that the stress affects the characteristics of the MIS transistor formed in the active region.

Accordingly, in Patent Document 1 described above, a technology is disclosed which forms the STI portion after forming the gate insulating film which requires thermal oxidation, i.e., a self align (SA)-STI technology. However, as a result of examining the introduction of such a SA-STI step, the present inventors have found the following problems.

In the step of forming the isolation portion of the STI structure, the shallow trench is formed first in the semiconductor substrate by anisotropic etching, and the silicon dioxide film is formed so as to cover the trench. Thereafter, the surface of the silicon dioxide film is polished by a chemical mechanical polishing (CMP) method so that the silicon dioxide film is buried in the trench, thereby forming the isolation portion. In the SA-STI step examined by the present inventors, after the gate insulating film is formed, this step is performed to form the isolation portion of the STI structure.

It has been proved by a further examination performed by the present inventors that, when the SA-STI step is applied to a manufacturing method of a semiconductor device in which gate insulating films have a thickness difference therebetween as in the LCD driver described above, the following problems arise. That is, in the CMP step for filling the trench with the silicon dioxide film, the silicon dioxide film cannot be completely removed at a stepped portion of the insulating gate film, and remains there. Such a state where the insulating film to be removed remains over the insulating gate film causes variations in the characteristics of the MIS transistors. This resultantly causes a reduction in the manufacturing yield of the semiconductor device having the transistors in which the gate insulating films have different thicknesses.

Thus, the problems which may arise in the semiconductor devices examined by the present inventors each result from the fact that the MIS transistors forming the semiconductor devices have the gate electrodes of different film thicknesses.

It is therefore an object of the present invention to provide a technology which improves the manufacturing yield of a semiconductor device having transistors in which gate insulating films have different thicknesses.

The above and other objects and novel features of the present invention will become apparent from the description of the present specification and the accompanying drawings.

The present invention disclosed in the present application has a plurality of embodiments, and the following is a brief description of the outline of one of the embodiments thereof.

A manufacturing method of a semiconductor device includes the step of forming, in a semiconductor substrate, a first transistor and a second transistor which have respective gate insulating films of different thicknesses. The step of forming the first transistor and the second transistor includes the steps of forming a first insulating film over the semiconductor substrate, and abrading a surface of the first insulating film to reduce a thickness thereof, and form a second insulating film in adjacent relation to the first insulating film. In particular, the first insulating film is formed by a thermal oxidation method so as to extend from an inside of the semiconductor substrate to an outside thereof, and the second insulating film is formed so as to be thinner than the first insulating film. In addition, the first insulating film is formed as the gate insulating film of the first transistor, and the second insulating film is formed as the gate insulating film of the second transistor.

The following is a brief description of a representative effect obtained by the above-mentioned embodiment among the plurality of embodiments of the invention disclosed in the present application.

That is, it is possible to improve the manufacturing yield of a semiconductor device having transistors in which gate insulating films have different thicknesses.

DESCRIPTION OF THE PREFERRED EMBODIMENTS

Figure 1:
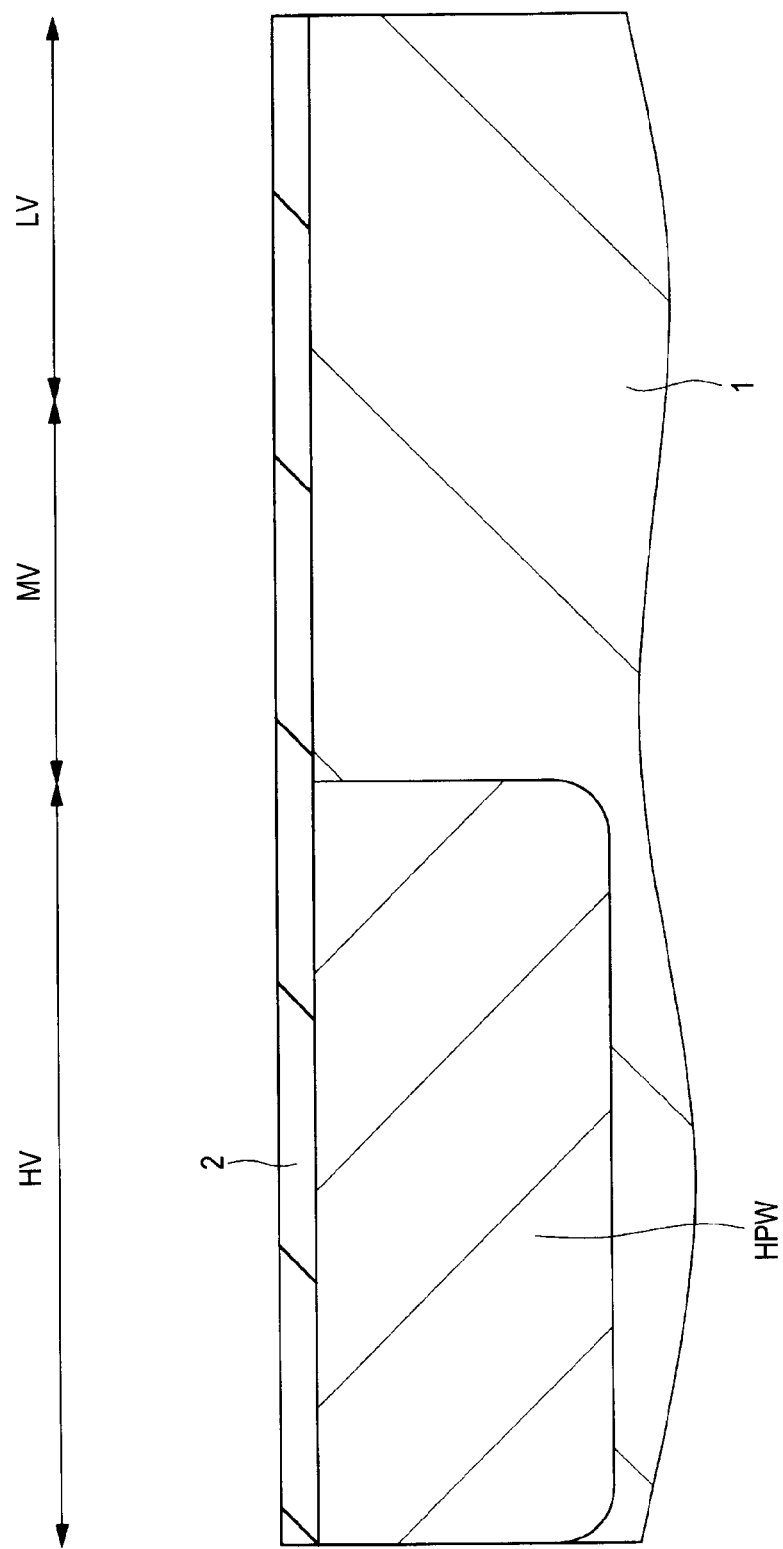
FIG. 1 is a principal-portion cross-sectional view of a semiconductor device according to Embodiment 1 of the present invention during a manufacturing process thereof.

If necessary for the sake of convenience, each of the following embodiments will be described by dividing it into a plurality of sections or embodiments. However, they are by no means irrelevant to each other unless shown particularly explicitly, and are mutually related to each other such that one of the sections or embodiments is a variation or a detailed or complementary description of some or all of the others. When the number and the like (including the number, numerical value, amount, and range thereof) of elements are referred to in the following embodiments, they are not limited to specific numbers unless shown particularly explicitly or unless they are obviously limited to specific numbers in principle. The number and the like of the elements may be not less than or not more than specific numbers. It will be easily appreciated that, in the following embodiments, the components thereof (including also elements, steps, and the like) are not necessarily indispensable unless shown particularly explicitly or unless the components are considered to be obviously indispensable in principle. Likewise, if the shapes, positional relationship, and the like of the components and the like are referred to in the following embodiments, the shapes and the like are assumed to include those substantially proximate or similar thereto unless shown particularly explicitly or unless obviously they are not in principle. The same holds true with regard to the foregoing numerical value and range. Throughout the drawings for illustrating the embodiments of the present invention, members having the same functions will be provided with the same reference numerals, and a repeated description thereof is omitted as long as the omission is possible. Hereinbelow, the embodiments of the present invention will be described in detail with reference to the drawings.

Embodiment 1

A manufacturing method of a semiconductor device of Embodiment 1 of the present invention will be described using FIGS. 1 to 21. FIGS. 1 to 21 show principal-portion cross-sectional views of the semiconductor device of Embodiment 1 during the manufacturing process thereof. In particular, in a high-breakdown-voltage region HV, a middle-breakdown-voltage region MV, and a low-breakdown-voltage region LV in a silicon substrate (semiconductor substrate) 1, a high-breakdown-voltage MIS transistor (first transistor), a middle-breakdown-voltage transistor (second transistor), and a low-breakdown-voltage transistor (second transistor) are formed respectively by process steps described later. In the drawings used in Embodiment 1, the middle-breakdown-voltage region MV is arranged adjacent to the high-breakdown-voltage region HV. However, it is also possible that the low-breakdown-voltage region LV may be arranged adjacent to the high-breakdown-voltage region HV.

As shown in FIG. 1, over the silicon substrate 1, a pad oxide film 2 made of an insulating film containing silicon dioxide as a main component, and having a thickness of about 15 nm is formed. The pad oxide film 2 is formed by oxidizing the surface of the silicon substrate 1 by a thermal oxidation method.

Subsequently, in the surface side of the high-breakdown-voltage region HV in the silicon substrate 1, a high-breakdown-voltage p-well region HPW is formed. The high-breakdown-voltage p-well region HPW is a semiconductor region of a p-type conductivity. In a subsequent process step, the high-breakdown-voltage MIS transistor is formed in the high-breakdown-voltage p-well region HPW.

A p-type semiconductor region such as the high-breakdown-voltage p-well region HPW is formed by introducing a group-II or group-III impurity element (such as, e.g., boron (B)) into the silicon substrate 1 by an ion implantation method, and performing activation by heat treatment. Here, impurity ions are implanted with such energy as to allow the transmission of the impurity ions through the pad oxide film 2. At the time of ion implantation, the surfaces of regions other than the high-breakdown-voltage region HV, e.g., the middle-breakdown-voltage region MV and the low-breakdown-voltage region LV are covered with an ion implantation mask (not shown) so that ion implantation is not performed thereto. The ion implantation mask is formed by patterning a photoresist film by a photolithographic method or the like. The heat treatment may also be performed in the same step as that of heat treatment required in another step. Hereinafter, it is assumed that the step of forming the p-type semiconductor region is the same unless particularly mentioned.

Figure 2:
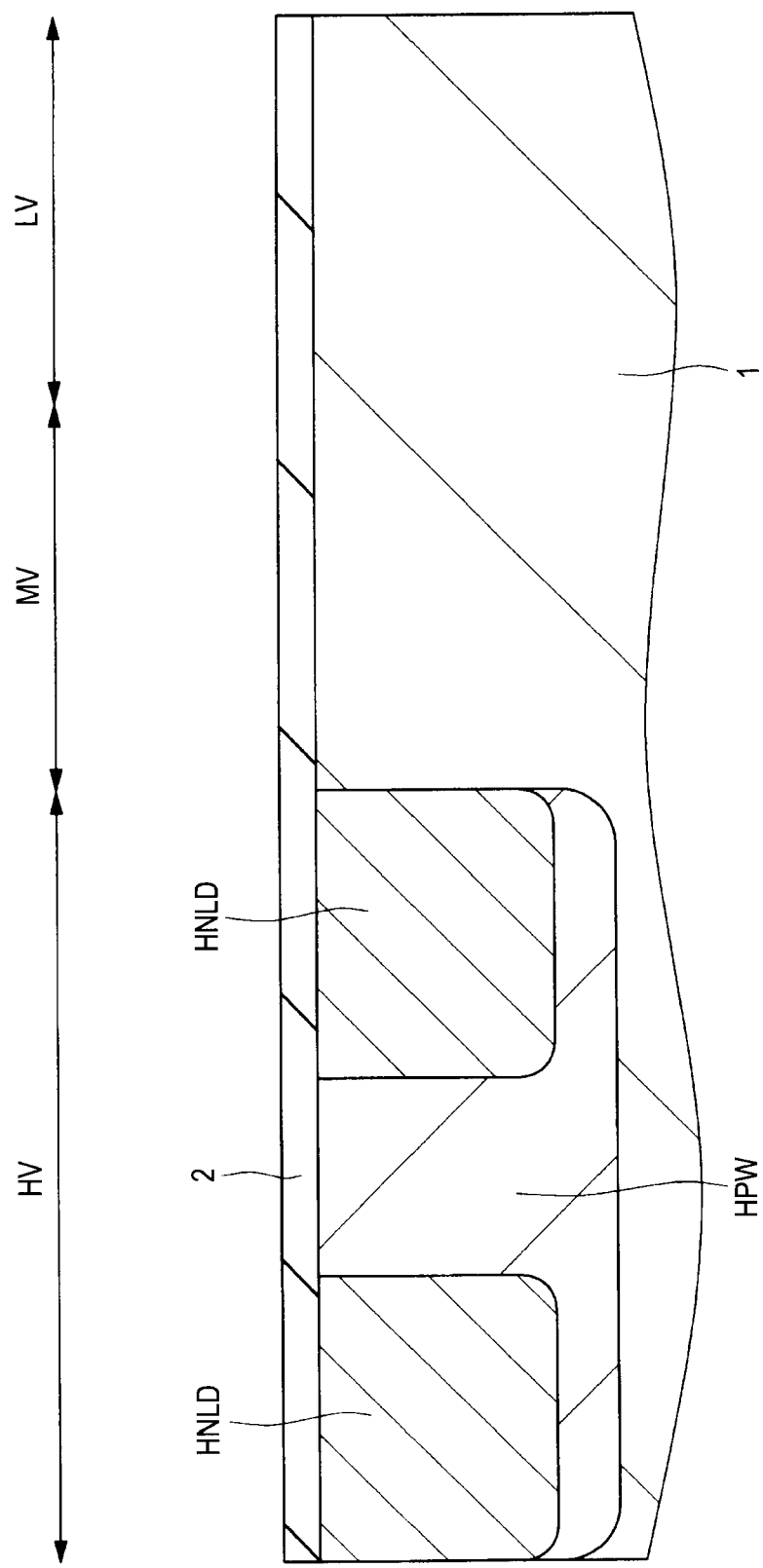
FIG. 2 is a principal-portion cross-sectional view of the semiconductor device during the manufacturing process thereof, which is subsequent to FIG. 1.

Next, as shown in FIG. 2, high-breakdown-voltage n-type source/drain regions (first semiconductor region) HNLD are formed so as to be two-dimensionally included in the high-breakdown-voltage p-well region HPW in the silicon substrate 1. The high-breakdown-voltage n-type source/drain regions HNLD are n-type semiconductor regions, and formed at two places in spaced-apart relation in the high-breakdown-voltage p-well region HPW. The high-breakdown-voltage n-type source/drain regions HNLD serve as the source/drain regions of the high-breakdown-voltage MIS transistor.

An n-type semiconductor region such as the high-breakdown-voltage n-type source/drain regions HLND is formed by introducing a group-V or group-VI element (such as, e.g., phosphorous (P) or arsenic (As)) into the silicon substrate 1 by ion implantation, and performing activation by heat treatment. Here, impurity ions are implanted with such energy as to allow the transmission thereof through the pad oxide film 2. At the time of ion implantation, the surface of a region to which ion implantation is not desired to be performed is covered with an ion implantation mask (not shown) so that ion implantation is not performed thereto. The ion implantation mask is formed by patterning a photoresist film by a photolithographic method or the like. The heat treatment may also be performed in the same step as that of heat treatment required in another step. Hereinafter, it is assumed that the step of forming the n-type semiconductor region is the same unless particularly mentioned.

Figure 3:
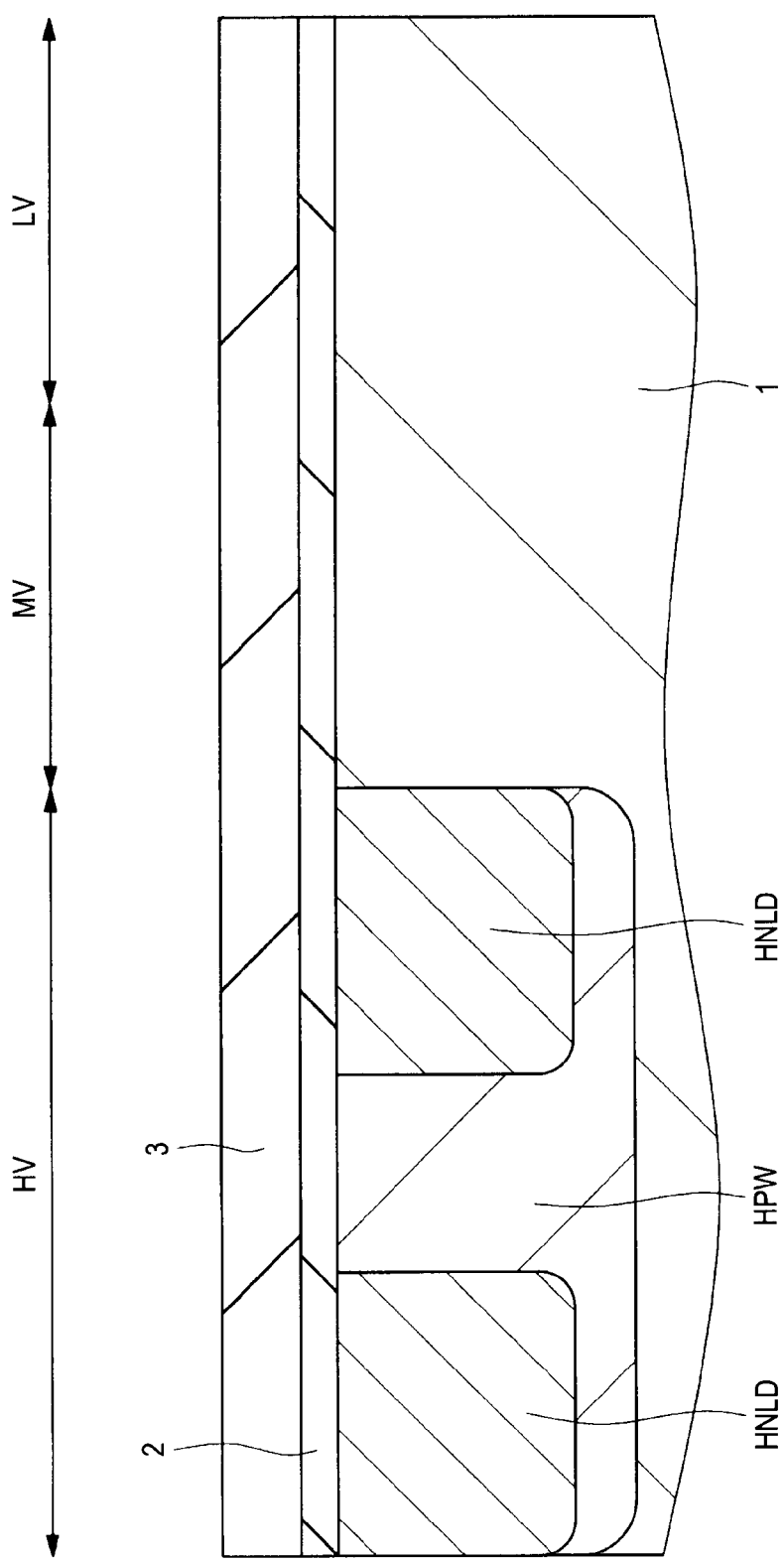
FIG. 3 is a principal-portion cross-sectional view of the semiconductor device during the manufacturing process thereof, which is subsequent to FIG. 2.

Next, as shown in FIG. 3, a protective nitride film 3 is formed so as to cover the pad oxide film 2. As the protective nitride film 3, an insulating film containing silicon nitride as a main component, and having a thickness of about 50 nm is formed by a chemical vapor deposition (CVD) method or the like.

Figure 4:
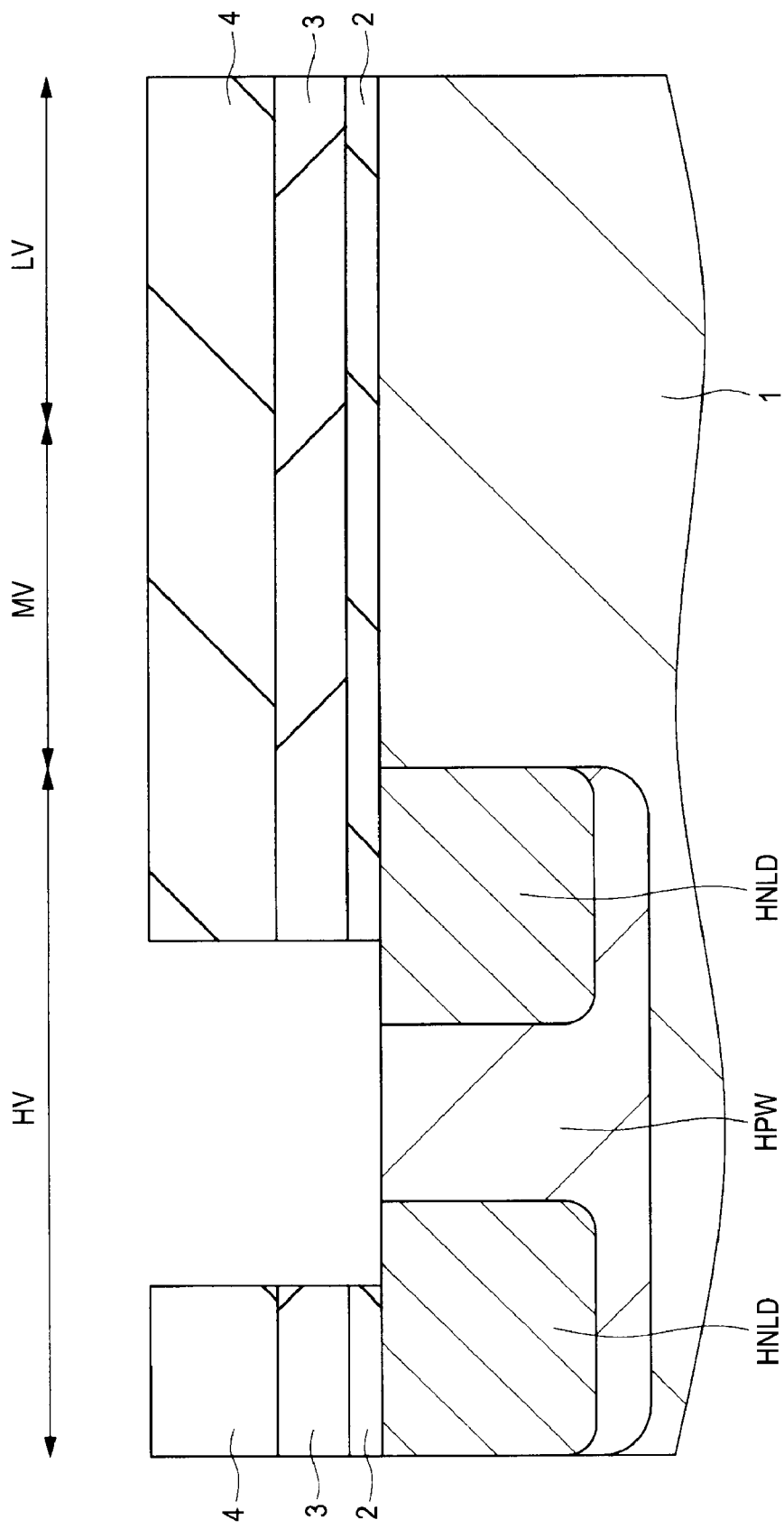
FIG. 4 is a principal-portion cross-sectional view of the semiconductor device during the manufacturing process thereof, which is subsequent to FIG. 3.

Next, as shown in FIG. 4, a photoresist film 4 is formed so as to cover the protective nitride film 3. Thereafter, by a photolithographic method or the like, processing is performed so as to open a portion of the photoresist film 4 located in the high-breakdown-voltage region HV. Subsequently, the portions of the protective nitride film 3 and the pad oxide film 2 exposed from the photoresist film 4 are successively removed by an etching method using the photoresist film 4 as an etching mask. As will be described hereinbelow in detail, over the surface of the portion of the silicon substrate 1 exposed in this step, the gate insulating film of the high-breakdown-voltage MIS transistor is formed. Therefore, in the present step, the photoresist film 4 is patterned such that an opening is formed at a two-dimensional position where the gate insulating film of the high-breakdown-voltage MIS transistor is to be formed. After the present step, the photoresist film 4 is removed.

Figure 5:
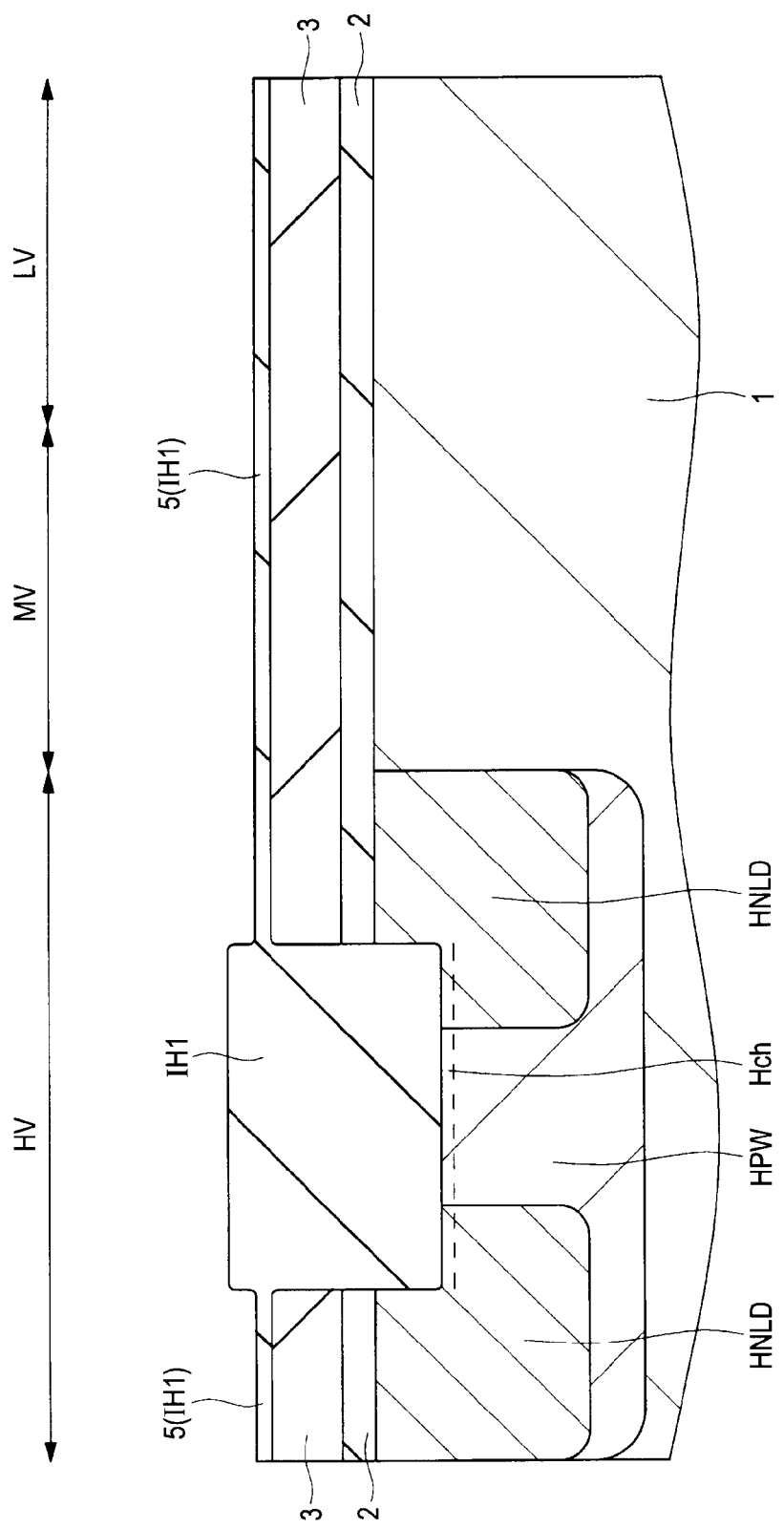
FIG. 5 is a principal-portion cross-sectional view of the semiconductor device during the manufacturing process thereof, which is subsequent to FIG. 4.

Next, as shown in FIG. 5, over the silicon substrate 1 and in a region forming a part of the high-breakdown-voltage region HV, and uncovered with the pad oxide film 2 and the protective nitride film 3, a high-breakdown-voltage insulating film (first insulating film) IH1 made of an insulating film containing silicon dioxide as a main component is formed. The high-breakdown-voltage insulating film IH1 is formed to have a thickness of, e.g., about 180 nm. Here, by performing thermal oxidation of the silicon substrate 1 in a state after the previous step is ended, the exposed portion of the silicon substrate 1 is oxidized to form the high-breakdown-voltage insulating film IH1 made of a silicon dioxide film. The surface of the other region of the silicon substrate 1, which is covered with the protective nitride film 3, is unlikely to be oxidized. However, as also shown in FIG. 5, the surface of the protective nitride film 3 is also slightly oxidized to form a similar silicon dioxide film 5, though the degree of oxidation thereof is lower than that of the surface of the silicon substrate 1.

As described above, the high-breakdown-voltage insulating film IH1 is formed by oxidizing the exposed portion of the silicon substrate 1 by the thermal oxidation method. In the process of such thermal oxidation, a silicon dioxide film is formed not only outside the silicon substrate 1, but also inside the silicon substrate 1 to the same degree. Accordingly, when the silicon dioxide film is formed to a thickness of, e.g., about 180 to 220 nm, the high-breakdown-voltage insulating film IH1 made of the silicon dioxide film is formed to a thickness of, e.g., about 80 to 100 nm inwardly from the surface of the original silicon substrate 1, and to a thickness of, e.g., about 100 to 120 nm outwardly from the surface of the original silicon substrate 1.

The high-breakdown-voltage insulating film IH1 formed in the present step is an insulating film processed by a process step described later to serve as the gate insulating film of the high-breakdown-voltage MIS transistor.

Thereafter, the impurity concentration of a region of the silicon substrate 1 located under the high-breakdown-voltage insulating film IH1 is adjusted. As described above, since the high-breakdown-voltage insulating film IH1 is a member serving as the gate insulating film of the high-breakdown-voltage MIS transistor, the region of the silicon substrate 1 located thereunder is a portion serving as a channel region. Here, the region under the high-breakdown-voltage insulating film IH1 is mentioned as a high-breakdown-voltage channel region Hch. By adjusting the impurity concentration of the high-breakdown-voltage channel region Hch by the present step, it is possible to adjust a characteristic (such as, e.g., threshold voltage) of the high-breakdown-voltage MIS transistor. For the adjustment, ion implantation is performed with respect to the silicon substrate 1 in such a manner as to allow the transmission of ions through the high-breakdown-voltage insulating film IH1. At this time, the other region is covered with a photoresist film (not shown) as an ion implantation mask to be protected.

Figure 6:
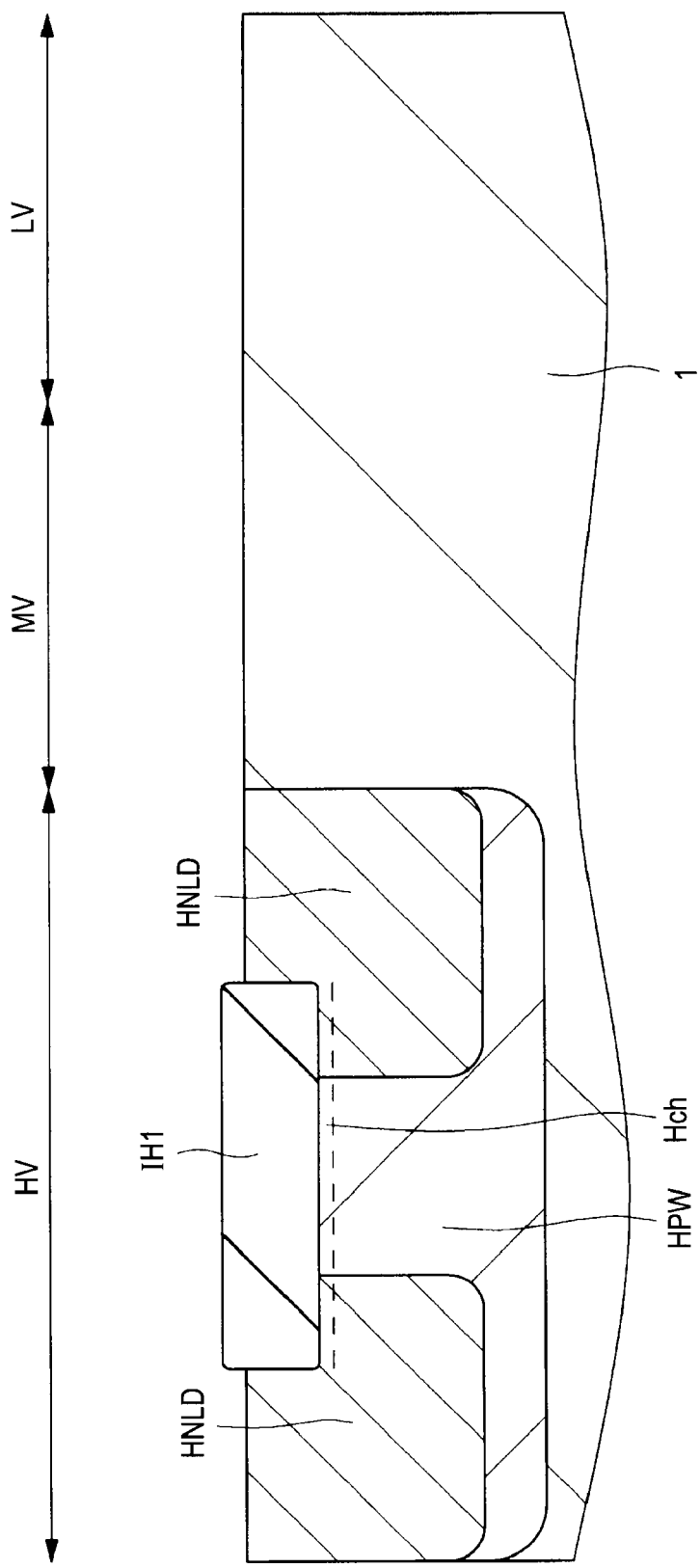
FIG. 6 is a principal-portion cross-sectional view of the semiconductor device during the manufacturing process thereof, which is subsequent to FIG. 5.

Next, the thin silicon dioxide film 5 formed over the protective nitride film 3, the protective nitride film 3, and the pad oxide film 2 are removed successively by etching. In this step, an etching mask is not particularly formed in the high-breakdown-voltage region HV. Therefore, it follows that, when the silicon dioxide film 5 over the protective nitride film 3 and the pad oxide film 2 are etched, the high-breakdown-voltage insulating film IH1 made of the same silicon dioxide is also subjected to the etching. As a result, the high-breakdown-voltage insulating film IH1 in the high-breakdown-voltage region HV is thinned by the present step. A structure after the present step is ended is shown in FIG. 6.

Figure 7:
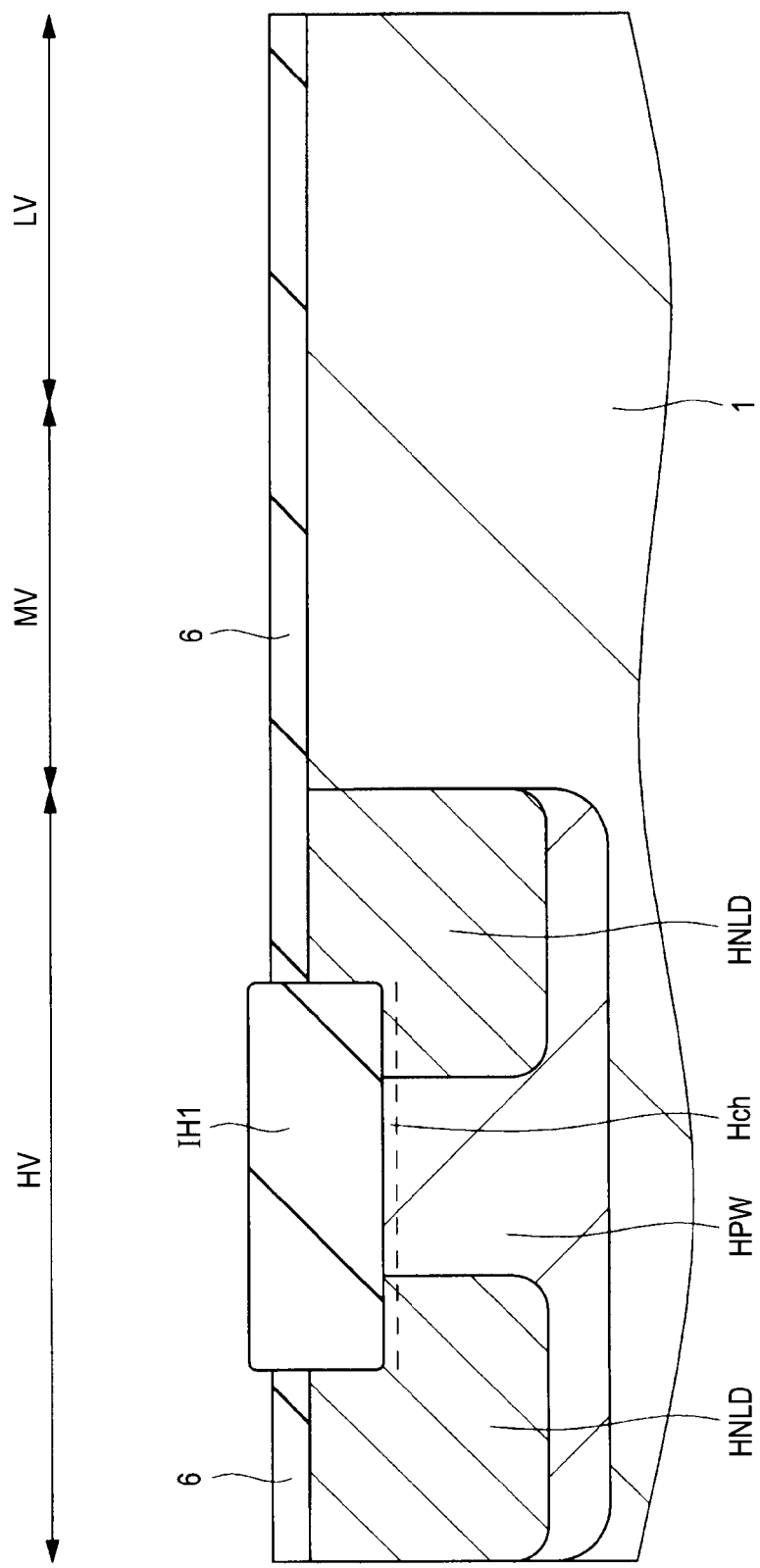
FIG. 7 is a principal-portion cross-sectional view of the semiconductor device during the manufacturing process thereof, which is subsequent to FIG. 6.

Next, as shown in FIG. 7, a pad oxide film 6 is formed again so as to cover the surface of the silicon substrate 1 by the same thermal oxidation method as described above using FIG. 1. At this time, oxidation proceeds in the same manner not only in a region where the surface of the silicon substrate 1 is exposed, but also in a region where the high-breakdown-voltage insulating film IH1 made of the silicon dioxide film is formed. Accordingly, by the present step, the high-breakdown-voltage insulating film IH1 in the high-breakdown-voltage region HV is thickened.

Figure 8:
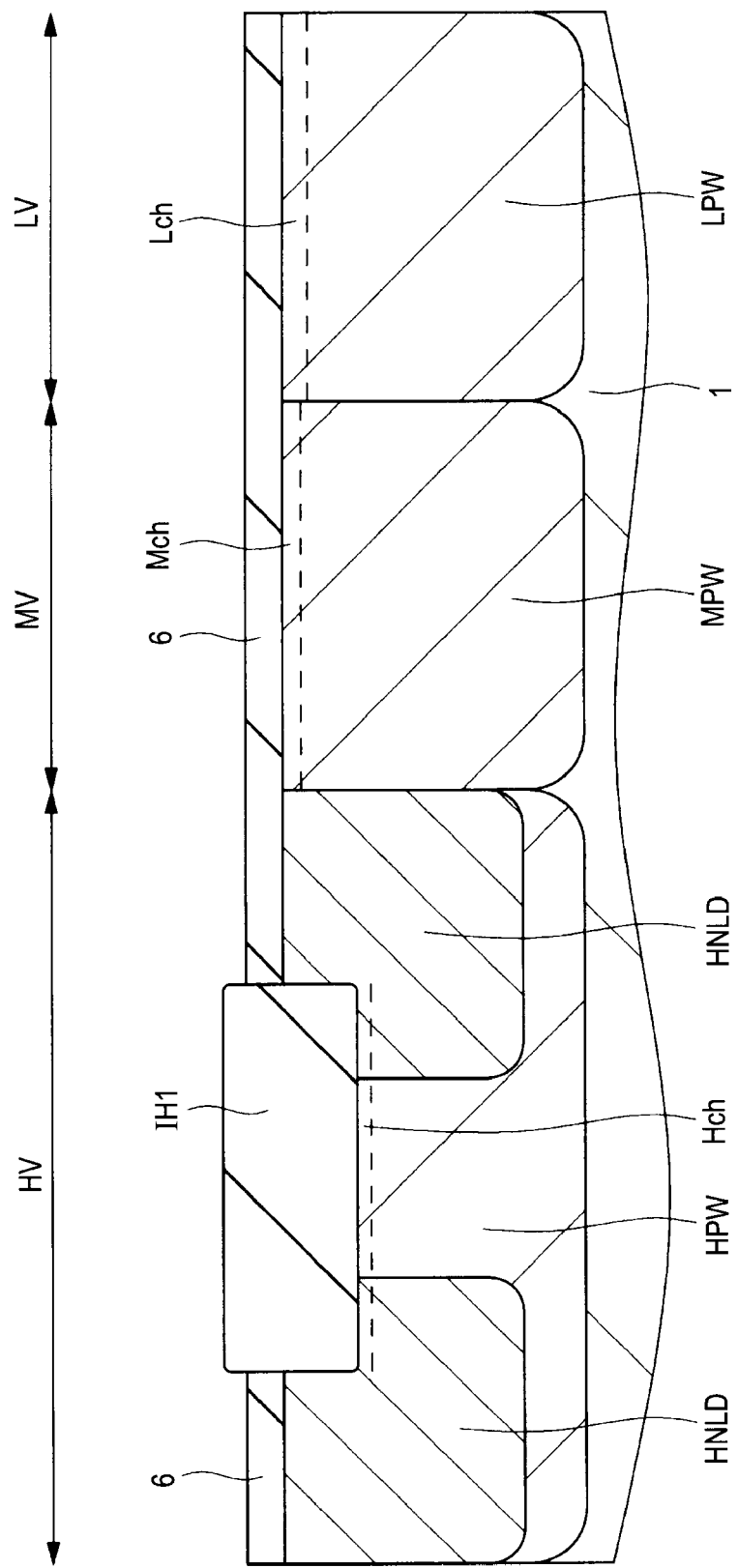
FIG. 8 is a principal-portion cross-sectional view of the semiconductor device during the manufacturing process thereof, which is subsequent to FIG. 7.

Next, as shown in FIG. 8, impurity is introduced into the main surface side of the silicon substrate 1 in the middle-breakdown-voltage region MV to form a middle-breakdown-voltage p-well region MPW which is a p-type semiconductor region. In addition, the impurity concentration of the region of the silicon substrate 1 located under the pad oxide film 6 in the middle-breakdown-voltage region MV is adjusted. This region serves as the channel region of the middle-breakdown-voltage MIS transistor formed later. Hereinafter, the region is mentioned as a middle-breakdown-voltage channel region Mch. By adjusting the impurity concentration of the middle-breakdown-voltage channel region Mch by the present step, it is possible to adjust a characteristic (such as, e.g., threshold voltage) of the middle-breakdown-voltage MIS transistor.

In the meantime, impurity is introduced into the main surface side of the silicon substrate 1 in the low-breakdown-voltage region LV to form a low-breakdown-voltage p-well region LPW which is a p-type semiconductor region. In addition, the impurity concentration of the region of the silicon substrate 1 located under the pad oxide film 6 in the low-breakdown-voltage region LV is adjusted. This region serves as the channel region of the low-breakdown-voltage MIS transistor formed later. Hereinafter, the region is mentioned as a low-breakdown-voltage channel region Lch. By adjusting the impurity concentration of the low-breakdown-voltage channel region Lch by the present step, it is possible to adjust a characteristic (such as, e.g., threshold voltage) of the low-breakdown-voltage MIS transistor.

The impurity introduction into the middle-breakdown-voltage region MV and the impurity introduction into the low-breakdown-voltage region LV are implemented by performing ion implantation which involves separate coverage of the middle-breakdown-voltage region MV and the low-breakdown-voltage region LV with different ion implantation masks such as photoresist films, and allows the transmission of ions through the pad oxide film 6. Note that, since the formation of the middle-breakdown-voltage p-well region MPW and the adjustment of the concentration of the middle-breakdown-voltage channel region Mch can be effected by performing ion implantation into the same region when viewed in two dimensions, the same ion implantation mask may also be used. Likewise, since the formation of the low-breakdown-voltage p-well region LPW and the adjustment of the concentration of the low-breakdown-voltage channel region Lch can be effected by performing ion implantation into the same region when viewed in two dimensions, the same ion implantation mask may also be used.

After the ion implantation step described above is ended, the pad oxide film 6 is removed by a wet etching method or the like. At that time, the high-breakdown-voltage insulating film IH1 which is the same silicon dioxide film as the pad oxide film 6 is also partially removed by the same thickness as that of the pad oxide film 6. In this manner, in the manufacturing method of the semiconductor device of Embodiment 1, the surface of the high-breakdown-voltage insulating film IH1 formed in the step of FIG. 5 described above is abraded by the step of removing at least the pad oxide films 2 and 6 described above using FIGS. 6 and 8 so that the thickness of the high-breakdown-voltage insulating film IH1 is reduced.

Figure 9:
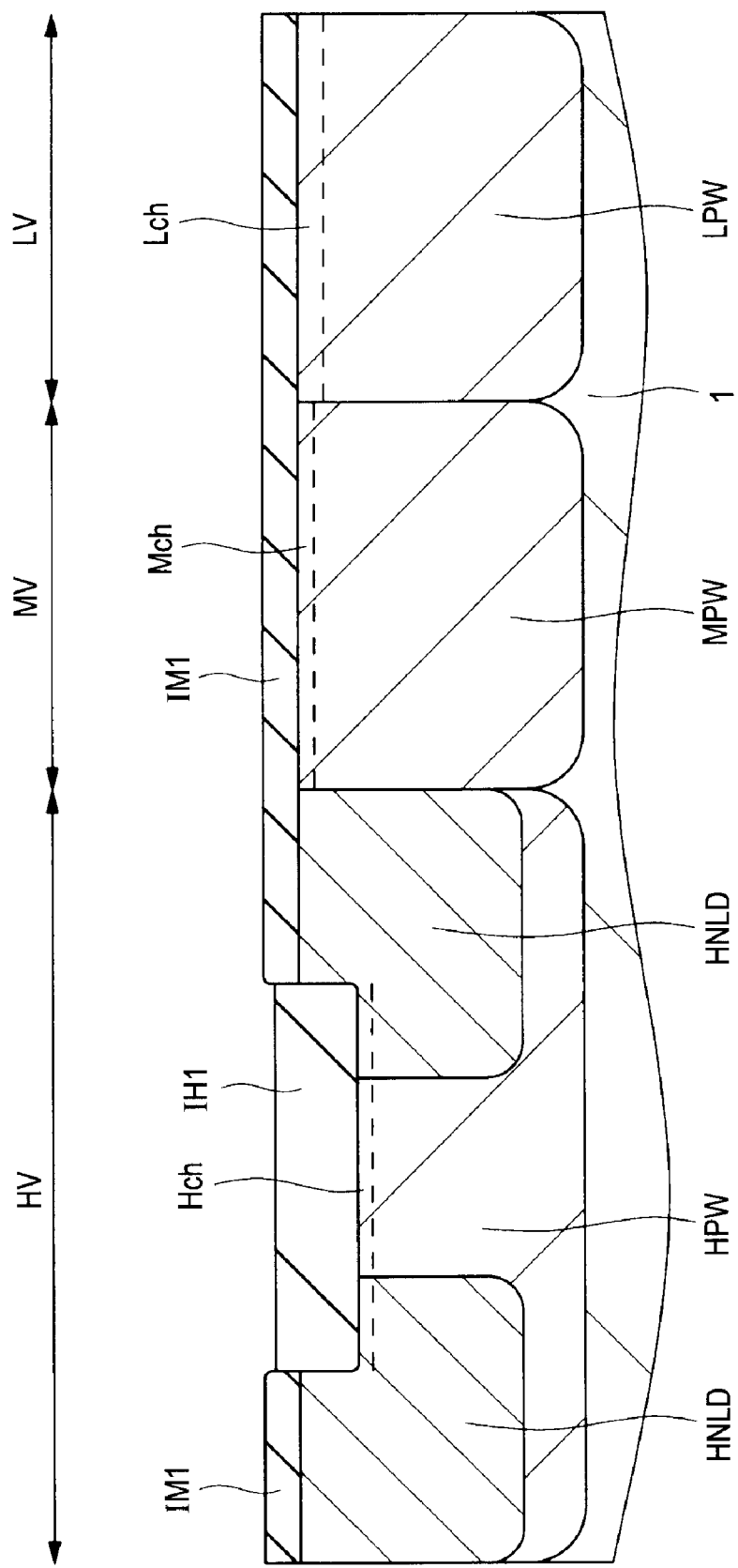
FIG. 9 is a principal-portion cross-sectional view of the semiconductor device during the manufacturing process thereof, which is subsequent to FIG. 8.

Next, as shown in FIG. 9, a middle-breakdown-voltage insulating film (second insulating film) IM1 made of an insulating film containing silicon dioxide as a main component is formed over the exposed surface of the silicon substrate 1 (in a portion other than a region where the high-breakdown-voltage insulating film IH1 is formed in FIG. 9). In other words, the middle-breakdown-voltage insulating film IM1 is formed in a region other than the region where the high-breakdown-voltage insulating film IH1 is formed so as to be adjacent to the high-breakdown-voltage insulating film IH1. Here, by, e.g., performing thermal oxidation of the silicon substrate 1, the middle-breakdown-voltage insulating film IM1 can be formed in the region. The middle-breakdown-voltage insulating film IM1 is formed so as to be thinner than the high-breakdown-voltage insulating film IH1. For example, the middle-breakdown-voltage insulating film IM1 is formed to have a thickness of, e.g., about 12 to 15 nm.

The middle-breakdown-voltage insulating film IM1 formed in the present step is an insulating film processed by a step described later to serve as the gate insulating film of the middle-breakdown-voltage MIS transistor.

Figure 10:
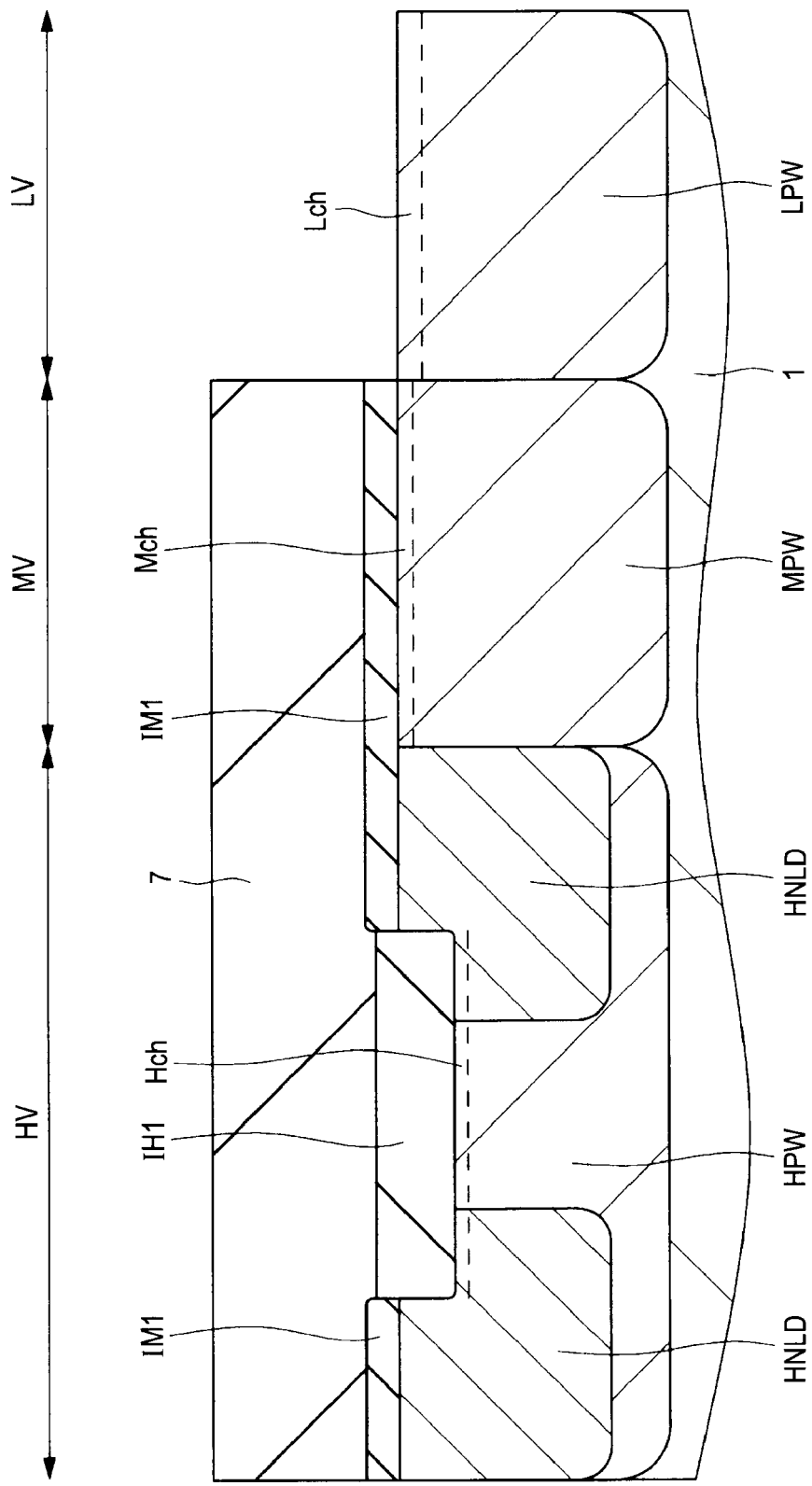
FIG. 10 is a principal-portion cross-sectional view of the semiconductor device during the manufacturing process thereof, which is subsequent to FIG. 9.

Next, as shown in FIG. 10, a photoresist film 7 is formed so as to cover the silicon substrate 1, and patterned by a photolithographic method or the like so as to open the low-breakdown-voltage region LV. Thereafter, using the photoresist film 7 as an etching mask, etching is performed with respect to the portion of the middle-breakdown-voltage insulating film IM1 exposed from the photoresist film 7. In this manner, the middle-breakdown-voltage insulating film IM1 formed in the low-breakdown-voltage region LV is removed. After the etching step is ended, the photoresist film 7 is removed.

Figure 11:
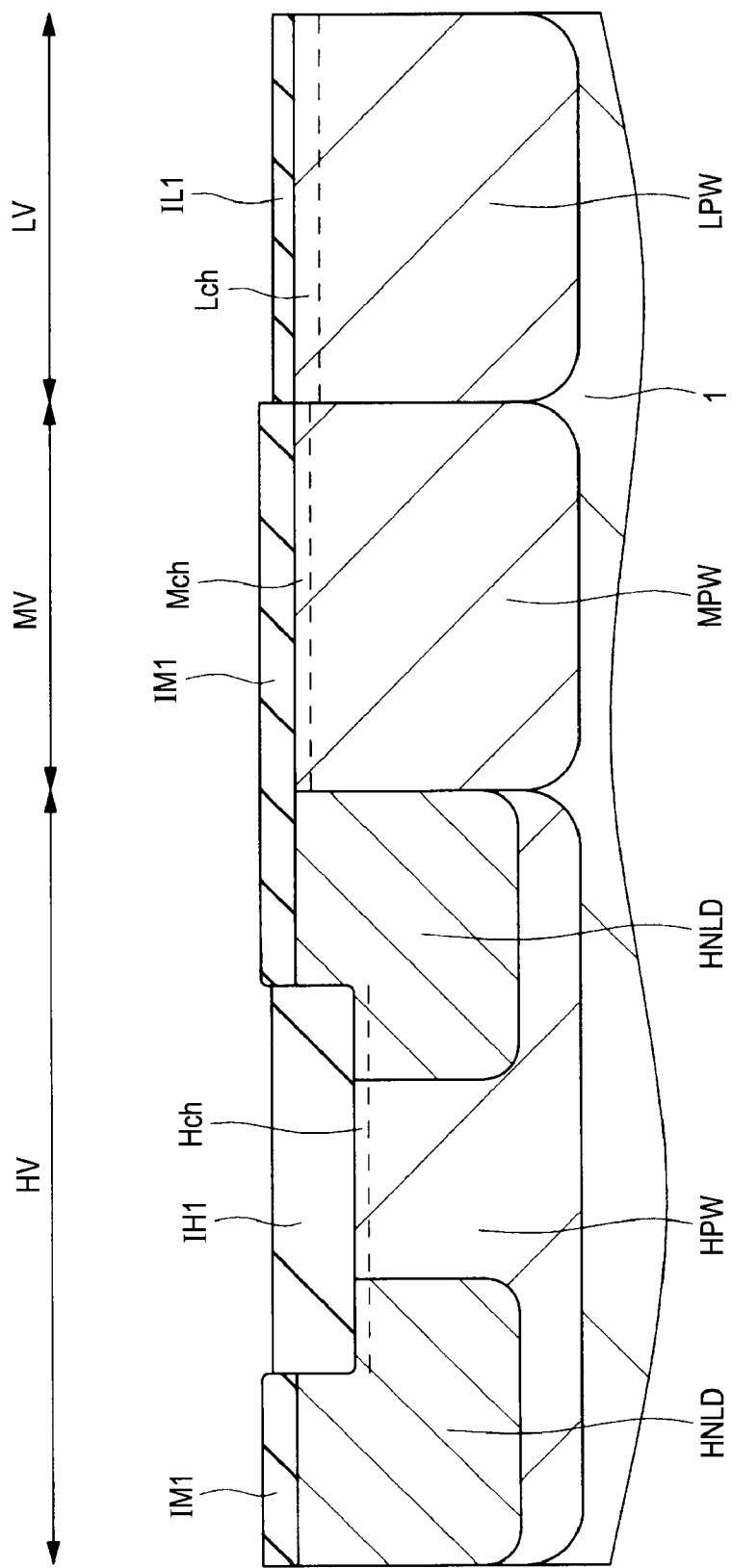
FIG. 11 is a principal-portion cross-sectional view of the semiconductor device during the manufacturing process thereof, which is subsequent to FIG. 10.

Next, as shown in FIG. 11, a low-breakdown-voltage insulating film (second insulating film) IL1 made of an insulating film containing silicon dioxide as a main component is formed over the exposed surface of the silicon substrate 1 (in a portion other than a region where the high-breakdown-voltage insulating film IH1 and the middle-breakdown-voltage insulating film IM1 are formed in FIG. 11). Here, as described above, in the drawings shown in Embodiment 1, the middle-breakdown-voltage region MV is arranged adjacent to the high-breakdown-voltage region HV. However, it is also possible that the low-breakdown-voltage region LV may be arranged adjacent to the high-breakdown-voltage region HV. In this case, it follows that, in the present step, the low-breakdown-voltage insulating film IL1 is formed in a region other than the region where the high-breakdown-voltage insulating film IH1 is formed so as to be adjacent to the high-breakdown-voltage insulating film IH1. Here, by, e.g., performing thermal oxidation of the silicon substrate 1, the low-breakdown-voltage insulating film IL1 can be formed in the region. The low-breakdown-voltage insulating film IL1 is formed so as to be thinner than the high-breakdown-voltage insulating film IH1 and the middle-breakdown-voltage insulating film IM1. For example, the low-breakdown-voltage insulating film IL1 is formed to have a thickness of, e.g., about 2.0 to 3.0 nm. Thus, the middle-breakdown-voltage insulating film IM1 and the low-breakdown-voltage insulating film IL1 are formed in the same method in terms of process steps except that the middle-breakdown-voltage insulating film IM1 and the low-breakdown-voltage insulating film IL1 are formed to different thicknesses.

The low-breakdown-voltage insulating film IL1 is an insulating film processed by a step described later to serve as the gate insulating film of the low-breakdown-voltage MIS transistor.

By the foregoing steps, the high-breakdown-voltage insulating film IH1, the middle-breakdown-voltage insulating film IM1, and the low-breakdown-voltage insulating film IL1 are resultantly formed to have respective desired thicknesses. The high-breakdown-voltage insulating film IH1, the middle-breakdown-voltage insulating film IM1, and the low-breakdown-voltage insulating film IL1 are insulating films which have thickness differences of about 2 to 100 nm therebetween. However, according to the manufacturing method of Embodiment 1, the level differences therebetween can be reduced. This is because, in the manufacturing method of Embodiment 1, the high-breakdown-voltage insulating film IH1 which finally has a thickness of about 80 to 100 nm is formed thicker than the values, and the middle-breakdown-voltage insulating film IM1 and the low-breakdown-voltage insulating film IL1 are formed by abrading the surface of the high-breakdown-voltage insulating film IH1. That is, in the manufacturing method of Embodiment 1, the high-breakdown-voltage insulating film IH1 is formed by the thermal oxidation method at a position deeper than the surface of the silicon substrate 1 so as to have a thickness larger than a desired thickness. Then, in the subsequent steps, the surface side is abraded to finally provide the individual-breakdown-voltage insulating films IH1, IM1, and IL1 with respective desired values. As a result, it is possible to prevent the high-breakdown-voltage insulating film IH1 having a large thickness from protruding from the other regions. In particular, the present inventors have verified that, according to the manufacturing method of Embodiment 1, the elevation differences between the individual-breakdown-voltage insulating films IH1, IM1, and IL1 can be adjusted to a value of about 10 to 13 nm. This ensures a short margin between wiring and the gates, and reduces the remaining of the insulating film during the formation of the STI isolation structure, which may occur in the subsequent steps. As a result, it is possible to improve the manufacturing yield of the semiconductor device having the transistors in which the gate insulating films have different thicknesses. Details of these effects will be described together with the subsequent steps.

Figure 12:
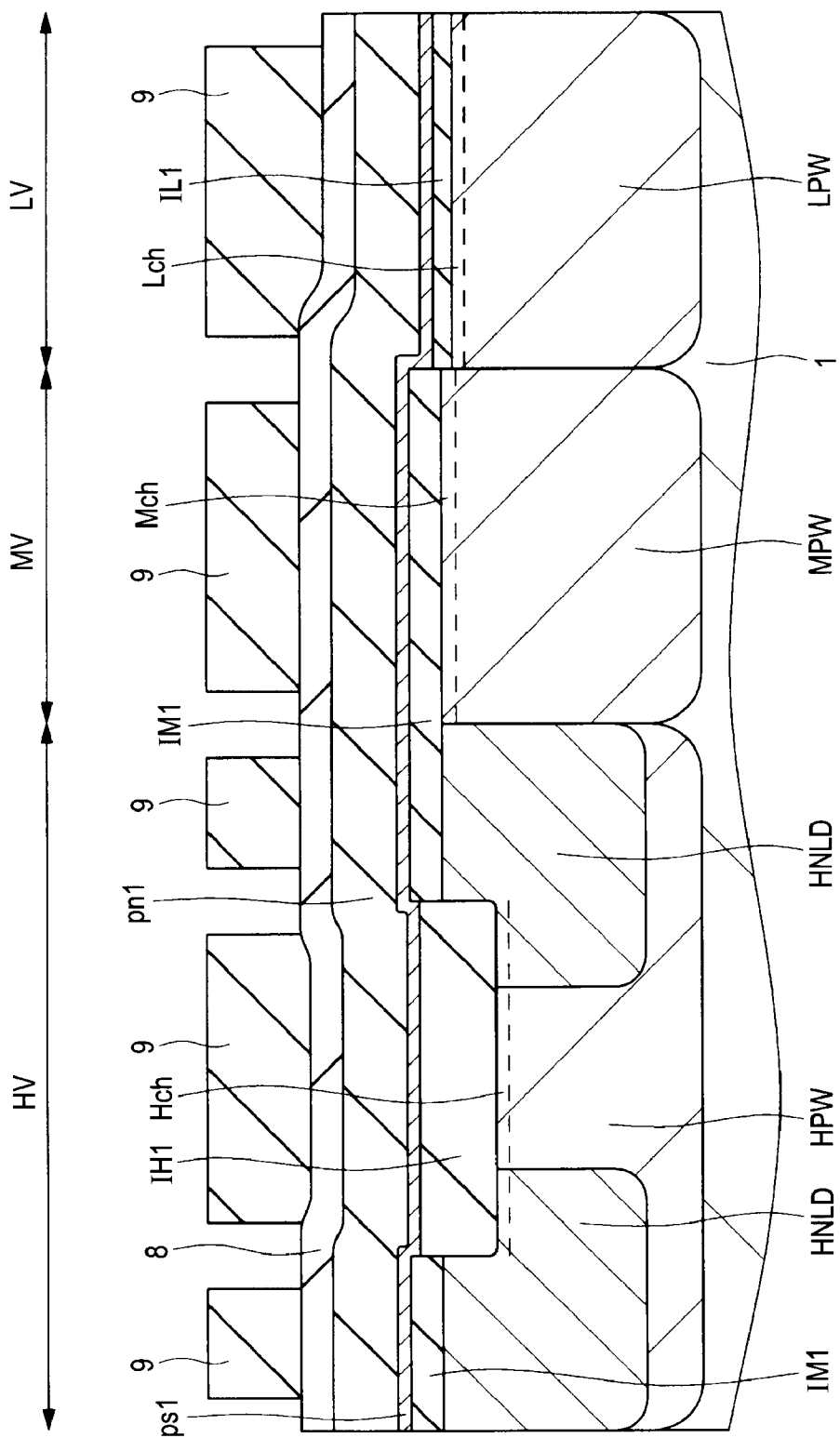
FIG. 12 is a principal-portion cross-sectional view of the semiconductor device during the manufacturing process thereof, which is subsequent to FIG. 11.

In the subsequent step, as shown in FIG. 12, a protective silicon film ps1 and a protective silicon nitride film pn1 are formed successively so as to cover the silicon substrate 1. As the protective silicon film ps1, a conductor film made of polysilicon is formed to a thickness of about 15 to 30 nm by, e.g., a CVD method. As the protective silicon nitride film pn1, an insulating film made of silicon nitride is formed to a thickness of about 90 nm by, e.g., a CVD method. The reason for forming the individual films will be described together with the subsequent steps.

Thereafter, a back-surface anti-reflection film 8 and a photoresist film 9 are coated successively so as to cover the silicon substrate 1. The back-surface anti-reflection film 8 is a so-called bottom anti-reflection coating (BARC), which is a film for anti-reflection arranged under a photoresist film formed over a rough surface in order to prevent exposure of an unintended region to light due to the reflection of exposing light by an underlying stepped portion when the photoresist film is patterned by a photolithographic method or the like. Here, the back-surface anti-reflection film 8 made of a BARC is formed under the photoresist film 9.

Subsequently, the photoresist film 9 is patterned as follows. That is, the photoresist film 9 is patterned to have openings in the respective boundary portions between the high-breakdown-voltage insulating film IH1, the middle-breakdown-voltage insulating film IM1, and the low-breakdown-voltage insulating film IL1 when viewed in two dimensions.

Figure 13:
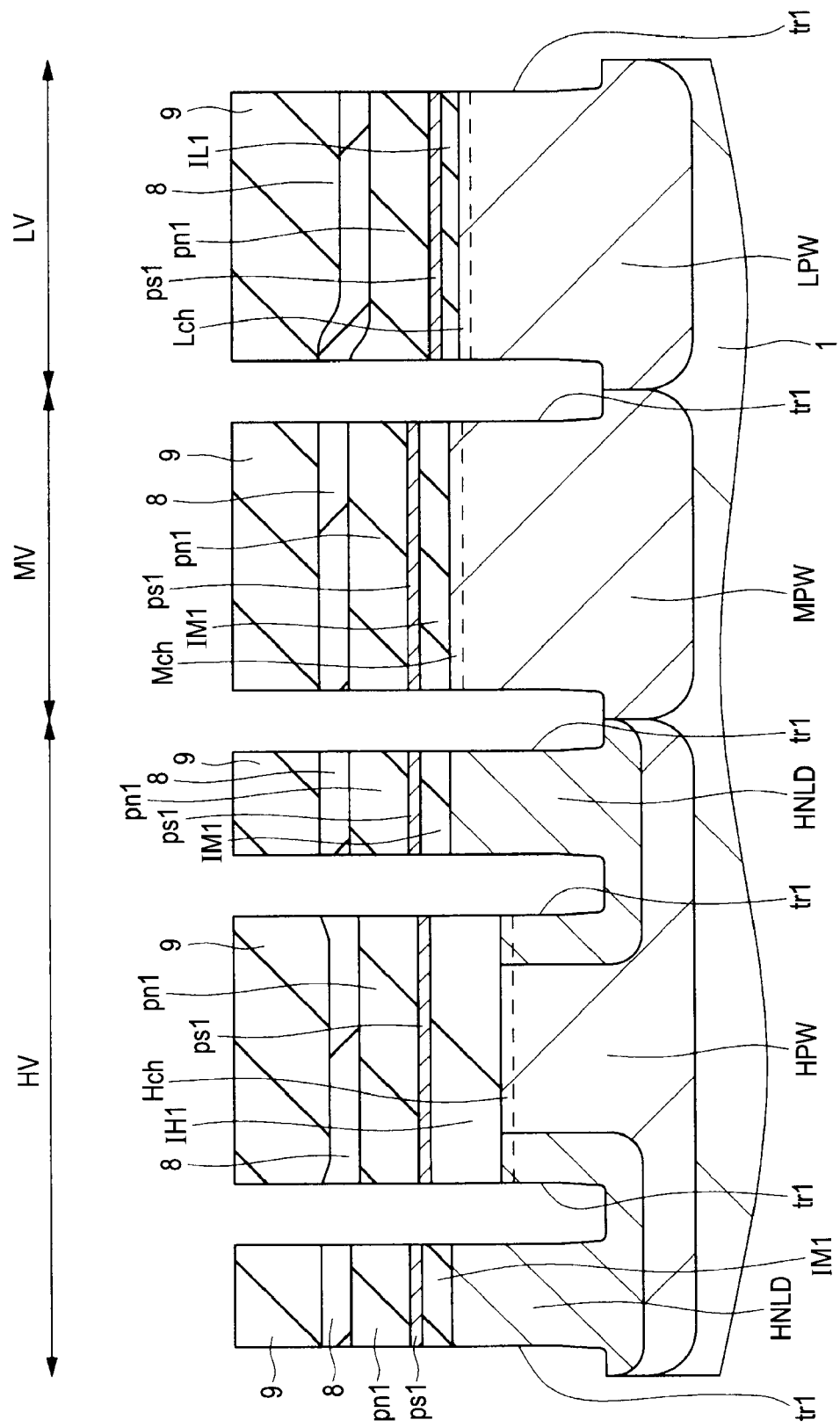
FIG. 13 is a principal-portion cross-sectional view of the semiconductor device during the manufacturing process thereof, which is subsequent to FIG. 12.

Next, as shown in FIG. 13, anisotropic etching is performed with respect to the exposed portions using the photoresist film 9 as an etching mask. Here, in particular, such anisotropic etching as to have directionality in the direction of the depth of the silicon substrate 1 is performed. In this manner, trenches (trench portion for isolation) tr1 extending in the direction of the depth of the silicon substrate 1 are formed so as to extend through the back-surface anti-reflection film 8, the protective silicon nitride film pn1, the protective silicon film ps1, and the individual-breakdown-voltage insulating films IH1, IM1, and IL1. In other words, it follows that, by the present step, the trenches extending in the direction of the depth of the silicon substrate 1 are formed in the respective two-dimensional boundary portions between the high-breakdown-voltage insulating film HV, the middle-breakdown-voltage insulating film MV, and the low-breakdown-voltage insulating film LV. After the anisotropic etching step is ended, the photoresist film 9 and the back-surface anti-reflection film 8 are removed.

Figure 14:
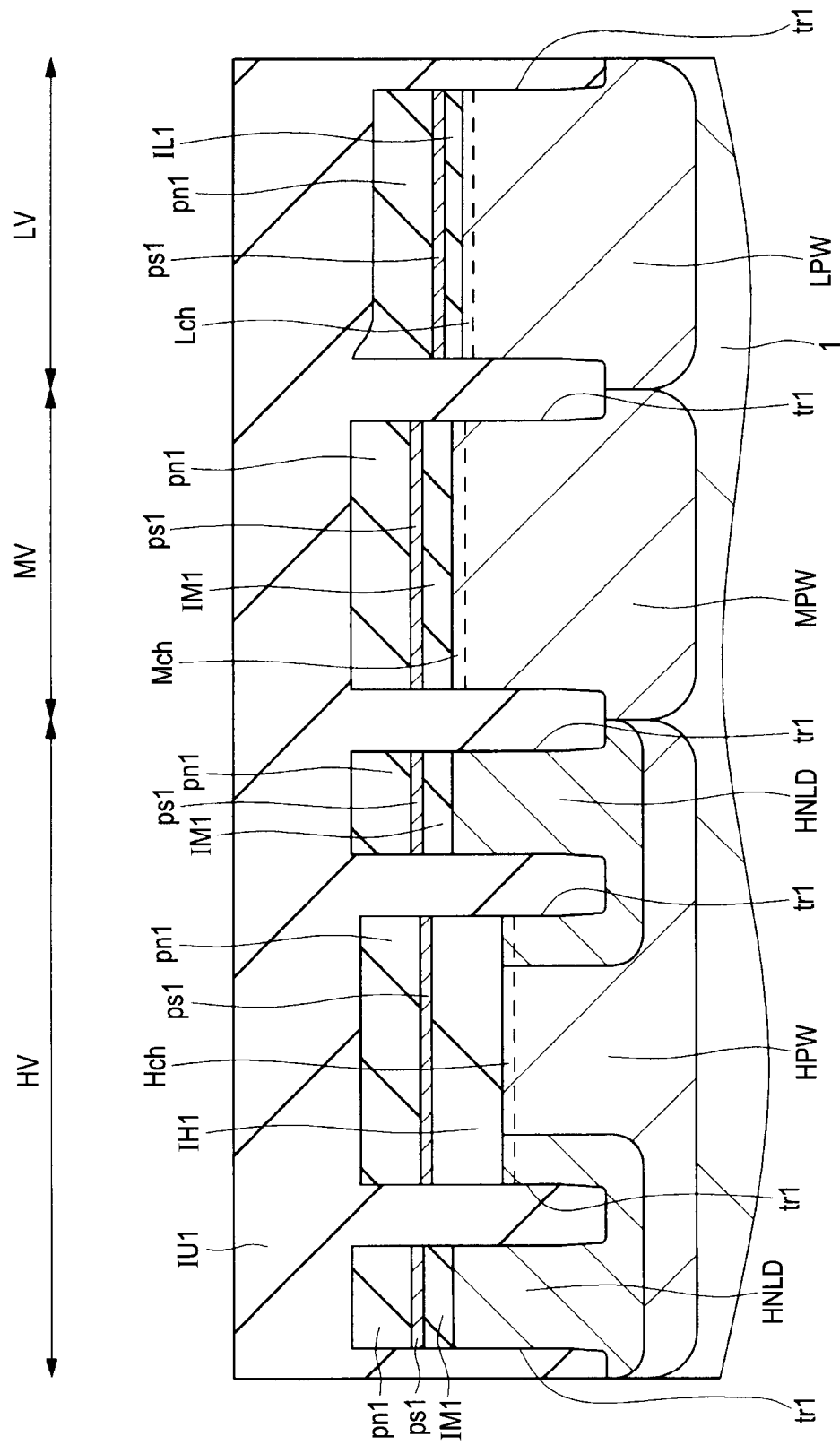
FIG. 14 is a principal-portion cross-sectional view of the semiconductor device during the manufacturing process thereof, which is subsequent to FIG. 13.

Next, as shown in FIG. 14, an insulating film for isolation IU1 is formed over the silicon substrate 1 so as to fill the tranches tr1. As the insulating film for isolation IU1, an insulating film containing silicon dioxide as a main component is formed by, e.g., a CVD method. Here, to enhance the filling property of the insulating film for isolation IU1 in the trenches tr1, it is also possible that thermal oxidation may be performed to oxidize the inner walls of the trenches tr1, and then the insulating film for isolation IU1 may be formed by a high-density plasma CVD method.

Figure 15:
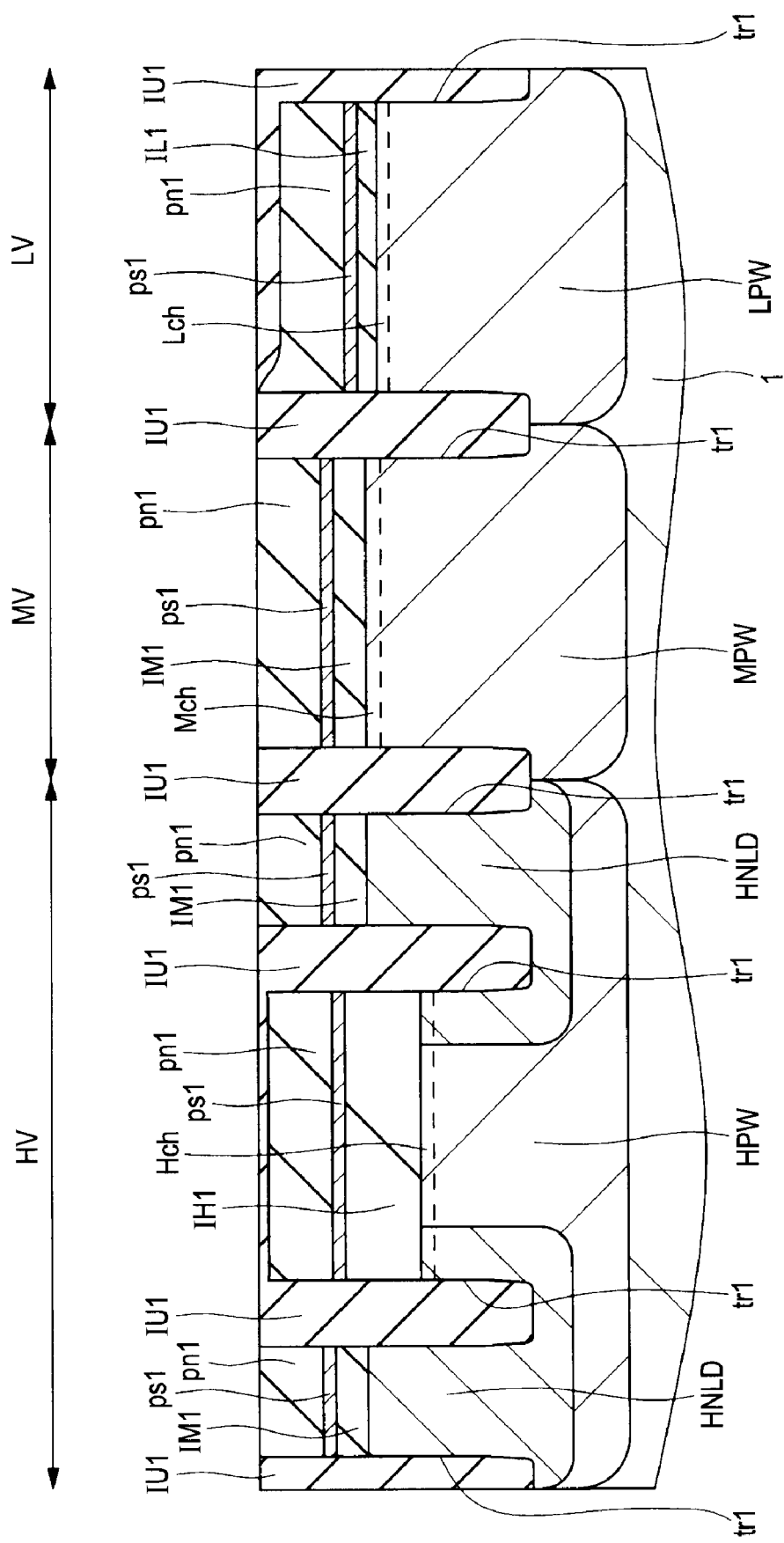
FIG. 15 is a principal-portion cross-sectional view of the semiconductor device during the manufacturing process thereof, which is subsequent to FIG. 14.

Next, as shown in FIG. 15, CMP is performed with respect to the insulating film for isolation IU1 to polish the surface thereof. At this time, by using the protective silicon nitride film pn1 as a CMP stop film (also referred to as a CMP stopper or the like), the polishing of the insulating film for isolation IU1 by CMP is stopped at the time when the protective silicon nitride film pn1 is exposed.

Here, in the manufacturing method of Embodiment 1, when the individual-breakdown-voltage insulating films IH1, IM1, and IL1 are compared, the elevation of the middle-breakdown-voltage insulating film IM1 is the highest so that the protective silicon nitride film pn1 over the middle-breakdown-voltage insulating film IM1 is exposed first in the CMP step described above. At this time, the protective silicon nitride film pn1 over the high-breakdown-voltage insulating film IH1 and the low-breakdown-voltage insulating film IL1 is not exposed, and is covered with the insulating film for isolation IU1.

Here, for example, as described above as the problem, the elevation differences between the underlying individual-breakdown-voltage insulating films (individual gate insulating films) according to the manufacturing methods examined by the present inventors are as large as nearly 100 nm. Accordingly, the amount of the insulating film for isolation IU1 remaining over the protective silicon nitride film is also large, and it is difficult to completely remove the insulating film for isolation IU1.

By contrast, in the manufacturing method of Embodiment 1, the elevation differences between the individual-breakdown-voltage insulating film IH1, IM1, and IL1 can be reduced to about 10 to 13 nm. Therefore, by, e.g., performing wet etching with respect to the insulating film for isolation IU1 in the subsequent step, the remaining insulating film for isolation IU1 can be easily removed. Thus, according to the manufacturing method of Embodiment 1, it is possible to reduce the elevation differences between the individual-breakdown-voltage insulating films IH1, IM1, and IL1 of different thicknesses, and reduce unintended remaining of the oxide film despite the introduction of the SA-STI step. As a result, it is possible to further improve the manufacturing yield of the semiconductor device having the transistors in which the gate insulating films have different thicknesses.

Figure 16:
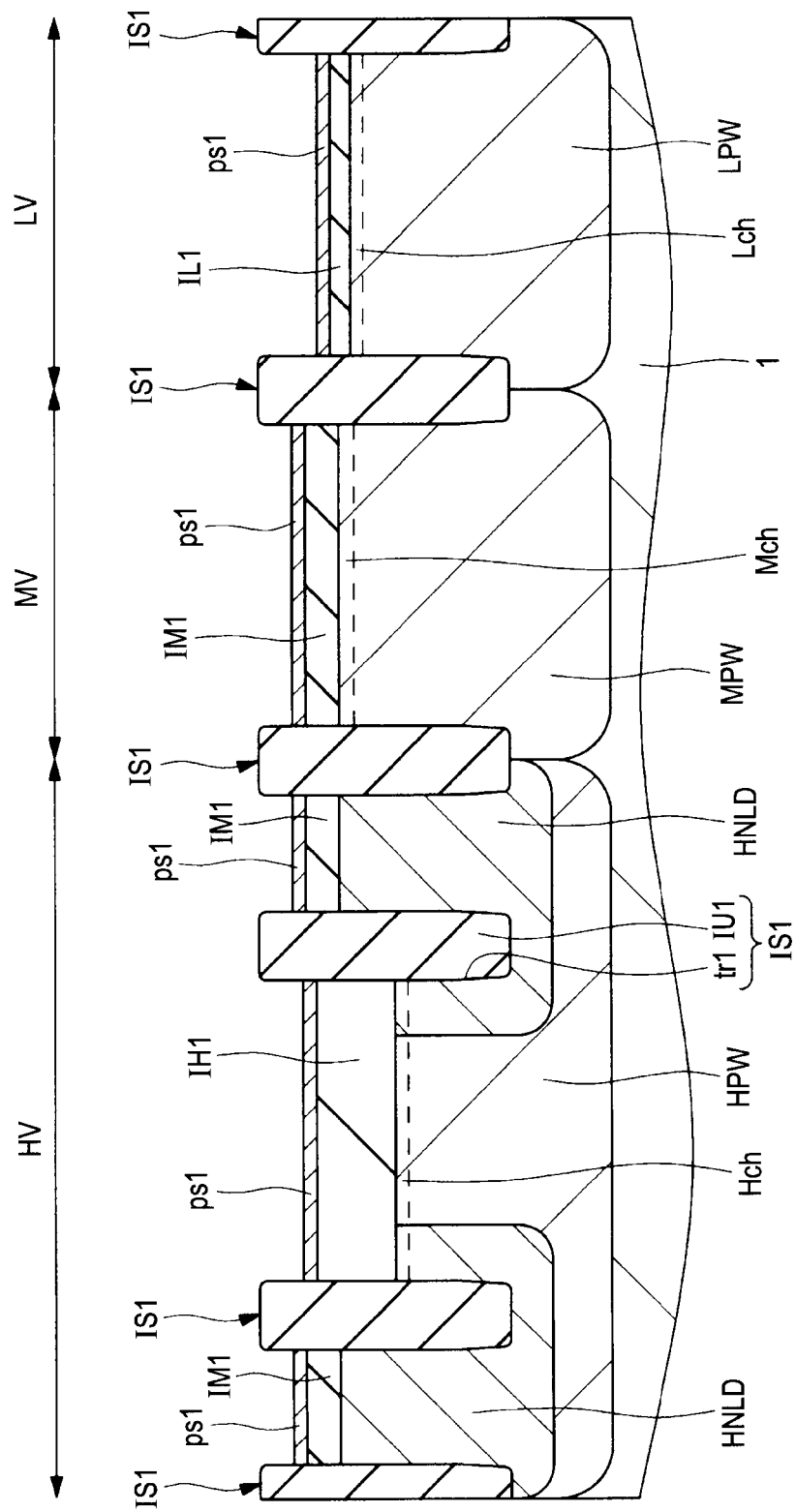
FIG. 16 is a principal-portion cross-sectional view of the semiconductor device during the manufacturing process thereof, which is subsequent to FIG. 15.

Next, by removing the protective silicon nitride film pn1 by wet etching, a structure as shown in FIG. 16 is formed. At this time, in the manufacturing method of Embodiment 1, the protective silicon film ps1 has been formed between each of the individual-breakdown-voltage insulating films IH1, IM1, and IL1 and the protective silicon nitride film pn1. In the present step, by using the protective silicon film ps1 as an etching stop layer (also referred to as an etching stopper or the like), the protective silicon nitride film pn1 is removed in such a manner that the etching does not affect the underlying individual-breakdown-voltage insulating films IH1, IM1, and IL1. By the foregoing steps, an isolation portion IS1 of an STI structure configured such that the trenches tr1 are filled with the insulating film for isolation IU1 is formed.

Here, in terms of forming the isolation portion IS1 of the STI structure, the isolation portion IS1 may also be formed before the individual-breakdown-voltage insulating films IH1, IM1, and IL1 described above are formed. However, as described above, in terms of inhibiting the occurrence of a stress due to heat treatment at a high temperature in thermal oxidation, it is more preferable in the manufacturing method of Embodiment 1 to form the isolation portion of the STI structure after the individual-breakdown-voltage insulating films IH1, IM1, and IL1 are formed. That is, when the individual-breakdown-voltage insulating films IH1, IM1, and IL1 are formed after the formation of the isolation portion IS1 of the STI structure, a stress occurs due to the differences between the respective thermal expansion coefficients of the insulating film for isolation IU1 buried in the trenches tr1 and the silicon substrate 1. Such a stress causes variations in the characteristics of elements formed in the active regions. Therefore, in accordance with the method of Embodiment 1 which forms the individual-breakdown-voltage insulating films IH1, IM1, and IL1, and then forms the isolation portion IS1 of the STI structure, it is possible to reduce the likeliness of variations in the characteristics of the elements formed in the active regions. As a result, it is possible to further improve the manufacturing yield of the semiconductor device having the transistors in which the gate insulating films have different thicknesses.

In terms of normally removing the protective silicon nitride film pn1, when the protective silicon nitride film pn1 is directly formed over the individual-breakdown-voltage insulating films IH1, IM1, and IL1, and removed, the individual-breakdown-voltage insulating films IH1, IM1, and IL1 may also be used as etching stop layers. However, in the manufacturing method of the semiconductor device of Embodiment 1, it is more preferable to form the protective silicon film ps1. This is because, by forming the protective silicon film ps1, it is possible to reduce the likeliness that the etching of the protective silicon nitride film pn1 will affect the individual-breakdown-voltage insulating films IH1, IM1, and IL1. As described above, the individual-breakdown-voltage insulating films IH1, IM1, and IL1 are members which will serve as the gate insulating films of the MIS transistors later. Without the protective silicon film ps1, the gate insulating films are affected by the etching, and reduced in thickness (thinned) to undesirably increase the likeliness of characteristic variations due to the concentration of an electric field. The manufacturing method of Embodiment 1 can prevent this. As a result, it is possible to further improve the manufacturing yield of the semiconductor device having the transistors in which the gate insulating films have different thicknesses.

Figure 17:
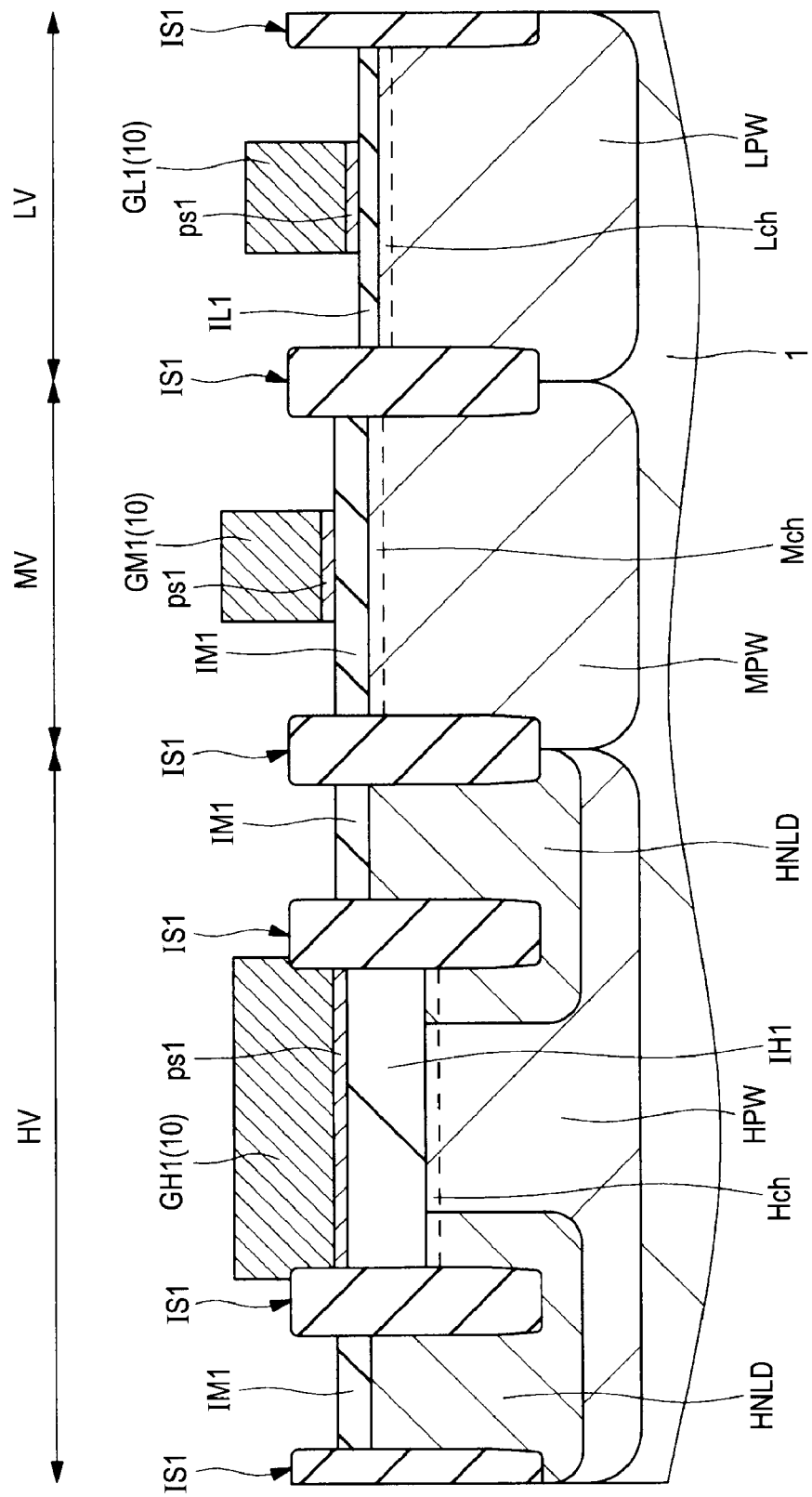
FIG. 17 is a principal-portion cross-sectional view of the semiconductor device during the manufacturing process thereof, which is subsequent to FIG. 16.

Next, as shown in FIG. 17, a polysilicon film 10 is formed so as to cover the silicon substrate 1. The polysilicon film 10 is a conductor film containing polysilicon as a main component. For example, the polysilicon film 10 is formed to a thickness of about 140 to 170 nm by a CVD method or the like. Thereafter, for the polysilicon film in a desired region to have a desired conductivity, ion implantation is performed using a photoresist film (not shown) as a mask.

Subsequently, patterning of the polysilicon film 10 is performed. The polysilicon film 10 is left so as to cover the high-breakdown-voltage insulating film IH1 in the high-breakdown-voltage region HV, and overlap the upper surface of the isolation portion IS1 located at each of the two-dimensional end portions of the high-breakdown-voltage insulating film IH1. In the middle-breakdown-voltage region MV, the polysilicon film 10 is left so as to partially cover the middle-breakdown-voltage insulating film IM1. In the low-breakdown-voltage region LV, the polysilicon film 10 is left so as to partially cover the low-breakdown-voltage insulating film IL1. In this manner, the gate electrodes are formed of the polysilicon film left in the individual-breakdown-voltage regions HV, MV, and LV. In particular, the gate electrode formed of the polysilicon film 10 left in the high-breakdown-voltage region HV is mentioned as a high-breakdown-voltage gate electrode GH1. The gate electrode formed of the polysilicon film 10 left in the middle-breakdown-voltage region MV is mentioned as a middle-breakdown-voltage gate electrode GM1. The gate electrode formed of the polysilicon film 10 left in the low-breakdown-voltage region LV is mentioned as a low-breakdown-voltage gate electrode GL1.

For the patterning of the polysilicon film 10 described above, the polysilicon film 10 is processed by being subjected to anisotropic etching using a photoresist (not shown) patterned by photolithography. At this time, the exposed portion of the protective silicon film ps1 is also removed by etching using the same mask.

Figure 18:
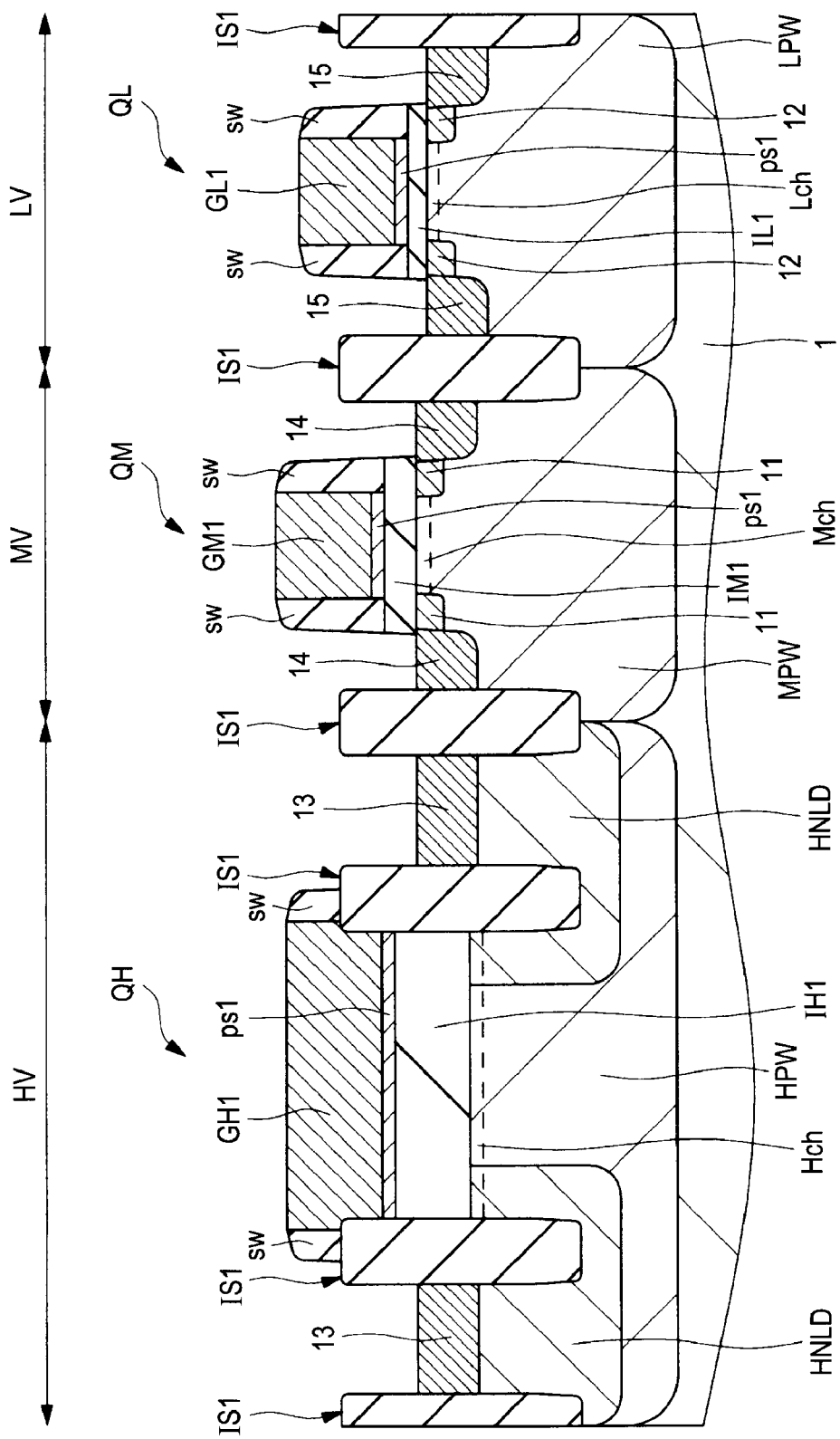
FIG. 18 is a principal-portion cross-sectional view of the semiconductor device during the manufacturing process thereof, which is subsequent to FIG. 17.

Next, as shown in FIG. 18, impurity is introduced into the silicon substrate 1 to form middle-breakdown-voltage extension regions 11 in the middle-breakdown-voltage region MV, and low-breakdown-voltage extension regions 12 in the low-breakdown-voltage region LV. Here, to the underlying silicon substrate 1 in a state after the preceding step, ion implantation is performed through the middle-breakdown-voltage insulating film IM1 or the low-breakdown-voltage insulating film nil. At this time, when ion implantation is performed to form, e.g., the middle-breakdown-voltage extension regions 11, a photoresist film (not shown) is formed in the high-breakdown-voltage region HV and the low-breakdown-voltage region LV. On the other hand, in the middle-breakdown-voltage region MV, ion implantation is performed without forming an ion implantation mask. As a result, in the middle-breakdown-voltage region MV, the middle-breakdown-voltage gate electrode GM1 serves as an ion implantation mask, and the middle-breakdown-voltage extension regions 11 are formed in the regions of the silicon substrate 1 located laterally under the middle-breakdown-voltage gate electrode GM1. The low-breakdown-voltage extension regions 12 can also be formed by performing the same steps in the low-breakdown-voltage region LV.

In the subsequent step, sidewall spacers sw each made of an insulating film containing silicon dioxide as a main component are formed so as to cover the respective sidewalls of the high-breakdown-voltage gate electrode GH1, the middle-breakdown-voltage gate electrode GM1, and the low-breakdown-voltage electrode GL1. The sidewall spacers sw can be formed by forming a silicon dioxide film over the entire surface of the silicon substrate 1 by a CVD method or the like, and etching back the silicon dioxide film by anisotropic etching.

In this step, the silicon dioxide film over the portions uncovered with the sidewall spacers sw is also similarly removed by etching. At this time point, the individual-breakdown-voltage insulating films IH1, IM1, and IL1 obtain the respective shapes of the gate insulating films located under the individual-breakdown-voltage gate electrodes GH1, GM1, and GL1.

Thereafter, ion implantation is performed with respect to each of the regions of the silicon substrate 1. In the ion implantation step also, ion implantation is performed by separately covering the individual regions with different ion implantation masks using photoresist films (not shown). As a result, in the high-breakdown-voltage region HV, ion implantation is performed with respect to the surfaces of regions uncovered with the high-breakdown-voltage gate electrode GH1, i.e., the high-breakdown-voltage n-type source/drain regions HNLD to form high-breakdown-voltage conduction regions 13. In the middle-breakdown-voltage region MV, ion implantation is performed with respect to regions uncovered with the middle-breakdown-voltage gate electrode GM1 and the sidewall spacers sw, i.e., the regions laterally under the middle-breakdown-voltage gate electrode GM1 and the sidewall spacers sw to form middle-breakdown-voltage source/drain regions 14. In the low-breakdown-voltage region LV, ion implantation is performed with respect to regions uncovered with the low-breakdown-voltage gate electrode GL1 and the sidewall spacers sw, i.e., the regions laterally under the low-breakdown-voltage gate electrode GL1 and the sidewall spacers sw to form low-breakdown-voltage source/drain regions 15. Note that, for the high-breakdown-voltage conduction regions 13, the middle-breakdown-voltage source/drain regions 14, and the low-breakdown-voltage source/drain regions 15, ion implantation may also be performed in the same step as long as conditions for the ion implantation are the same.

By the foregoing steps, the basic structures of the various MIS transistors have been formed in the silicon substrate 1. More specifically; in the high-breakdown-voltage region HV in the silicon substrate 1, the high-breakdown-voltage MIS transistor (first transistor) QH having the high-breakdown-voltage insulating film IH1 as the gate insulating film is formed. In the middle-breakdown-voltage region MV in the silicon substrate 1, the middle-breakdown-voltage MIS transistor (second transistor) QM having the middle-breakdown-voltage insulating film IM1 as the gate insulating film is formed. In the low-breakdown-voltage region LV in the silicon substrate 1, the low-breakdown-voltage MIS transistor (second transistor) QL having the low-breakdown-voltage insulating film IL1 as the gate insulating film is formed. Thus, the manufacturing method of Embodiment 1 has the steps of forming, over the silicon substrate 1, the high-breakdown-voltage MIS transistor QH, the middle-breakdown-voltage MIS transistor QM, and the low-breakdown-voltage MIS transistor QL in which the respective gate insulating films have different thicknesses.

Figure 19:
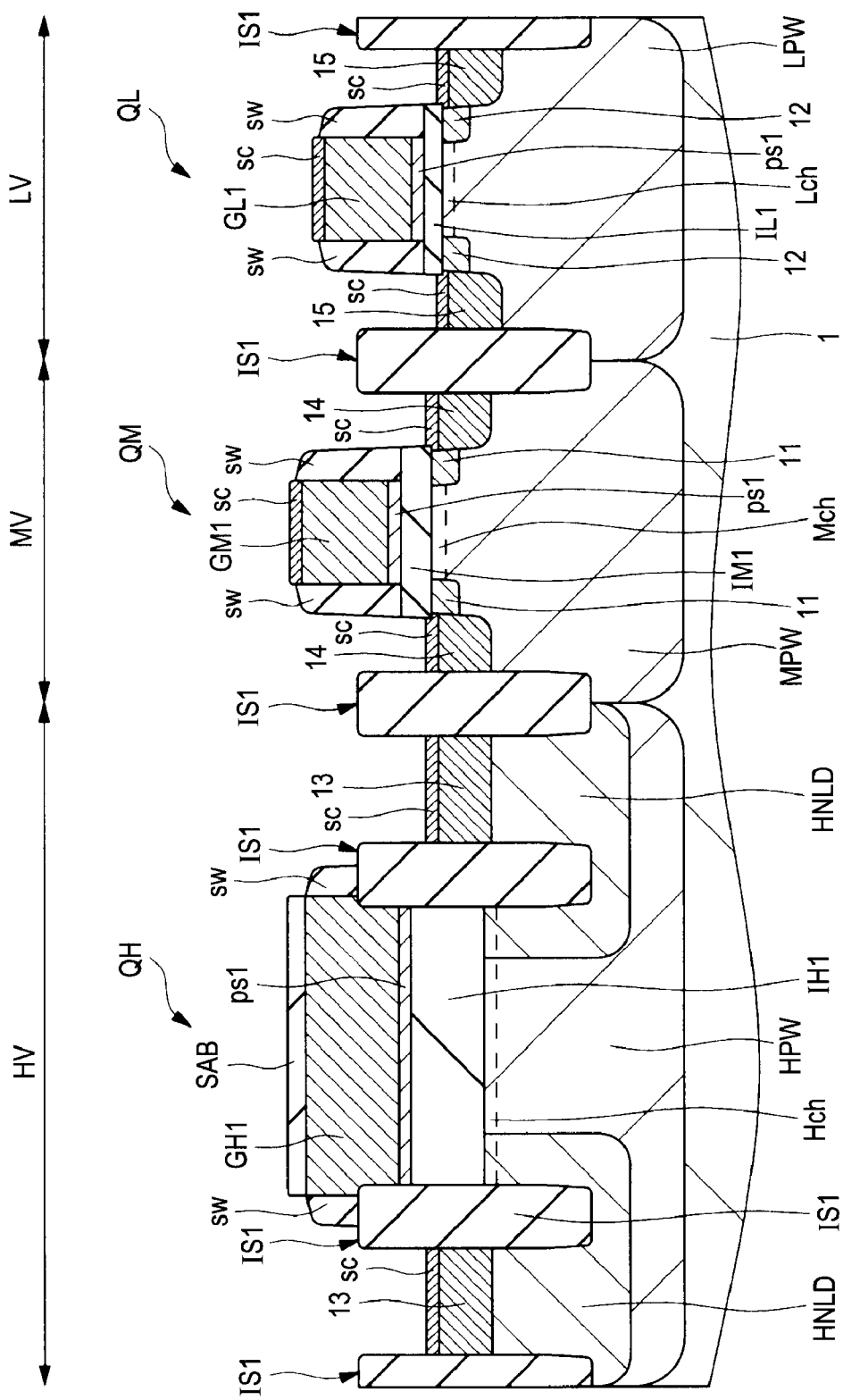
FIG. 19 is a principal-portion cross-sectional view of the semiconductor device during the manufacturing process thereof, which is subsequent to FIG. 18.

Next, as shown in FIG. 19, a protective silicon dioxide film SAB is formed so as to cover the upper surface of the high-breakdown-voltage gate electrode GH1. As the protective silicon dioxide film SAB, an insulating film containing silicon dioxide as a main component is formed by a CVD method or the like, and patterned by a photolithographic method, an etching method, or the like.

Thereafter, a metal silicide layer sc is formed so as to cover portions of silicon exposed at the surface of the silicon substrate 1. To form the metal silicide layer sc, a metal film (of, e.g., cobalt, nickel, or the like) is first formed by a sputtering method or the like so as to cover the surface of the silicon substrate 1. Thereafter, the silicon substrate 1 is heated. At this time, at a portion where silicon and the metal film are in contact, a combination occurs therebetween to form a metal silicide. Then, the portions of the metal film which have not formed the metal silicide are stripped to be removed. In this manner, the metal silicide layer sc can be formed so as to cover the portions of silicon exposed at the surface of the silicon substrate 1. Specifically, the metal silicide film sc can be formed at the surface of each of the high-breakdown-voltage conduction regions 13 in the high-breakdown-voltage region HV, the middle-breakdown-voltage source/drain regions 14 and the middle-breakdown-voltage gate electrode GM1 in the middle-breakdown-voltage region MV, and the low-breakdown-voltage source/drain regions 15 and the low-breakdown-voltage gate electrode GL1 in the low-breakdown-voltage region LV. A technique for thus forming the metal silicide layer sc at the portions where silicon is exposed in a self aligned manner is called a salicide (Self-Align Silicide) step.

The protective silicon dioxide film SAB described above is a so-called salicide block film formed to prevent the formation of the metal silicide layer sc over the surface of the high-breakdown-voltage gate electrode GH1.

Figure 20:
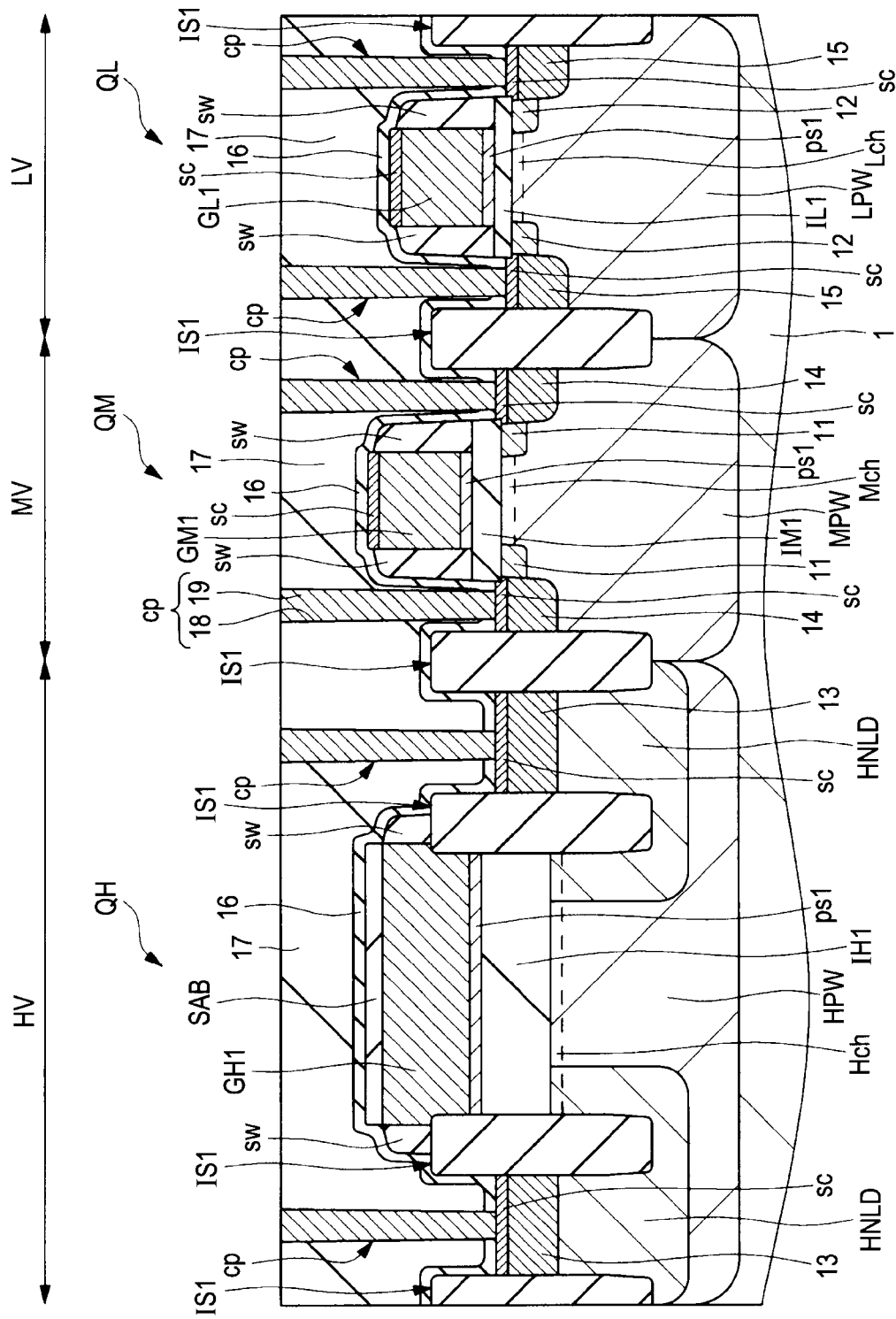
FIG. 20 is a principal-portion cross-sectional view of the semiconductor device during the manufacturing process thereof, which is subsequent to FIG. 19.

Next, as shown in FIG. 20, an etching stopper 16 made of a silicon nitride film is formed so as to cover the surface of the silicon substrate 1. Then, an interlayer insulating film 17 made of a silicon dioxide film is formed so as to cover the structure formed over the surface of the silicon substrate 1 by the foregoing steps performed thus far. Thereafter, the surface of the interlayer insulating film 17 is polished by a CMP method or the like, and the interlayer insulating film 17 is laminated again to be increased.

In the subsequent step, such contact plugs cp in electrical conduction with the respective MIS transistors QH, QM, and QL via the metal silicide layer sc are formed. To form the contact plugs cp, such contact holes 18 as to extend through the interlayer insulating film 17, and reach the metal silicide layer sc are first formed by a photolithographic method and an anisotropic etching method. Thereafter, a buried conductor film 19 is formed so as to fill the contact holes 18. By removing the portion of the buried conductor film 19 located outside the contact holes by a CMP method or the like, the contact plugs cp including the contact holes 18 and the buried conductor film 19 are formed.

Here, to stop the anisotropic etching for forming the contact holes 18 in a self-aligned manner, and prevent over-etching of the underlying components, the etching stopper 16 is formed under the interlayer insulating film 17. Before the buried conductor film 19 is formed, to prevent a chemical reaction, mutual diffusion, and the like between the buried conductor film 19 and the interlayer insulating film 17, a barrier metal may also be formed over the inner wall of each of the contact holes 18. As the barrier metal, titanium (Ti), titanium nitride (TiN), a laminated film thereof, or the like is appropriate. For the buried conductor film 19, tungsten (W) or the like is appropriate.

Figure 21:
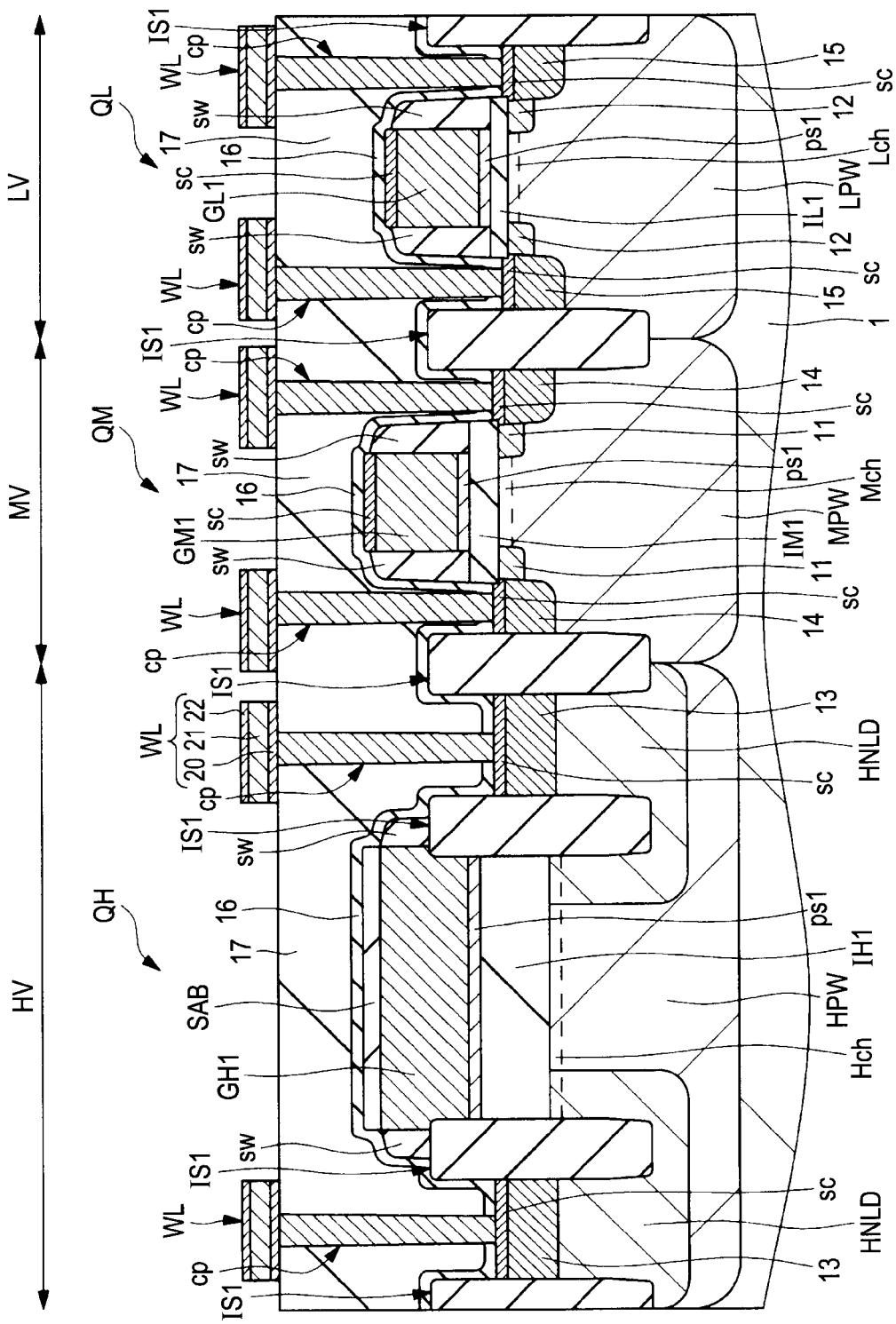
FIG. 21 is a principal-portion cross-sectional view of the semiconductor device during the manufacturing process thereof, which is subsequent to FIG. 20.

Next, as shown in FIG. 21, over the interlayer insulating film 17, metal wires WL are formed so as to be electrically coupled to the contact plugs cp. To form the metal wires WL, over the interlayer insulating film 17, a laminated film of a barrier metal 20, a wiring conductor film 21, and a barrier metal 22 is formed first. Thereafter, by a photolithographic method, an etching method, or the like, the laminated film described above is processed into a desired wiring pattern to form the metal wires WL each including the barrier metal 20, the wiring conductor film 21, and the barrier metal 22. As each of the barrier metals 20 and 22, titanium, titanium nitride, or a laminated film thereof is appropriate. As the wiring conductor film 21, aluminum (Al) or the like is appropriate.

For example, as described above as the problem, according to the manufacturing methods examined by the present inventors, the elevation differences between the underlying individual-breakdown-voltage insulating films (individual gate insulating films) are as large as nearly 100 nm. Accordingly, the distance from the gate electrode at the highest elevation to the metal wires is smaller than the distance from the gate electrode at the lowest elevation to the metal wires. Therefore, it is necessary to ensure a short margin therebetween, and thicken the interlayer insulating film. However, if the interlayer insulating film is thickened, the step of forming the contact holes described above using FIG. 20 becomes difficult. That is, the aspect ratio of each of the contact holes to be formed is increased to degrade processibility. Such a high aspect ratio of each of the contact holes presents a more significant problem with the increasing miniaturization and higher-scale integration of elements.

By contrast, in the manufacturing method of Embodiment 1, the elevation differences between the individual-breakdown-voltage insulating films (individual gate insulating films) IH1, IM1, and IL1 can be reduced to about 10 to 13 nm, as described above. Therefore, it is possible to ensure a short margin between the gate electrode at the highest elevation (e.g., the middle-breakdown-voltage gate electrode GM1) and the metal wires WL without particularly thickening the interlayer insulating film 17. That is, the aspect ratio of each of the contact holes 18 is not particularly increased. Thus, according to the manufacturing method of Embodiment 1, it is possible to reduce the elevation differences between the individual-breakdown-voltage insulating films (the individual gate insulating films) IH1, IM1, and IL1 of different thicknesses, and improve the processibility of the interlayer insulating film 17 in forming the contact holes 18. As a result, it is possible to further improve the manufacturing yield of the semiconductor device having the transistors in which the gate insulating films have different thicknesses.

In the subsequent steps, an interlayer insulating film, via plugs, metal wires, and the like are formed into a desired structure in the same manner as in the foregoing steps. The foregoing is the manufacturing method of the semiconductor device of Embodiment 1.

The structure of the high-breakdown-voltage MIS transistor QH formed in the manufacturing method of the semiconductor device of Embodiment 1 will be described in greater detail. The high-breakdown-voltage MIS transistor QH of Embodiment 1 has a structure in which each of the end portions of the high-breakdown-voltage insulating film IH1 as the gate insulating film thereof does not terminate alone. In other words, in the end portion of the high-breakdown-voltage insulating film IH1, the isolation portion IS1 of the STI structure is arranged. The end portion of the high-breakdown-voltage gate electrode GH1 is formed so as to partially cover the upper surface of the isolation portion LSI. By providing such a structure, it is possible to prevent an electric field from being concentrated on the end portion of the high-breakdown-voltage insulating film IH1 as the gate insulating film in the high-breakdown-voltage MIS transistor QH to which a high voltage is applied.

In addition, the high-breakdown-voltage n-type source/drain regions (first semiconductor region) HNLD for supplying charge carriers (carriers) to the high-breakdown-voltage channel region Hch under the high-breakdown-voltage insulating film IH1 are formed to two-dimensionally span over the isolation portions ISI in the end portions of the high-breakdown-voltage insulating film IH1 described above, and be deeper than the isolation portions IS1. In other words, the high-breakdown-voltage insulating film IH1 is formed at a position where it two-dimensionally overlaps a portion of each of the high-breakdown-voltage n-type source/drain regions HNLD so as not to be deeper than the high-breakdown-voltage n-type source/drain regions HNLD. The high-breakdown-voltage n-type source/drain regions HNLD are structured to be exposed outside the isolation portions IS1, and coupled at the surfaces thereof to the contact plugs cp via the high-breakdown-voltage conduction regions 13 and the metal silicide layers sc. As a result, carriers supplied from the contact plugs cp to the high-breakdown-voltage n-type source/drain regions HNLD are supplied to the high-breakdown-voltage channel region Hch in such a manner as to move under and along the bottom portion of the isolation portion IS1 in each of the end portions of the high-breakdown-voltage insulating film IH1.

From the foregoing description, it will be understood that, in the high-breakdown-voltage MIS transistor QH of Embodiment 1, the cross-sectional area of a current path and an amount of current change depending on the depth of the isolation portion IS1 arranged in each of the end portions of the high-breakdown-voltage insulating film IH1 as the gate insulating film. More specifically, as the isolation portions IS1 in the end portions of the high-breakdown-voltage insulating film IH1 are deeper, the widths of the high-breakdown-voltage n-type source/drain regions HNLD where carriers move decrease, and the amount of current decreases. On the other hand, as the isolation portions IS1 in the end portions of the high-breakdown-voltage insulating film IH1 are shallower, the widths of the high-breakdown-voltage n-type source/drain regions HNLD where carriers move increase, and the amount of current increases. Thus, the high-breakdown-voltage MIS transistor QH has an electrical characteristic thereof concerning the amount of current which changes in accordance with the shapes of the bottom portions of the isolation portions IS1.

Here, by applying the manufacturing method of the semiconductor device of Embodiment 1, the shapes of the bottom portions of the isolation portion IS1 can be controlled. Hereinbelow, a detailed description will be given of a technique therefor.

In the manufacturing method of Embodiment 1, as stated above in the description of the steps of FIGS. 12 to 16, the isolation portion IS1 is formed in the two-dimensional boundary portion between the high-breakdown-voltage insulating film IH1 and the middle-breakdown-voltage insulating film IM1 which have different thicknesses. Therefore, to form a structure in which the isolation portion IS1 is arranged in each of the end portions of the high-breakdown-voltage insulating film IH1 as described above, the boundary portion between the high-breakdown-voltage insulating film IH1 and the middle-breakdown-voltage insulating film IM1 is arranged at a position where the high-breakdown-voltage insulating film IH1 two-dimensionally overlaps the high-breakdown-voltage n-type source/drain regions HNLD. In other words, prior to the step of FIG. 12 described above, the high-breakdown-voltage insulating film IH1 is formed at a position where it two-dimensionally overlaps a portion of each of the high-breakdown-voltage n-type source/drain region. HNLD, and the middle-breakdown-voltage insulating film IM1 is further formed so as to be adjacent thereto.

Hereinbelow, a detailed description will be given of the step of forming the isolation portion IS1 in the two-dimensional boundary portion between the high-breakdown-voltage insulating film IH1 and the middle-breakdown-voltage insulating film IM1.

Figure 22:
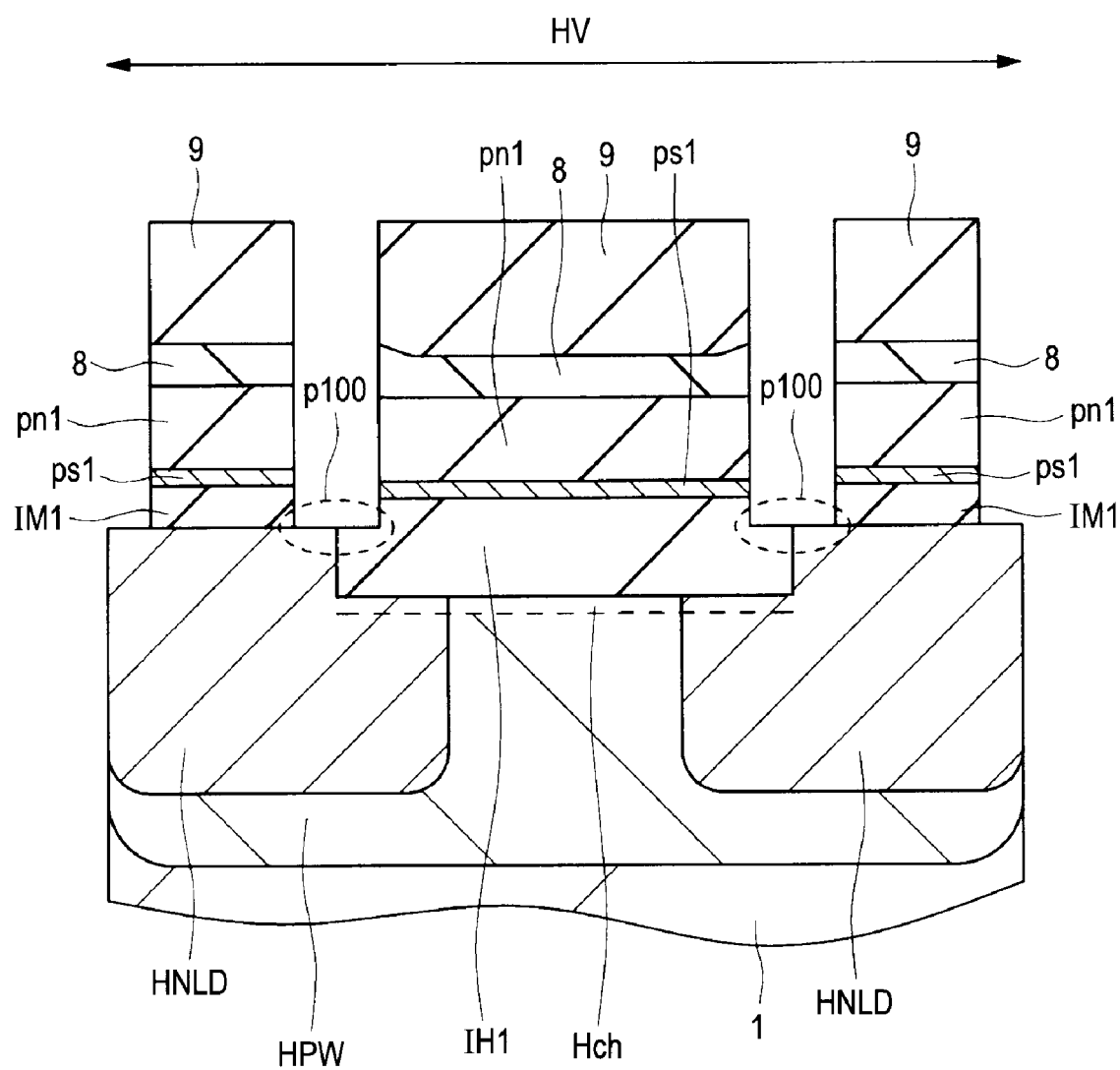
FIG. 22 is a principal-portion cross-sectional view of the semiconductor device during the manufacturing process from FIG. 12 to FIG. 13.

In FIG. 22 is shown a principal-portion cross-sectional view only of the high-breakdown-voltage region HV in the manufacturing process of the semiconductor device of Embodiment 1. FIG. 22 particularly shows a process from the step of FIG. 12 described above to the step of FIG. 13 described above. Using the photoresist film 9 as an etching mask, anisotropic etching is performed to successively remove the back-surface anti-reflection film 8, the protective silicon nitride film pn1, and the protective silicon film ps1. Then, the process of etching the high-breakdown-voltage insulating film IH1 and the middle-breakdown-voltage insulating film IM1 is reached. These insulating films have been structurally categorized, but both of them are insulating films containing silicon dioxide as a main component. It is not intended to categorize these insulating films as anisotropic etching targets.

It is to be noted here that, in the manufacturing method of Embodiment 1, the middle-breakdown-voltage insulating film IM1 has been formed such that the bottom portion thereof is arranged at a position shallower than the high-breakdown-voltage insulating film IH1. Therefore, when the etching of the high-breakdown-voltage insulating film IH1 and the middle-breakdown-voltage insulating film IM1 proceeds, the middle-breakdown-voltage insulating film IM1 is the first that is removed to the bottom portion thereof and, at this portion, the high-breakdown-voltage n-type source/drain regions HNLD (silicon substrate 1) are exposed, as shown in principal portions p100 in FIG. 22. At this time point, anisotropic etching targets are of two types, which are the high-breakdown-voltage insulating film IH1 made of a silicon dioxide film and the silicon substrate 1 made of single-crystal silicon.

Thereafter, in the case where the anisotropic etching is continued under such a condition that respective etching rates to the high-breakdown-voltage insulating film IH1 made of the silicon dioxide film and to the silicon substrate 1 made of single-crystal silicon are equal, e.g., the bottom portion of each of the trenches tr1 has a substantially equally flat shape, as shown in FIG. 13 described above. On the other hand, in the case where the anisotropic etching is continued under such a condition that the respective etching rates to the high-breakdown-voltage insulating film IH1 made of the silicon dioxide film and to the silicon substrate 1 made of single-crystal silicon are different, the bottom portion of the trench does not have a flat shape.

For example, in the case where the anisotropic etching is performed under such a condition that the etching rate to the silicon dioxide film is higher than the etching rate to single-crystal silicon, in the above-mentioned principal portions p100 of FIG. 22, the high-breakdown-voltage insulating film IH1 is etched faster than the high-breakdown-voltage n-type source/drain regions HNLD. Then, from the time when the high-breakdown-voltage insulating film IH1 is removed and the high-breakdown-voltage n-type source/drain regions HNLD are exposed on, the etching rate is uniform.

Figure 23:
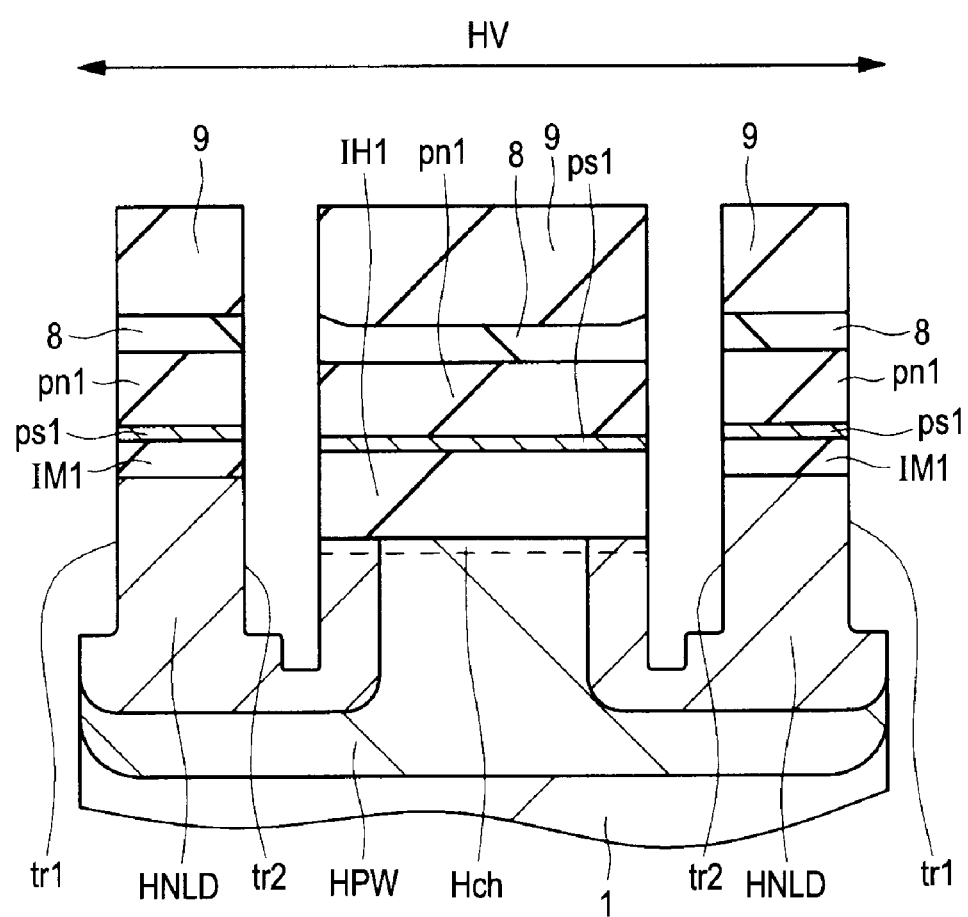
FIG. 23 is a principal-portion cross-sectional view of the semiconductor device of Embodiment 1 of the present invention during another manufacturing process thereof, which is subsequent to FIG. 22.
Figure 24:
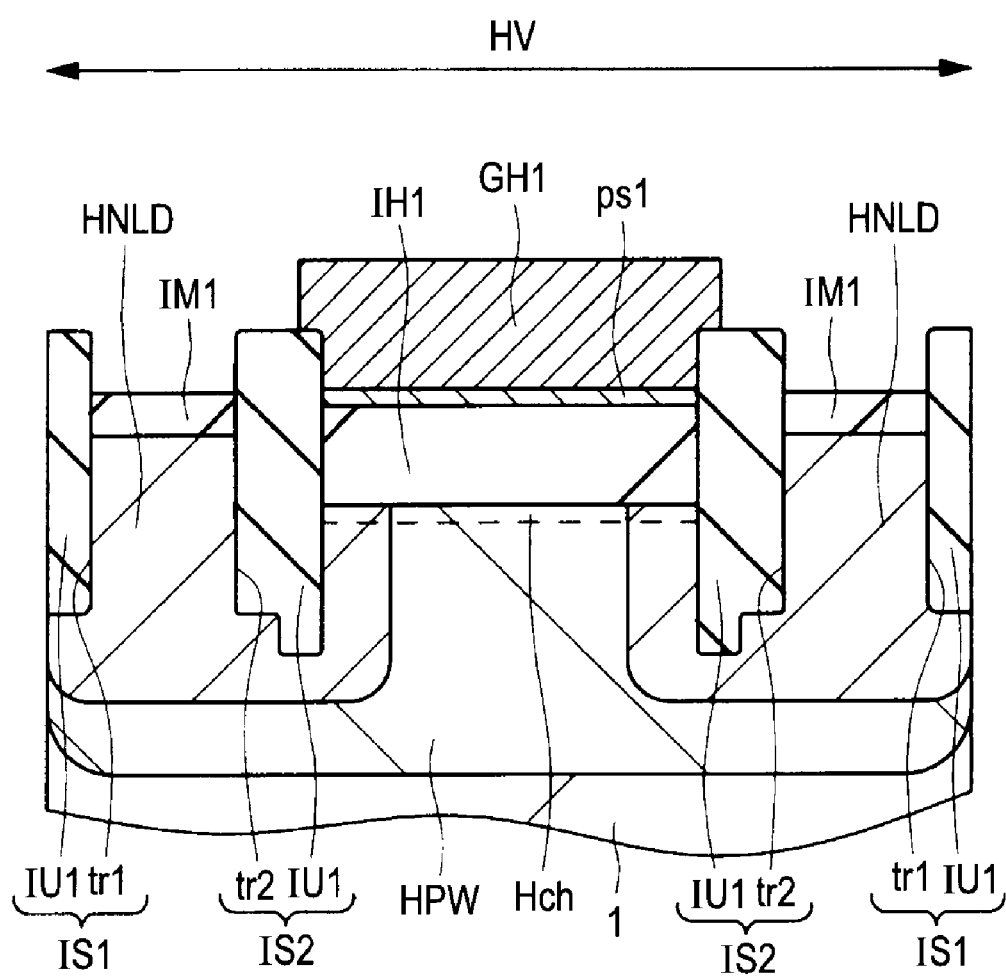
FIG. 24 is a principal-portion cross-sectional view of the semiconductor device during the manufacturing process thereof, which is subsequent to FIG. 23.

In the case where the anisotropic etching is performed under such a condition, the shape of the bottom portion of each of trenches tr2 becomes characteristic, as shown in FIG. 23. That is, when viewed in two dimensions, a portion of the bottom portion closer to the high-breakdown-voltage insulating film IH1 is deeper, and a portion thereof more distant from the high-breakdown-voltage insulating film IH1 is shallower. Thereafter, in the same manner as in the steps described above using FIGS. 14 to 17, the trenches tr2 are filled with the insulating film for isolation IU1, and the high-breakdown-voltage gate electrode GH1 is formed so that a structure as shown in FIG. 24 is formed. Each of isolation portions IS2 formed of the trenches tr2 formed by performing the anisotropic etching under the above-mentioned condition and of the insulating film for isolation IU1 has a structure which is deeper in a portion thereof closer to the high-breakdown-voltage insulating film IH1, and shallower in a portion thereof more distant from the high-breakdown-voltage insulating film IH1.

On the other hand, in the case where, e.g., the anisotropic etching is performed under such a condition that an etching rate to silicon dioxide is lower than an etching rate to single-crystal silicon, in the above-mentioned principal portions p100 of FIG. 22, the high-breakdown-voltage insulating film IH1 is etched more slowly than the high-breakdown-voltage n-type source/drain regions HNLD. Then, from the time when the high-breakdown-voltage insulating film IH1 is removed and the high-breakdown-voltage n-type source/drain regions HNLD are exposed on, the etching rate is uniform.

Figure 25:
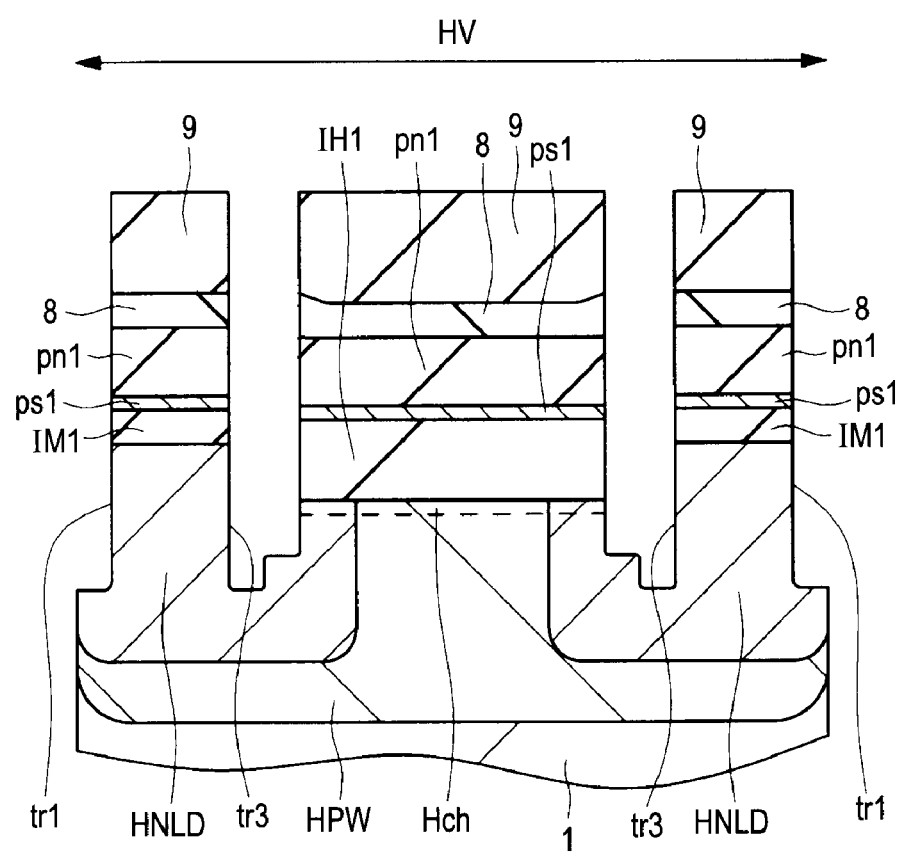
FIG. 25 is a principal-portion cross-sectional view of the semiconductor device of Embodiment 1 of the present invention during still another manufacturing process thereof, which is subsequent to FIG. 22.
Figure 26:
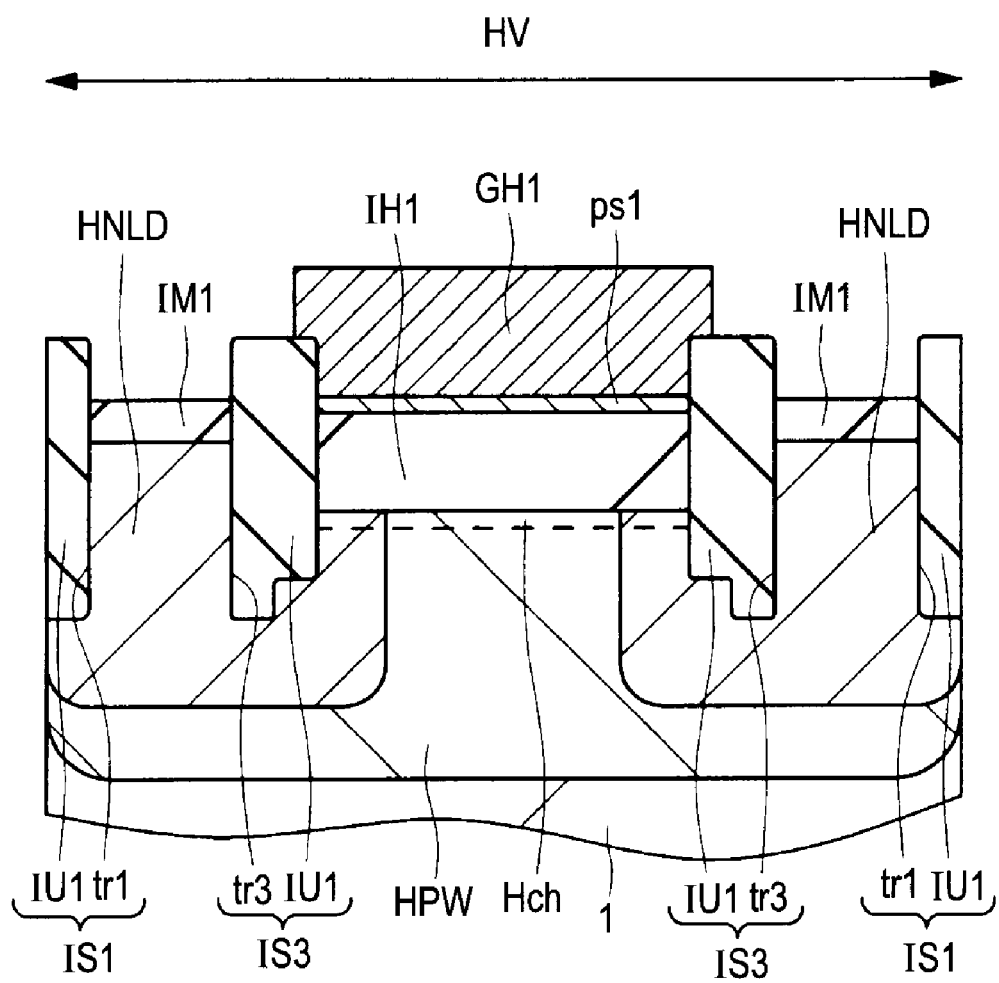
FIG. 26 is a principal-portion cross-sectional view of the semiconductor device during the manufacturing process thereof, which is subsequent to FIG. 25.

In the case where anisotropic etching is performed under such a condition, the shape of the bottom portion of each of trenches tr3 becomes characteristic, as shown in FIG. 25. That is, when viewed in two dimensions, a portion of the bottom portion closer to the high-breakdown-voltage insulating film IH1 is shallower, and a portion thereof more distant from the high-breakdown-voltage insulating film IH1 is deeper. Thereafter, in the same manner as in the steps described above using FIGS. 14 to 17, the trenches tr3 are filled with the insulating film for isolation IU1, and the high-breakdown-voltage gate electrode GH1 is formed so that a structure as shown in FIG. 24 is formed. Each of isolation portions IS3 formed of the trenches tr3 formed by performing the anisotropic etching under the above-mentioned condition and of the insulating film for isolation IU1 has a structure which is shallower in a portion thereof closer to the high-breakdown-voltage insulating film IH1, and deeper in a portion thereof more distant from the high-breakdown-voltage insulating film IH1.

Thus, in the manufacturing method of the semiconductor device of Embodiment 1, it is more preferable to perform the anisotropic etching under the condition that, in the above-mentioned principal portions p100 of FIG. 22, the respective etching rates to the high-breakdown-voltage n-type source/drain regions HNLD and to the high-breakdown-voltage insulating film IH1 are different. This is because, by thus performing the anisotropic etching, the respective depths of the isolation portions IS1, IS2, and IS3 arranged in the end portions of the high-breakdown-voltage insulating film IH1 can be varied in the portion closer to the high-breakdown-voltage insulating film IH1 and in the portion more distant therefrom. As described above, in the high-breakdown-voltage MIS transistor QH of Embodiment 1, the shapes of the respective bottom portions of the isolation portions IS1, IS2, and IS3 are related to the amount of current in the high-breakdown-voltage MIS transistor QH. Therefore, according to the manufacturing method of Embodiment 1, it is possible to control an electrical characteristic related to the amount of current in the high-breakdown-voltage MIS transistor QH. This means that the semiconductor device having the high-breakdown-voltage MIS transistor QH can be increased in performance. As a result, it is possible to improve the manufacturing yield of the semiconductor device having the transistors in which the gate insulating films have different thicknesses, while increasing the performance thereof.

Embodiment 2

A manufacturing method of a semiconductor device of Embodiment 2 of the present invention will be described. In the manufacturing method of Embodiment 2 also, in the same manner as in Embodiment 1 described above, the high-breakdown-voltage MIS transistor QH, the middle-breakdown-voltage MIS transistor QM, and the low-breakdown-voltage MIS transistor QL which have the gate insulating films of different thicknesses are formed respectively in the high-breakdown-voltage region HV, the middle-breakdown-voltage region MV, and the low-breakdown-voltage region LV in the silicon substrate 1.

Figure 27:
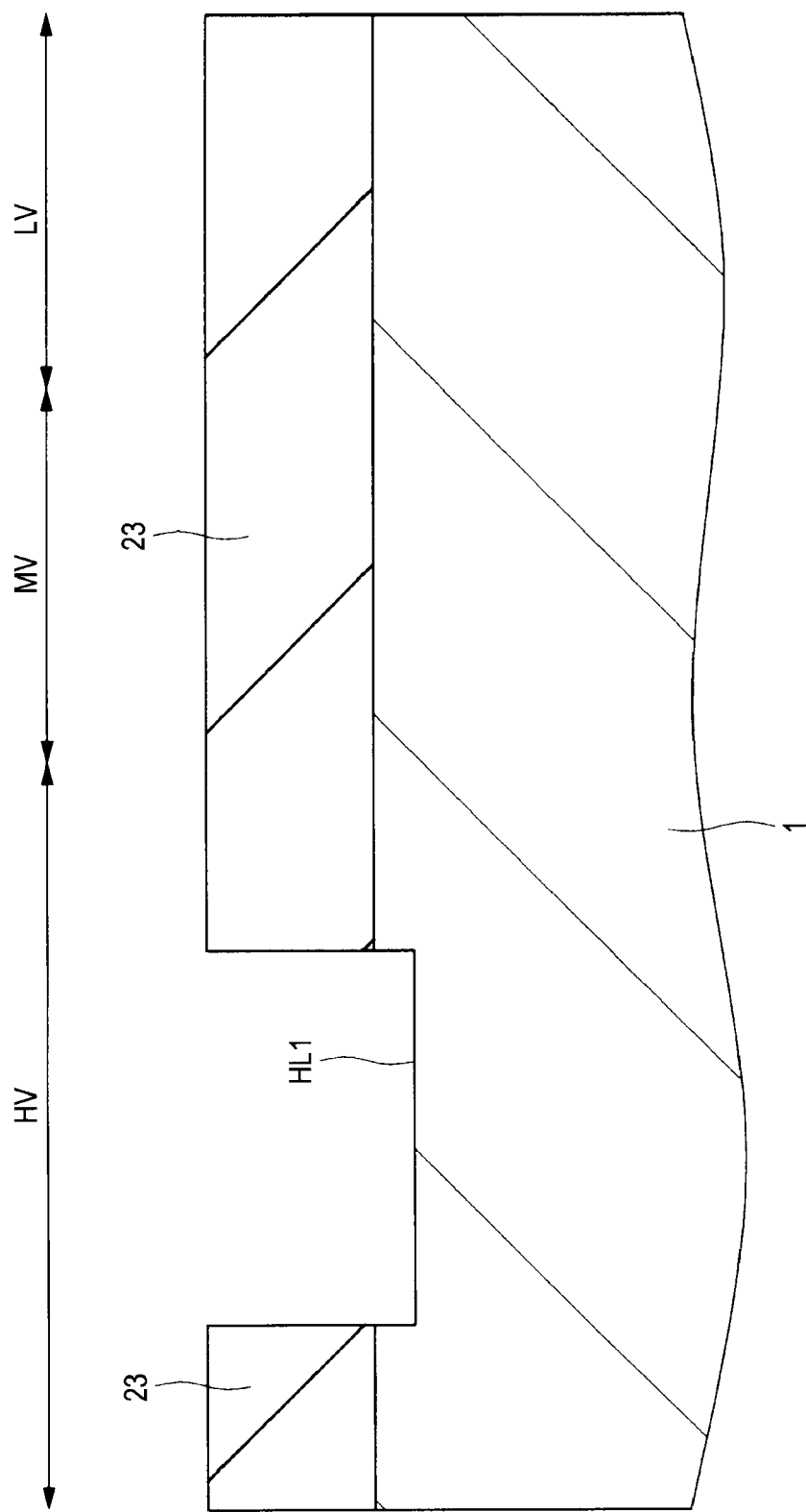
FIG. 27 is a principal-portion cross-sectional view of a semiconductor device of Embodiment 2 of the present invention during a manufacturing process thereof.

First, as shown in FIG. 27, in a portion of the high-breakdown-voltage region HV in the silicon substrate 1, a depressed portion HL1 lower in level than the other region is formed. To form the depressed portion HL1, over the silicon substrate 1, a photoresist film 23 patterned by a photolithographic method or the like is formed first. Subsequently, using the photoresist film 23 as an etching mask, dry etching is performed with respect to the silicon substrate 1. After the dry etching step, the photoresist film 23 is removed. In this manner, the depressed portion HL1 is formed. For example, the depressed portion HL1 lower in level than the surface of the silicon substrate 1 by about 30 to 40 nm is formed.

Figure 28:
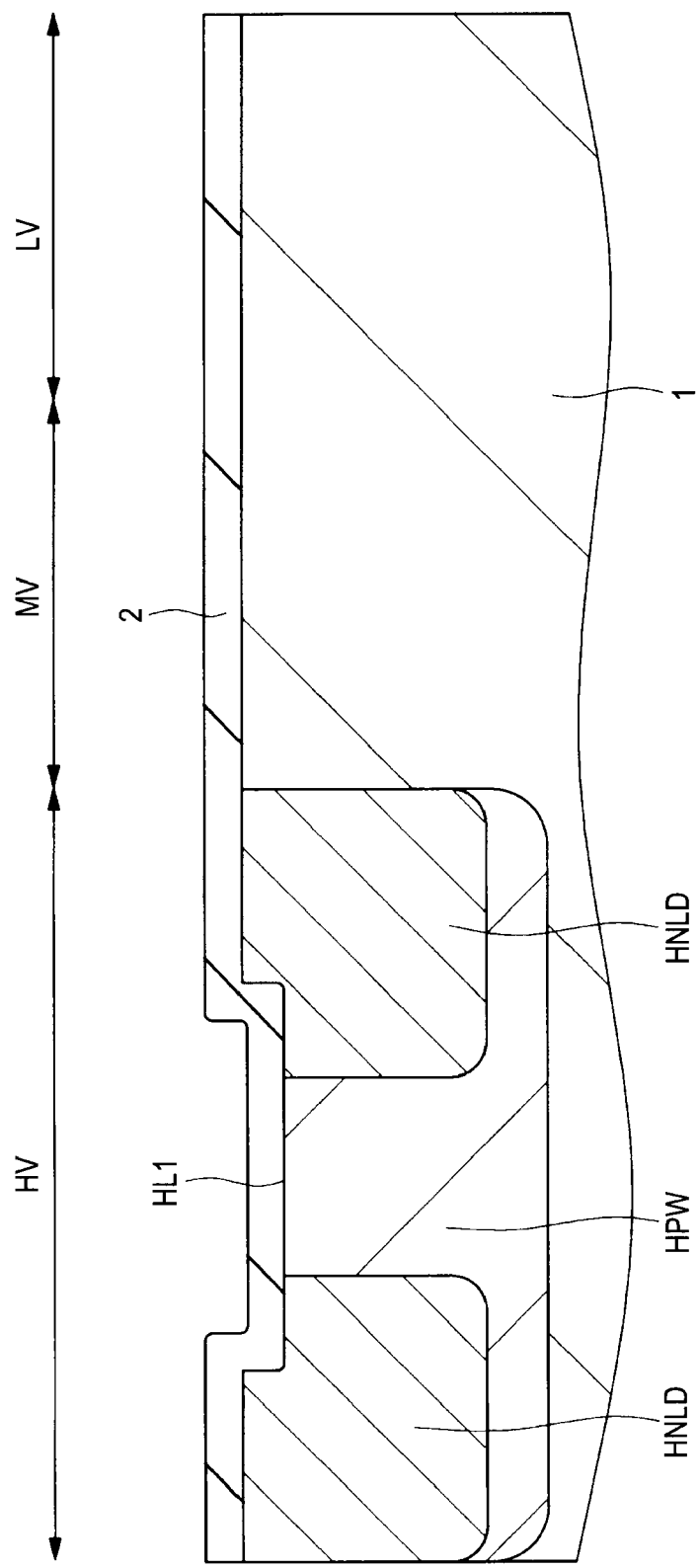
FIG. 28 is a principal-portion cross-sectional view of the semiconductor device during the manufacturing process thereof, which is subsequent to FIG. 27.

Next, as shown in FIG. 28, in the same manner as in the steps described above using FIGS. 1 and 2, the pad oxide film 2, the high-breakdown-voltage p-well region HPW, and the high-breakdown-voltage n-type source/drain regions HNLD are formed successively.

Figure 29:
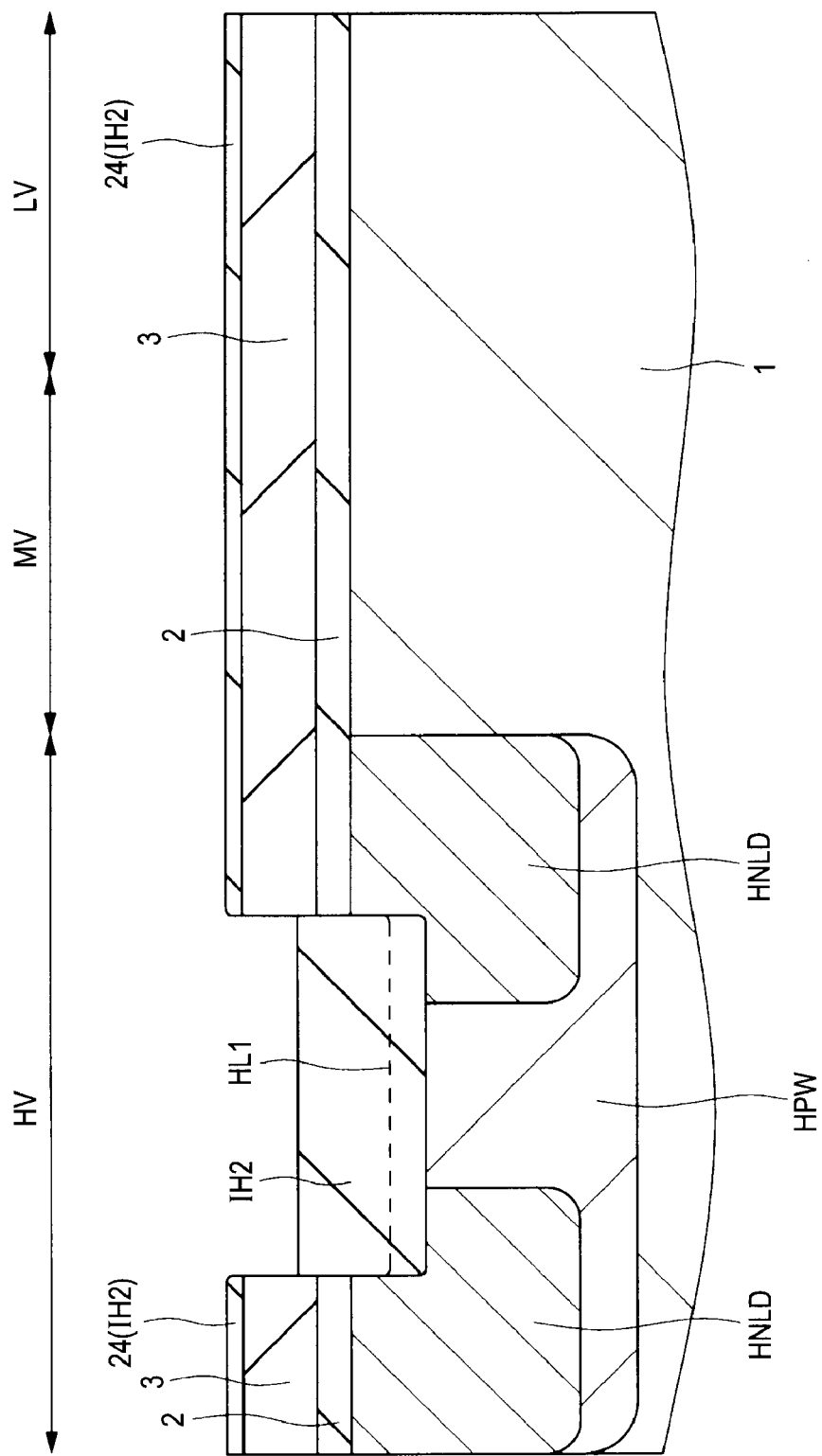
FIG. 29 is a principal-portion cross-sectional view of the semiconductor device during the manufacturing process thereof, which is subsequent to FIG. 28.

Then, as shown in FIG. 29, the protective nitride film 3 is formed, and the protective nitride film 3 and the pad oxide film 2 are patterned in the same manner as in the steps described above using FIGS. 3 and 4. In the manufacturing method of Embodiment 2, the protective nitride film 3 and the pad oxide film 2 are patterned such that the depressed portion HL1 formed in the foregoing step is exposed.

In the subsequent step, a high-breakdown-voltage insulating film (first insulating film) IH2 is formed in the depressed portion HL1 of the silicon substrate 1. Here, in the same manner as in the method of forming the high-breakdown-voltage insulating film IH1 in FIG. 5 described above, by thermally oxidizing the silicon substrate 1, the high-breakdown-voltage insulating film IH2 is formed over a portion of the depressed portion HL1 where the silicon substrate 1 is exposed. In the manufacturing method of Embodiment 2, the high-breakdown-voltage insulating film IH2 having a thickness of about 100 to 120 nm is formed by a thermal oxidation method. At this time, the upper surface of the protective nitride film 3 is also slightly oxidized to form a silicon dioxide film 24.

Thereafter, in the same manner as in the method described above using FIG. 5, the thin silicon dioxide film 24 formed over the protective nitride film 3, the protective nitride film 3, and the pad oxide film 2 are successively removed by etching. In this step, an etching mask is not particularly formed in the high-breakdown-voltage region HV. Therefore, it follows that, when the silicon dioxide film 24 over the protective nitride film 3 and the pad oxide film 2 are etched, the high-breakdown-voltage insulating film IH2 made of the same silicon dioxide is also subjected to the etching. Accordingly, by the present step, the high-breakdown-voltage insulating film IH2 in the high-breakdown-voltage region HV is thinned.

Figure 30:
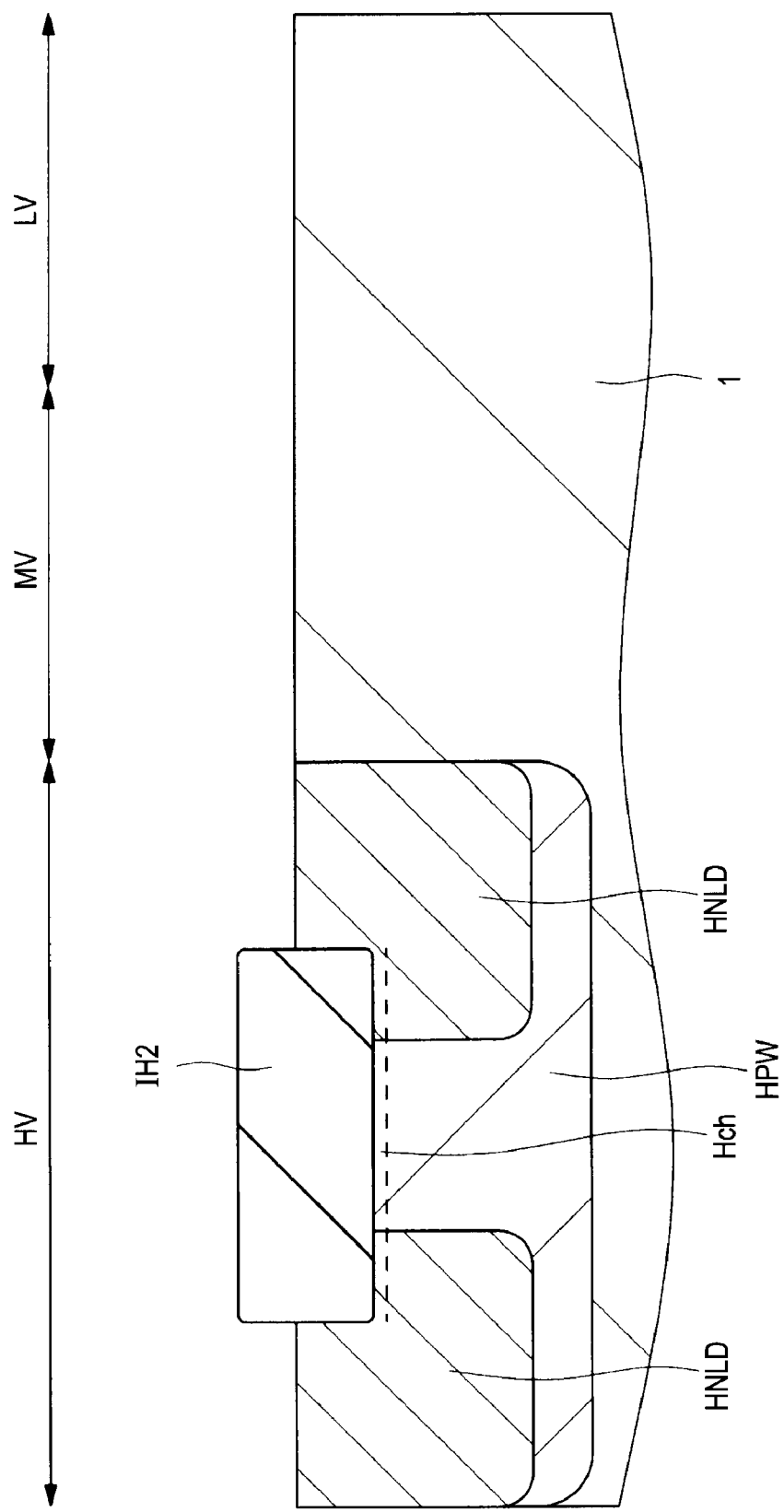
FIG. 30 is a principal-portion cross-sectional view of the semiconductor device during the manufacturing process thereof, which is subsequent to FIG. 29.

Next, as shown in FIG. 30, the impurity concentration of a region of the silicon substrate 1 located under the high-breakdown-voltage insulating film IH2 is adjusted. As described above, since the high-breakdown-voltage insulating film IH2 is a member serving as the gate insulating film of the high-breakdown-voltage MIS transistor, the region of the silicon substrate 1 located thereunder is a portion serving as the high-breakdown-voltage channel region Hch. By adjusting the impurity concentration of the high-breakdown-voltage channel region Hch by the present step, it is possible to adjust a characteristic (such as, e.g., threshold voltage) of the high-breakdown-voltage MIS transistor. For the adjustment, ion implantation is performed with respect to the silicon substrate 1 in such a manner as to allow the transmission of ions through the high-breakdown-voltage insulating film IH2.

In the subsequent step, by performing the same steps as the steps including and subsequent to the step described above using FIG. 7 in Embodiment 1 described above, the plurality of MIS transistors having the gate insulating films of different thicknesses which are the same as in the above-mentioned structure shown in FIG. 21 can be formed.

Thus, in the manufacturing method of the semiconductor device of Embodiment 2, the high-breakdown-voltage insulating film IH2 is first formed thick, and the surface thereof is abraded so that the insulating film thinner than the high-breakdown-voltage insulating film IH2 is formed in the other region. In this point, the manufacturing method of the semiconductor device of Embodiment 2 is the same as the manufacturing method of the semiconductor device of Embodiment 1. In terms of operation and effect also, the manufacturing method of the semiconductor device of Embodiment 2 is the same as the manufacturing method of the semiconductor device of Embodiment 1. As a result, it is possible to improve the manufacturing yield of the semiconductor device having the transistors in which the gate insulating films have different thicknesses.

Further, in the manufacturing method of the semiconductor device of Embodiment 2 also, in the same manner as in the manufacturing method of Embodiment 1, the isolation portions are formed after the formation of the gate insulating films by the SA-STI step. In this point also, the same operation and effect as those in the description of Embodiment 1 given above are provided. As a result, it is possible to further improve the manufacturing yield of the semiconductor device having the transistors in which the gate insulating films have different thicknesses.

In the manufacturing method of the semiconductor device of Embodiment 2, a region where the high-breakdown-voltage insulating film IH2 is to be formed is abraded in advance by etching to form the depressed portion HL1 lower in level than the other region, and the high-breakdown-voltage insulating film IH2 is formed therein. This allows the high-breakdown-voltage insulating film IH2 when it is first formed by the thermal oxidation method to be thinner than in the case where the depressed portion HL1 is not provided. In the example of Embodiment 2, it is sufficient to form the high-breakdown-voltage insulating film IH2 to a thickness of about 100 to 120 nm in contrast to Embodiment 1 described above in which the high-breakdown-voltage insulating film IH1 is formed to a thickness of about 180 to 220 nm (see FIG. 5 mentioned above). The fact that the high-breakdown-voltage insulating film IH2, which will serve as the gate insulating film of the high-breakdown-voltage MIS transistor QH later, can be formed thin means easier control of the film thickness, and variations in characteristic can be reduced. As a result, it is possible to further improve the manufacturing yield of the semiconductor device having the transistors in which the gate insulating films have different thicknesses.

On the other hand, in the manufacturing method of the semiconductor device of Embodiment 1 described above, a depressed portion is not formed in advance so that the number of the photolithographic steps is accordingly smaller. Therefore, in terms of producibility such as production cost, the manufacturing method of Embodiment 1 described above is preferred.

The ion implantation for adjusting the concentration of the high-breakdown-voltage channel region Hch is performed in such a manner as to allow the transmission of ions through the high-breakdown-voltage insulating films IH1 and IH2. In an ion implantation method, as an insulating film through which ions are transmitted is thinner, an implantation energy is reduced to a lower level so that controllability is increased, and reliability is also enhanced. Therefore, if the high-breakdown-voltage insulating film IH2 can be thinned by forming the depressed portion HL1 in advance as in the manufacturing method of Embodiment 2, it is possible to improve the reliability of the ion implantation step for adjusting the concentration of the channel region Hch. As a result, it is possible to further improve the manufacturing yield of the semiconductor device having the transistors in which the gate insulating films have different thicknesses. In other words, the manufacturing method of the semiconductor device having the steps of forming the gate insulating films, and then performing the ion implantation by allowing the transmission of ions through the insulating films is also more effective when the technology of the present invention is applied thereto.

Embodiment 3

A manufacturing method of a semiconductor device of Embodiment 3 of the present invention will be described. In the manufacturing method of Embodiment 3 also, in the same manner as in Embodiments 1 and 2 described above, the high-breakdown-voltage MIS transistor QH, the middle-breakdown-voltage MIS transistor QM, and the low-breakdown-voltage MIS transistor QL which have the gate insulating films of different thicknesses are formed respectively in the high-breakdown-voltage region HV, the middle-breakdown-voltage region MV, and the low-breakdown-voltage region LV in the silicon substrate 1.

Figure 31:
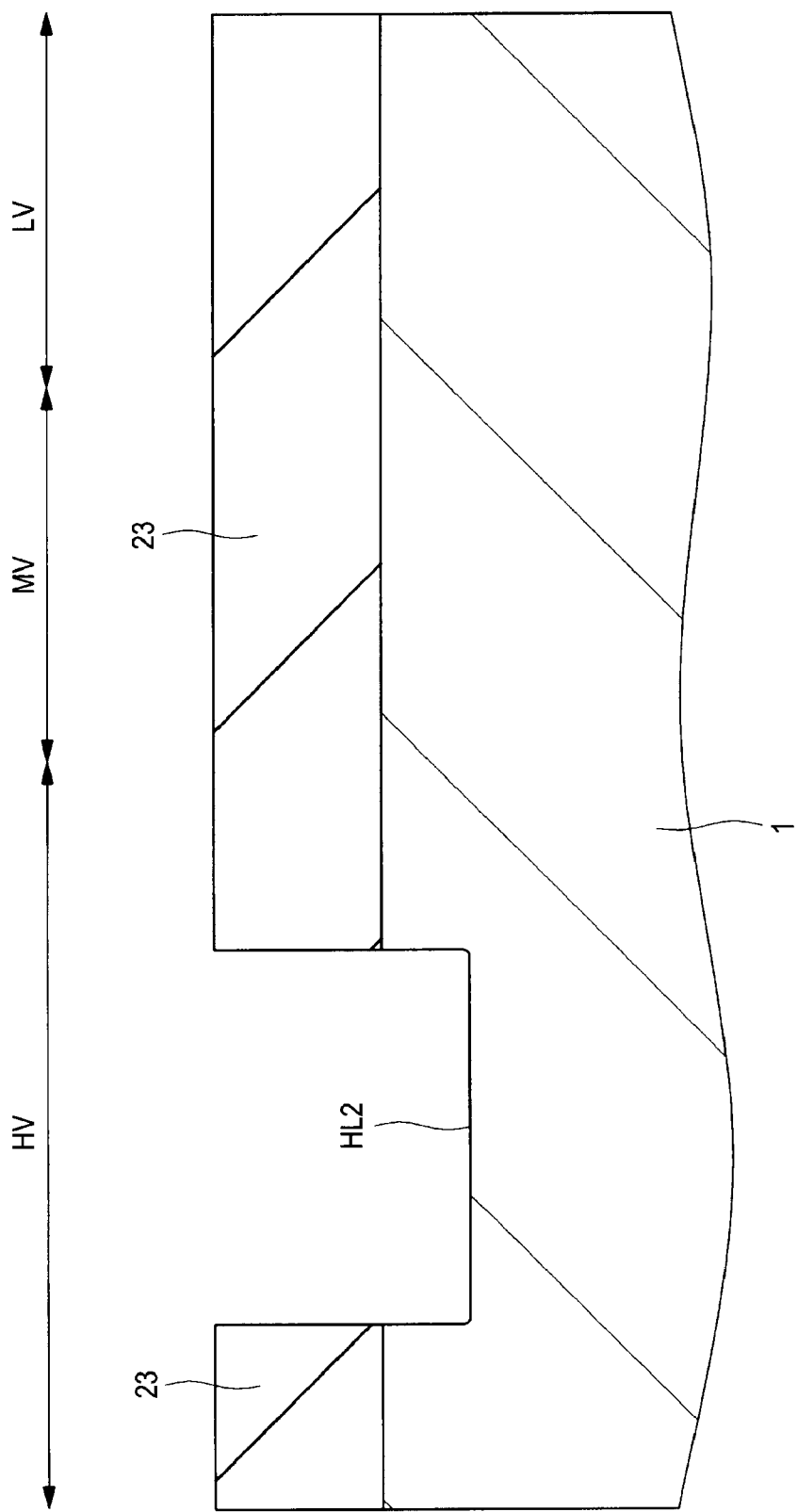
FIG. 31 is a principal-portion cross-sectional view of a semiconductor device of Embodiment 3 of the present invention during a manufacturing process thereof.

First, as shown in FIG. 31, in a portion of the high-breakdown-voltage region HV in the silicon substrate 1, a depressed portion HL2 lower in level than the other region is formed. To form the depressed portion HL2, in the same manner as in the step described above using FIG. 27, dry etching is performed with respect to the silicon substrate 1 using the photoresist film 23 as an etching mask. However, in the manufacturing method of Embodiment 3, the depressed portion HL2 deeper than in Embodiment 2 described above, e.g., lower in level than the surface of the silicon substrate 1 by about 70 to 90 nm is formed.

Figure 32:
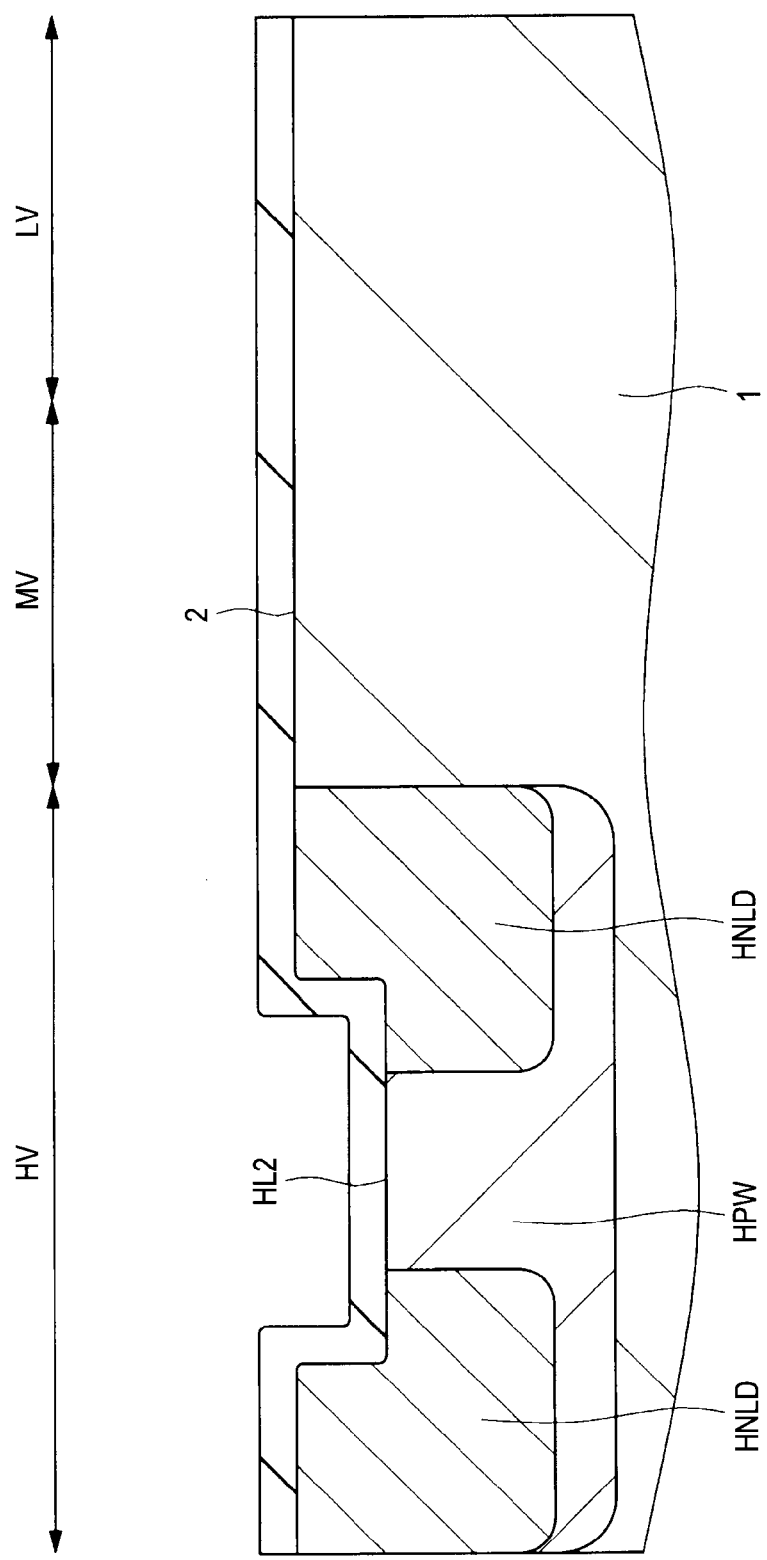
FIG. 32 is a principal-portion cross-sectional view of the semiconductor device during the manufacturing process thereof, which is subsequent to FIG. 31.

Next, as shown in FIG. 32, in the same manner as in the step described above using FIG. 28, the pad oxide film 2, the high-breakdown-voltage p-well region HPW, and the high-breakdown-voltage n-type source/drain regions HNLD are formed successively. In the manufacturing method of Embodiment 3, after ion implantation for forming the high-breakdown-voltage n-type source/drain regions HNLD is performed, the pad oxide film 2 is removed.

Figure 33:
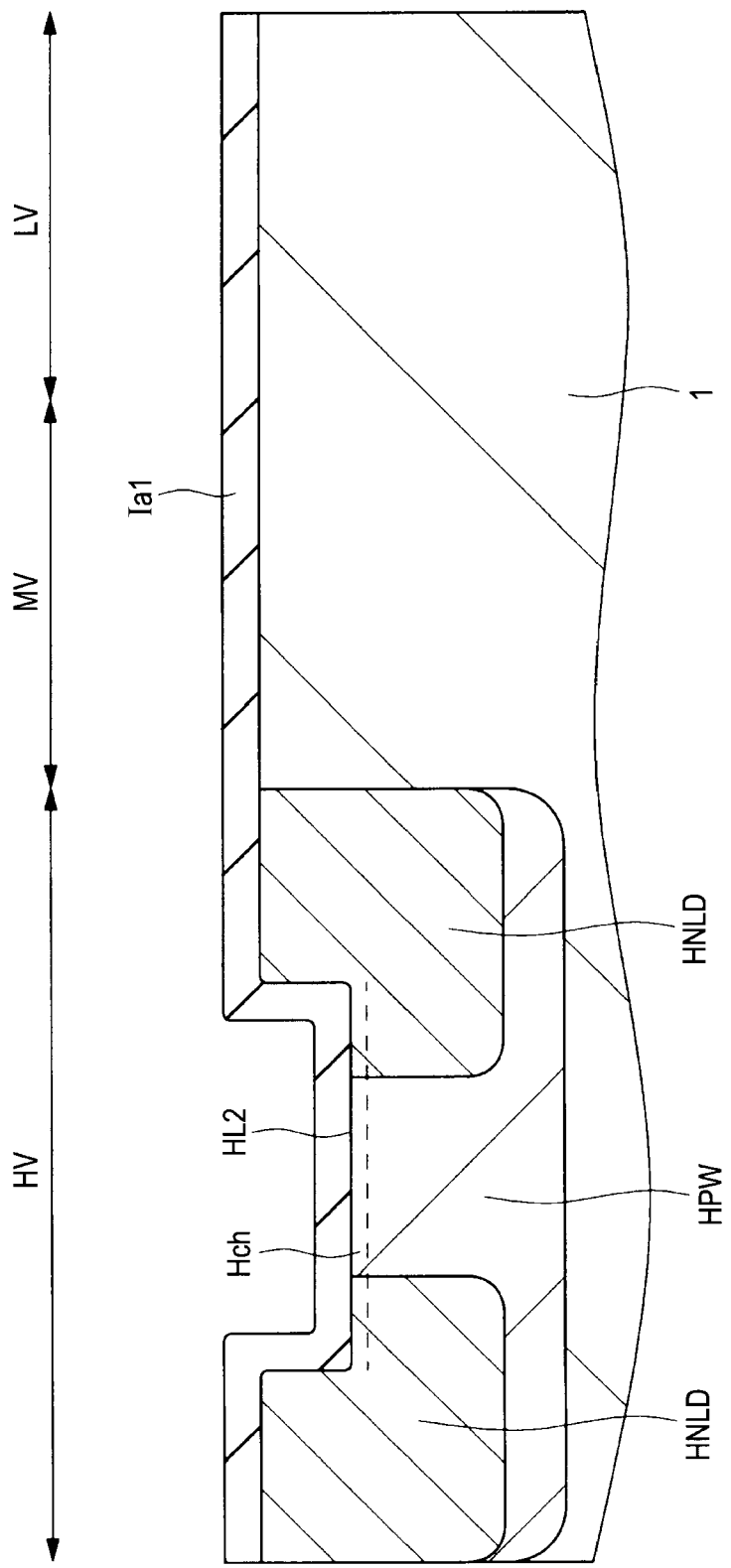
FIG. 33 is a principal-portion cross-sectional view of the semiconductor device during the manufacturing process thereof, which is subsequent to FIG. 32.

Next, as shown in FIG. 33, a first silicon dioxide film Ia1 is formed over the entire surface of the silicon substrate 1 so as to cover at least the bottom of the depressed portion HL2. This involves the formation of the first silicon dioxide film Ia1 made of an insulating film containing silicon dioxide as a main component, and having a thickness of about 10 to 30 nm by a thermal oxidation method. The first silicon dioxide film Ia1 is an insulating film serving as the gate insulating film of the high-breakdown-voltage MIS transistor formed later.

In the subsequent step, the impurity concentration of the region of the silicon substrate 1 located under the first silicon dioxide film Ia1 is adjusted. As described above, since the first silicon dioxide film Ia1 is a member serving as the gate insulating film of the high-breakdown-voltage MIS transistor, the region of the silicon substrate 1 located thereunder is a portion serving as the high-breakdown-voltage channel region Hch. By adjusting the impurity concentration of the high-breakdown-voltage channel region Hch by the present step, it is possible to adjust a characteristic (such as, e.g., threshold voltage) of the high-breakdown-voltage MIS transistor. For the adjustment, ion implantation is performed with respect to the silicon substrate 1 in such a manner as to allow the transmission of ions through the first silicon dioxide film Ia1.

Figure 34:
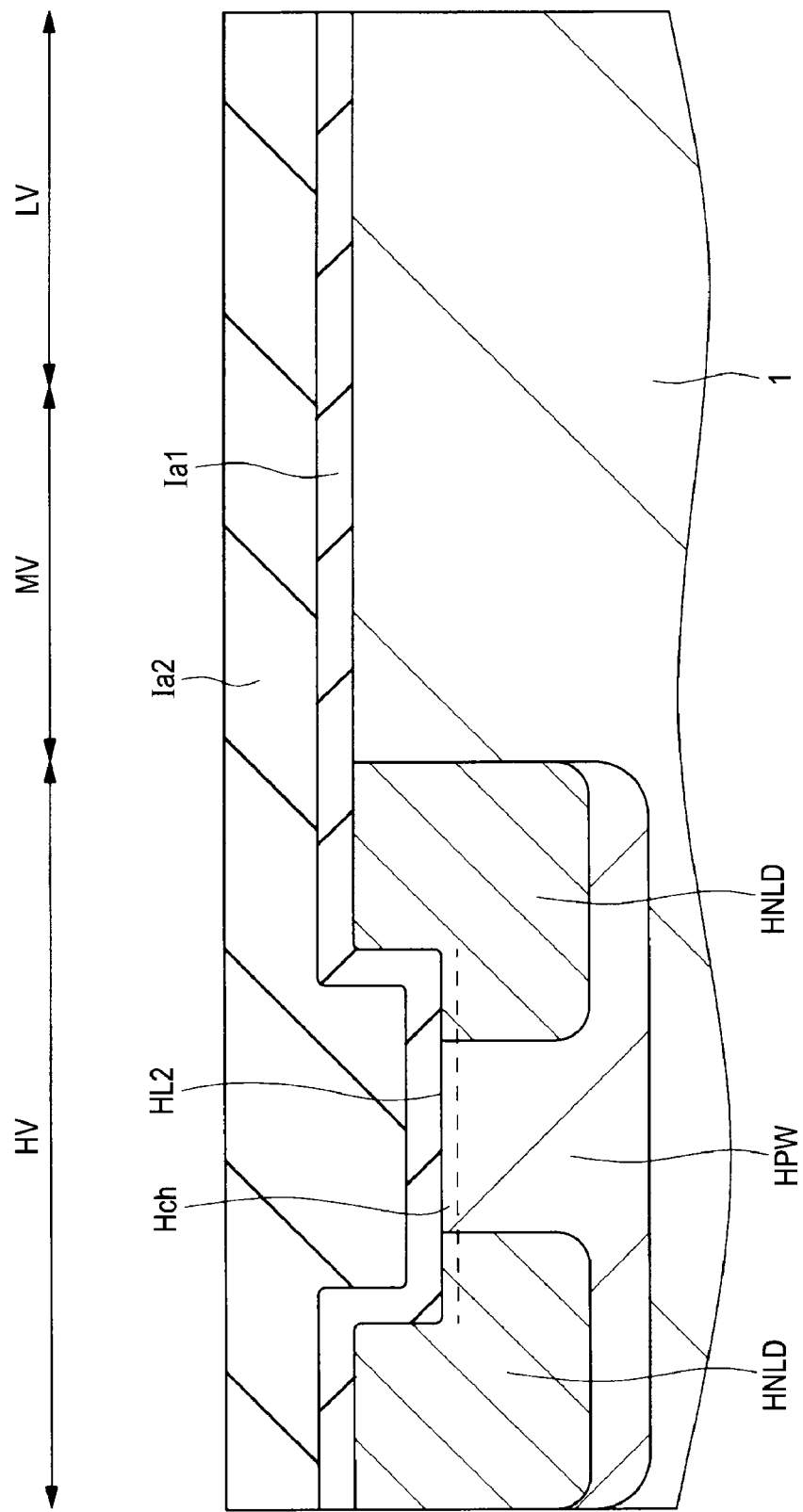
FIG. 34 is a principal-portion cross-sectional view of the semiconductor device during the manufacturing process thereof, which is subsequent to FIG. 33.

Next, as shown in FIG. 34, a second silicon dioxide film Ia2 is formed over the entire surface of the silicon substrate 1 so as to fill at least the depressed portion HL2. To form the second silicon dioxide film Ia2, an insulating film containing silicon dioxide as a main component is deposited to a thickness of about 90 to 100 nm by a CVD method using tetra ethyl ortho silicate (TEOS) as a raw material. In a CVD method using TEOS as a raw material, a silicon dioxide film can be formed at a temperature lower than a temperature at which a silicon dioxide film is formed by a typical thermal oxidation method or the like. However, the silicon dioxide film is formed not in such a manner as to go inside of a silicon substrate, but by being deposited over the silicon substrate.

Figure 35:
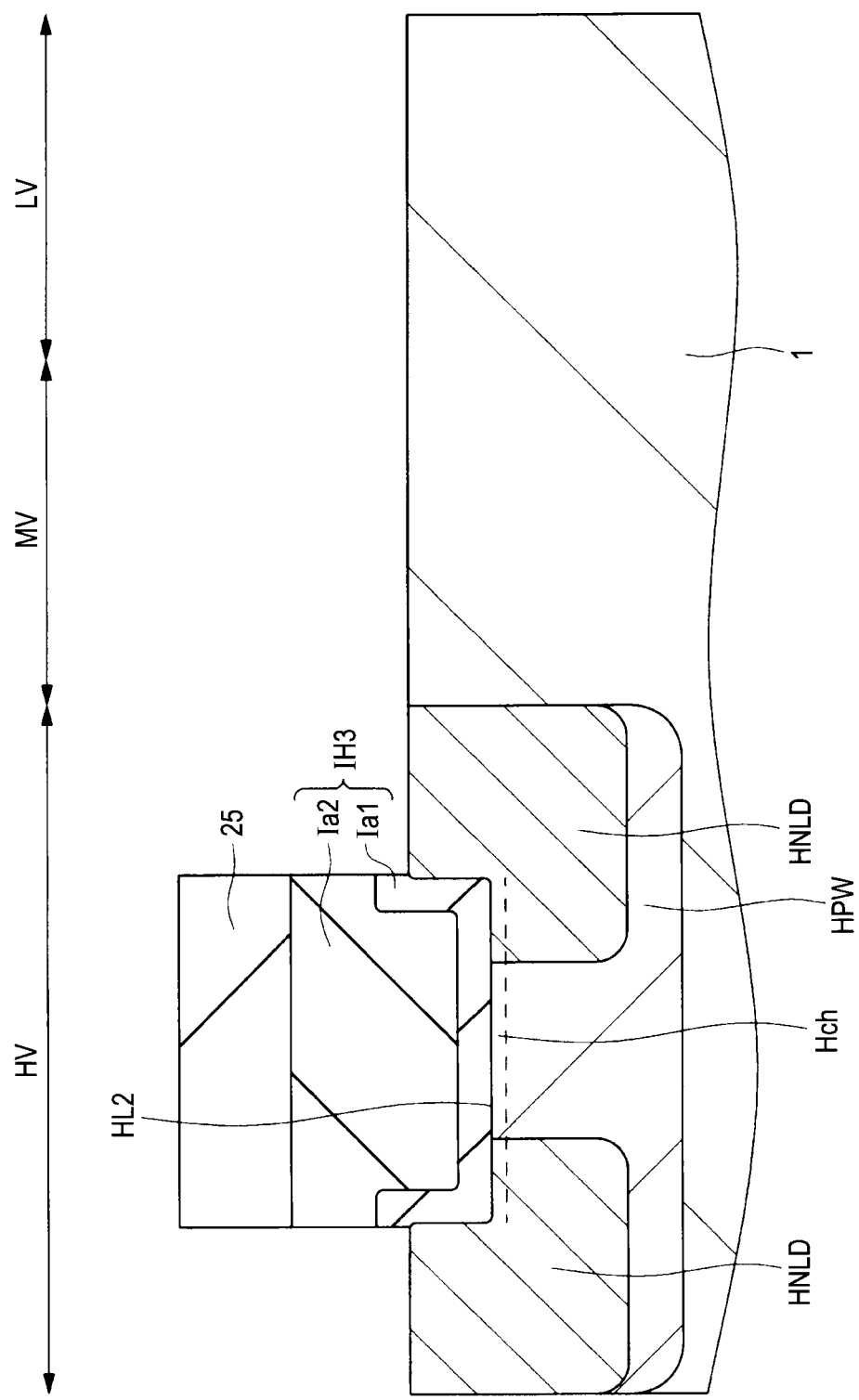
FIG. 35 is a principal-portion cross-sectional view of the semiconductor device during the manufacturing process thereof, which is subsequent to FIG. 34.

Next, as shown in FIG. 35, the second silicon dioxide film Ia2 deposited over a portion of the silicon substrate 1 other than in the depressed portion HL2 is removed. To thus remove the second silicon dioxide film Ia2, using a photoresist film 25 patterned so as to cover the portion of the second silicon dioxide film Ia2 not desired to be removed as an etching mask, etching is performed with respect to the second silicon dioxide film Ia2. Thereafter, the exposed portion of the first silicon dioxide film Ia1 is similarly removed by etching. Since the first silicon dioxide film Ia1 is the same silicon dioxide film as the second silicon dioxide film Ia2, it is unnecessary to vary etching conditions for the both silicon dioxide films. In this manner, a high-breakdown-voltage insulating film IH3 including the first silicon dioxide film Ia1 and the second silicon dioxide film Ia2 is formed.

In the subsequent step, by performing the same steps as the steps including and subsequent to the step described above using FIG. 7 in Embodiment 1 described above, the plurality of MIS transistors having the gate insulating films of different thicknesses which are the same as in the above-mentioned structure shown in FIG. 21 can be formed.

Thus, in the manufacturing method of the semiconductor device of Embodiment 3, the high-breakdown-voltage insulating film IH3 is first formed thick, and the surface thereof is abraded so that the insulating film thinner than the high-breakdown-voltage insulating film IH3 is formed in the other region. In this point, the manufacturing method of the semiconductor device of Embodiment 3 is the same as the manufacturing method of the semiconductor device of Embodiment 1. In terms of operation and effect also, the manufacturing method of the semiconductor device of Embodiment 3 is the same as the manufacturing method of the semiconductor device of Embodiment 1. As a result, it is possible to improve the manufacturing yield of the semiconductor device having the transistors in which the gate insulating films have different thicknesses.

Further, in the manufacturing method of the semiconductor device of Embodiment 3 also, in the same manner as in the manufacturing method of Embodiment 1, the isolation portions are formed after the formation of the gate insulating films by the SA-STI step. In this point also, the same operation and effect as those in the description of Embodiment 1 given above are provided. As a result, it is possible to further improve the manufacturing yield of the semiconductor device having the transistors in which the gate insulating films have different thicknesses.

Moreover, in the manufacturing method of the semiconductor device of Embodiment 3, the high-breakdown-voltage insulating film IH3 is formed in the depressed portion HL2 lower in level than the other region. By thus forming the high-breakdown-voltage insulating film IH3, the high-breakdown-voltage insulating film IH3 which should be formed first can be formed thinner than in the case where the depressed portion HL2 is not provided. In this point, the manufacturing method of Embodiment 3 is the same as the manufacturing method of Embodiment 2. In terms of operation and effect also, the manufacturing method of Embodiment 3 is the same as the manufacturing method of Embodiment 2. As a result, it is possible to further improve the manufacturing yield of the semiconductor device having the transistors in which the gate insulating films have different thicknesses.

In the manufacturing method of Embodiment 3, as the high-breakdown-voltage insulating film IH3 to be formed in the depressed portion HL2, a two-layer structure of the first silicon dioxide film Ia1 and the second silicon dioxide film Ia2 is formed. As a result, after the first silicon dioxide film Ia1 in the first layer is formed and before the second silicon dioxide film Ia2 in the second layer is formed, it is possible to perform concentration modulation with respect to the high-breakdown-voltage channel region Hch. Ion implantation for the concentration modulation is performed in such a manner as to allow the transmission of ions through the first silicon dioxide film Ia1. According to the manufacturing method of Embodiment 3, since the high-breakdown-voltage insulating film IH3 is thus formed in the two separate layers as described above, it is possible to reduce the thickness of the first silicon dioxide film Ia1 in the first layer through which ions should be transmitted (the thickness is about 10 to 30 nm in the foregoing example). This allows the ion implantation for modulating the concentration of the high-breakdown-voltage channel region Hch to be performed with a low energy, and can improve controllability and reliability. As a result, it is possible to further improve the manufacturing yield of the semiconductor device having the transistors in which the gate insulating films have different thicknesses. In other words, the manufacturing method of the semiconductor device having the steps of forming the gate insulating films, and then performing the ion implantation in such a manner as to allow the transmission of ions through the insulating films is also more effective when the technology of the present invention is applied thereto.

In the manufacturing method of Embodiment 3, the second silicon dioxide film Ia2 in the second layer forming the high-breakdown-voltage insulating film IH3 is formed by the CVD method using TEOS as a raw material, and having a low growth temperature. As a result, it is possible to prevent wide-range diffusion of an impurity implanted for modulating the concentration of the high-breakdown-voltage channel region Hch. This is also a factor which provides the effect of allowing the first silicon dioxide film Ia1 to be formed thin. That is, since CVD using TEOS does not involve an excessive temperature rise when the second silicon dioxide film Ia2 is formed, the second silicon dioxide film Ia2 can be formed thick, i.e., the first silicon dioxide film Ia1 can be formed thin. Consequently, as the first silicon dioxide film Ia1 is thinner, the controllability and reliability of ion implantation which is performed through the first silicon dioxide film Ia1 can be further improved. Thus, in the manufacturing method of Embodiment 3, the formation of the high-breakdown-voltage insulating film IH3 in the two-layer structure, and the formation of the second silicon dioxide film Ia2 in the second layer by the TEOS-CVD method provide a mutually synergetic effect, which is more effective. As a result, it is possible to further improve the manufacturing yield of the semiconductor device having the transistors in which the gate insulating films have different thicknesses.

The reason that the same effect obtained in Embodiment 1 described above is not lost even when the second silicon dioxide film Ia2 is formed by the CVD method which does not form a silicon dioxide film inside the silicon substrate 1 as described above lies in the formation of the high-breakdown-voltage insulating film IH3 in the depressed portion HL2 of the silicon substrate 1. That is, a silicon dioxide film formed by a CVD method is normally deposited over the surface of a substrate, and is not formed in the surface. However, in the manufacturing method of Embodiment 3, the depressed portion HL2 is formed, and then the first and second silicon dioxide films Ia1 and Ia2 are formed. Therefore, the highbreakdown-voltage insulating film IH3 can be formed so as to extend from an inside of the main surface of the silicon substrate 1 to an outside thereof. Since this allows the formation of the high-breakdown-voltage insulating film IH3 which finally has a desired thickness through the abrasion of the surface side, even when the insulating films of different thicknesses are formed, it is possible to provide the substrate surface with a small elevation difference.

Embodiment 4

A manufacturing method of a semiconductor device of Embodiment 4 of the present invention will be described. In the manufacturing method of Embodiment 4 also, in the same manner as in Embodiments 1 to 3 described above, the high-breakdown-voltage MIS transistor QH, the middle-breakdown-voltage MIS transistor QM, and the low-breakdown-voltage MIS transistor QL which have the gate insulating films of different thicknesses are formed respectively in the high-breakdown-voltage region HV, the middle-breakdown-voltage region MV, and the low-breakdown-voltage region LV in the silicon substrate 1.

Figure 36:
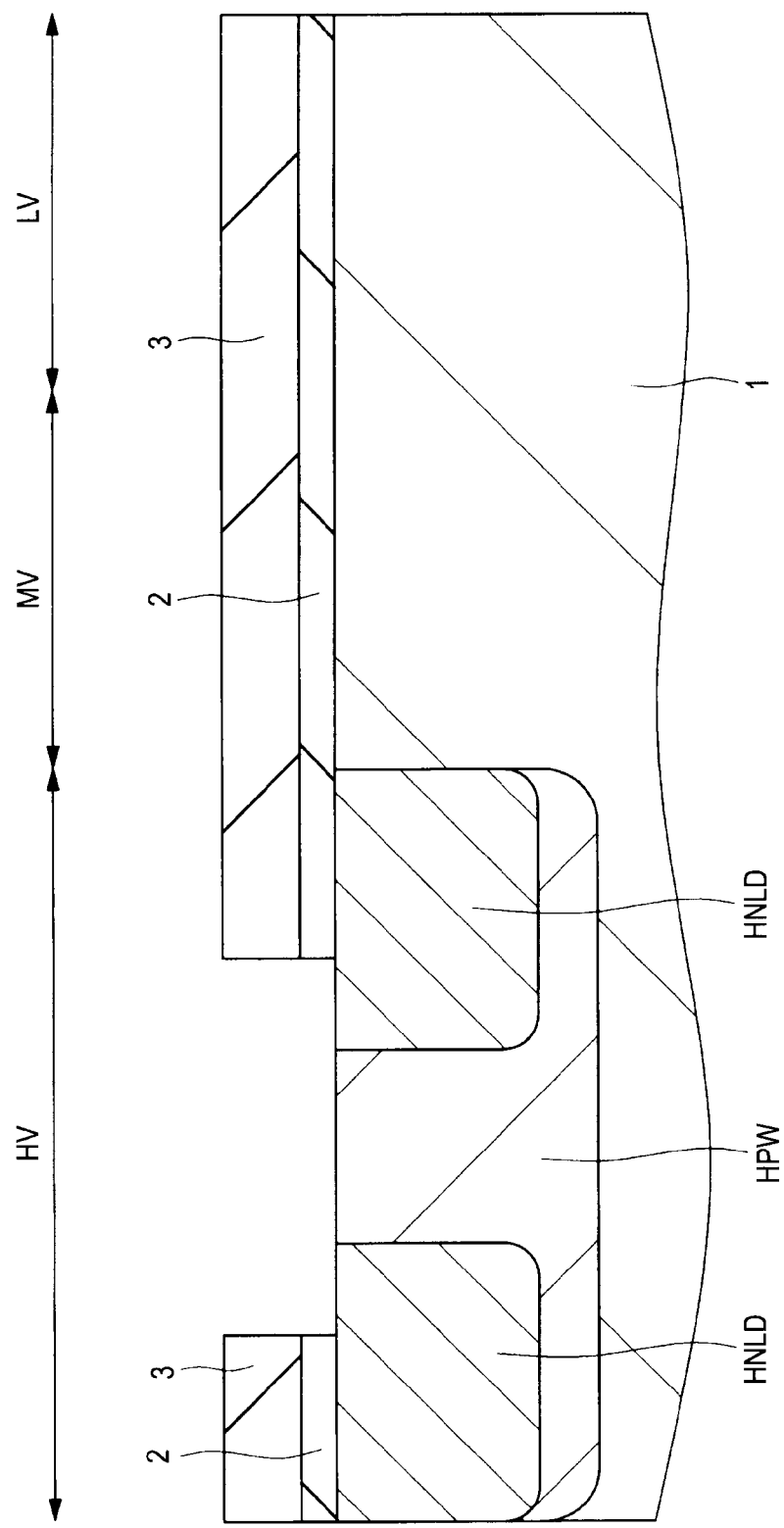
FIG. 36 is a principal-portion cross-sectional view of a semiconductor device of Embodiment 4 of the present invention during a manufacturing process thereof.

First, as shown in FIG. 36, in the same manner as in the method described above using FIGS. 1 to 4, the pad oxide film 2, the high-breakdown-voltage p-well region HPW, the high-breakdown-voltage n-type source/drain regions HNLD, and the protective nitride film 3 are formed, and the protective nitride film 3 and the pad oxide film 2 are patterned. Here, the patterning of the protective nitride film 3 and the pad oxide film 2 is performed so as to open a region where a high-breakdown-voltage insulating film as the gate insulating film of the high-breakdown-voltage MIS transistor is formed in a subsequent step.

Figure 37:
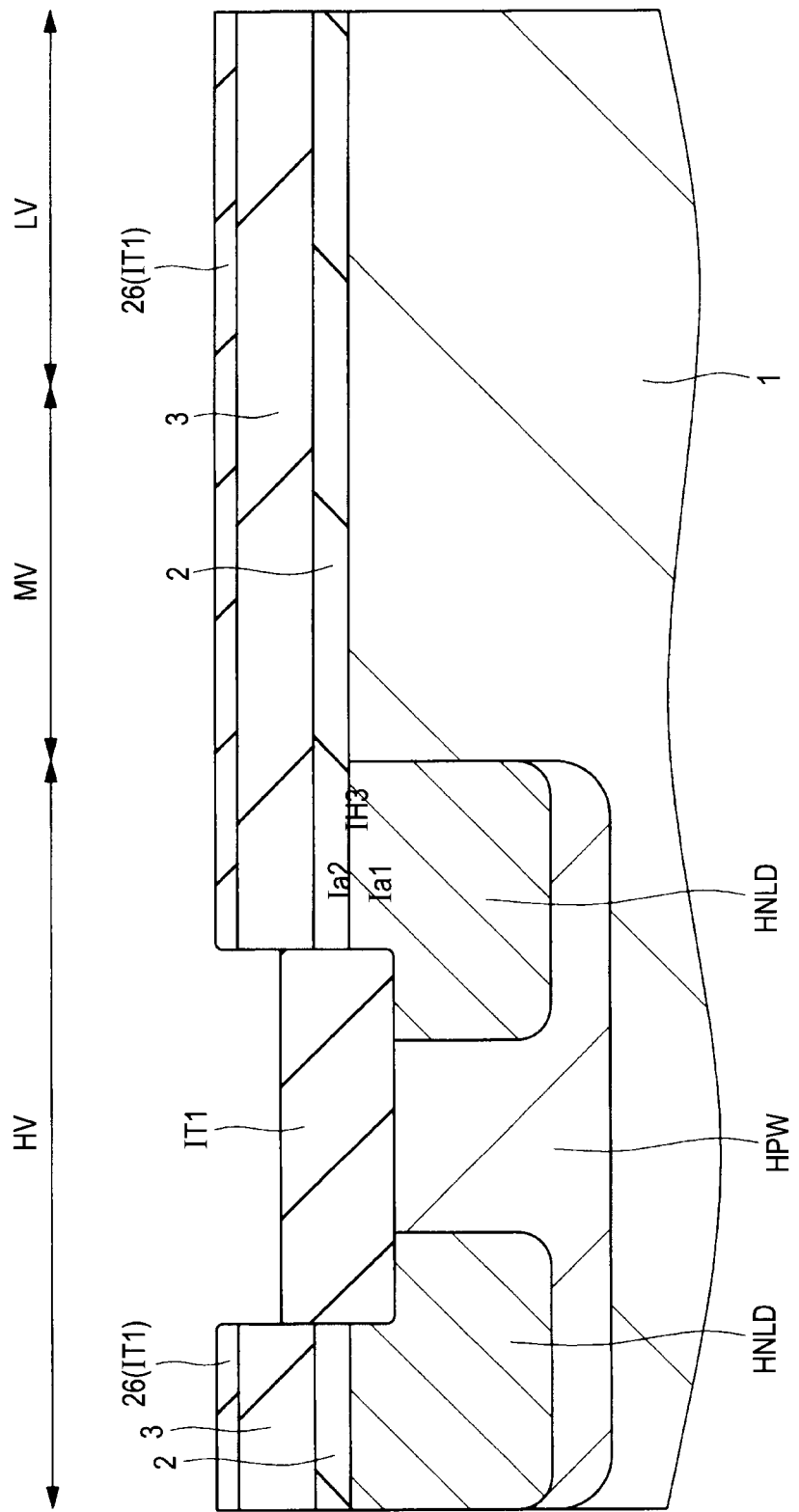
FIG. 37 is a principal-portion cross-sectional view of the semiconductor device during the manufacturing process thereof, which is subsequent to FIG. 36.

Next, as shown in FIG. 37, a thermally oxidized silicon film IT1 is formed in the portion of the silicon substrate 1 exposed in the openings of the protective nitride film 3 and the pad oxide film 2. Here, the thermally oxidized silicon film IT1 is formed by a thermal oxidation method as an insulating film containing silicon dioxide as a main component, and having a thickness of about 60 to 80 nm so as to extend from the inside of the main surface of the silicon substrate 1 to the outside thereof. At this time, the surface of the protective nitride film 3 is also slightly oxidized to form a silicon dioxide film 26.

Figure 38:
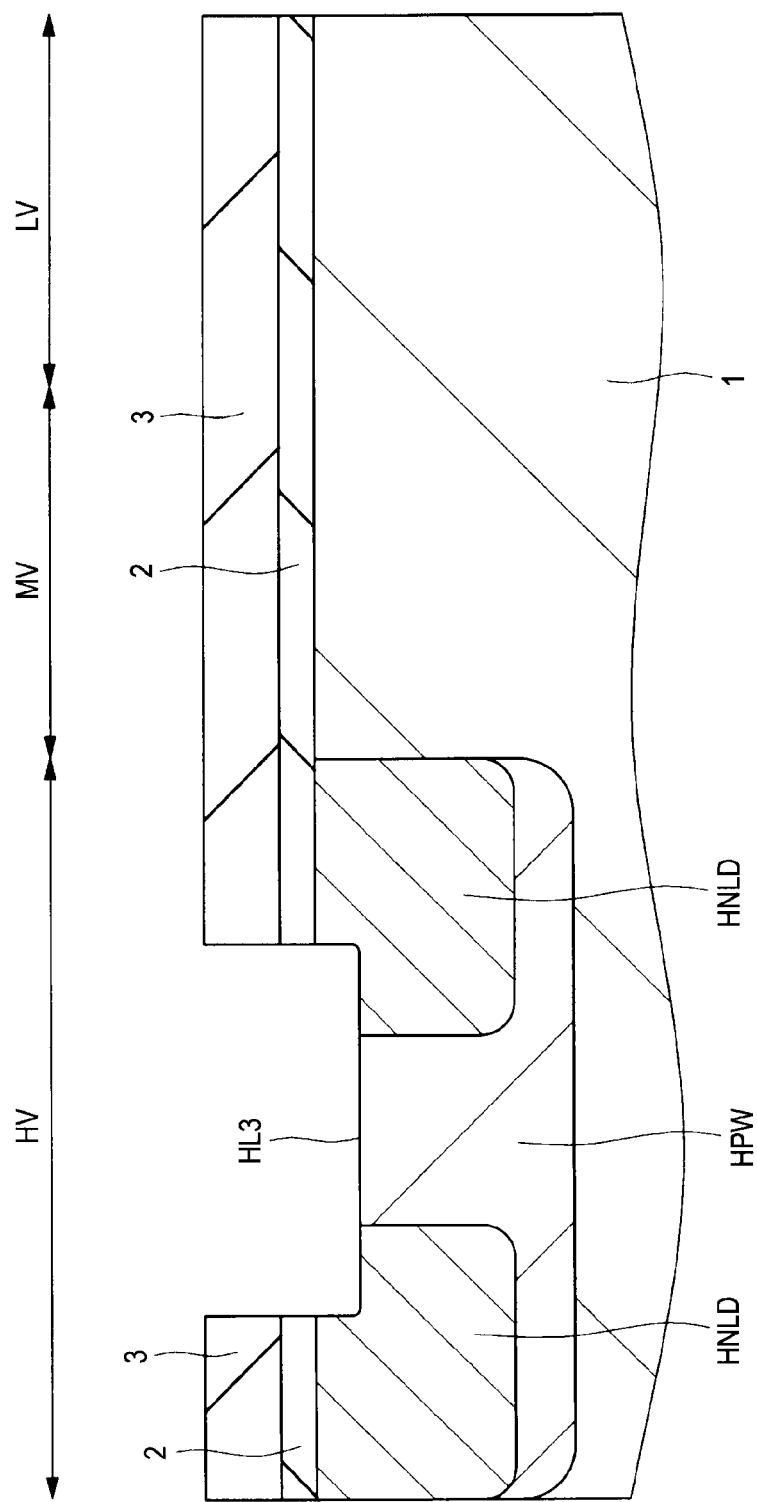
FIG. 38 is a principal-portion cross-sectional view of the semiconductor device during the manufacturing process thereof, which is subsequent to FIG. 37.

In the subsequent step, the thermally oxidized silicon film IT1 is removed to provide the structure shown in FIG. 38. That is, in the region of the silicon substrate 1 where the thermally oxidized silicon film IT1 is formed, by removing the thermally oxidized silicon film IT1, a depressed portion HL3 lower in level than the other region is formed. Here, the thermally oxidized silicon film IT1 is removed by wet etching. When the thermally oxidized silicon film IT1 having a thickness of about 60 to 80 nm is thus formed, thermal oxidation proceeds in such a manner as to go inside of the main surface of the silicon substrate 1 by a distance of 30 to 40 nm. Accordingly, the depth of the depressed portion HL3 after the thermally oxidized silicon film IT1 is removed is about 30 to 40 nm.

Figure 39:
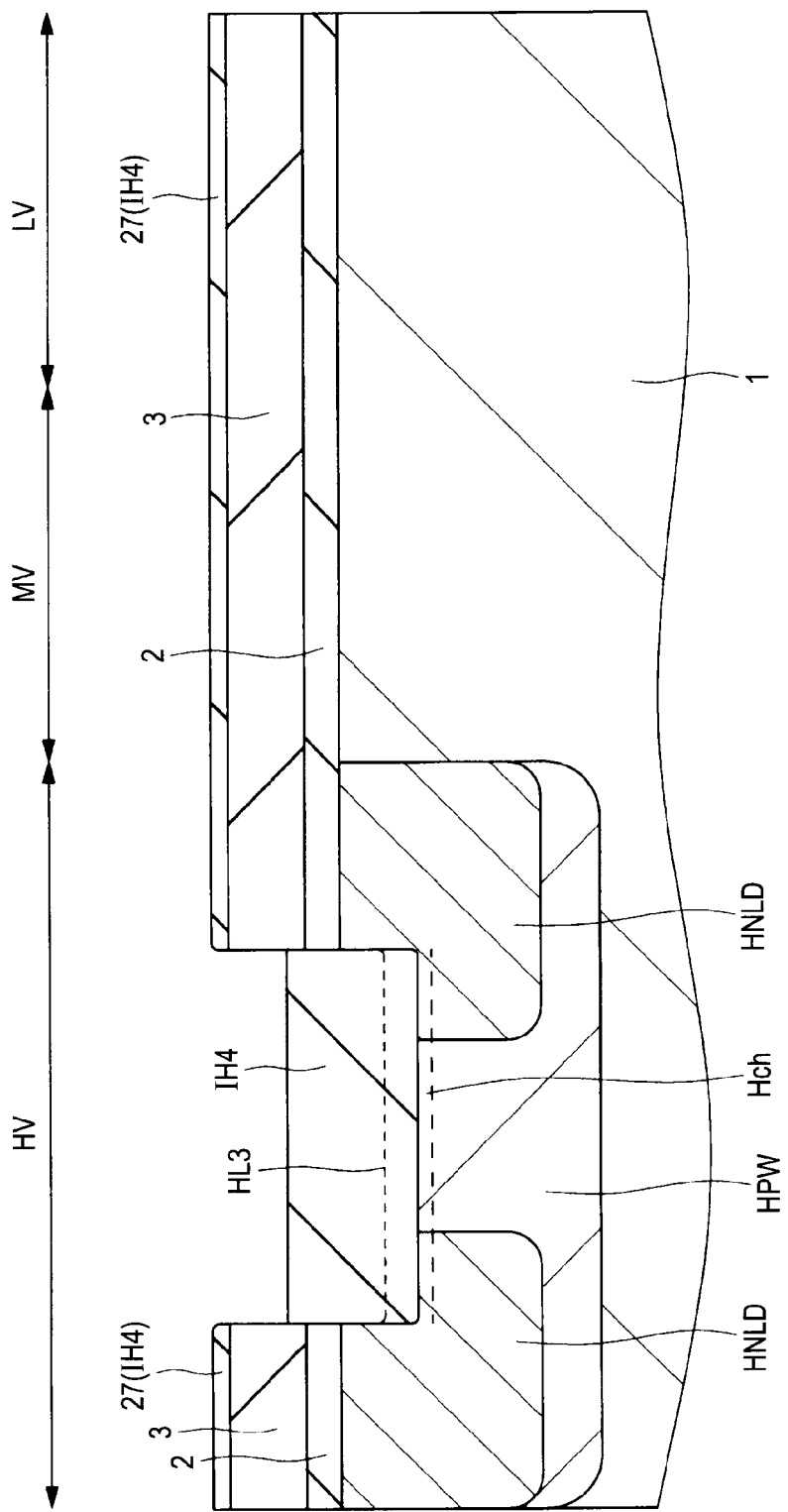
FIG. 39 is a principal-portion cross-sectional view of the semiconductor device during the manufacturing process thereof, which is subsequent to FIG. 38.

Next, as shown in FIG. 39, by performing the same step as in the thermal oxidation method described above using FIG. 29, a high-breakdown-voltage insulating film IH4 is formed in the depressed portion HL3 of the silicon substrate 1. Here, the high-breakdown-voltage insulating film IH4 made of an insulating film containing silicon dioxide as a main component, and having a thickness of about 105 nm is formed. At this time, the surface of the protective nitride film 3 is also slightly oxidized to form a silicon dioxide film 27. Subsequently, by performing the same step as in the ion implantation method described above using FIG. 29, the impurity concentration of the high-breakdown-voltage channel region Hch under the high-breakdown-voltage insulating film IH4 is adjusted.

In the subsequent step, by performing the same step as the steps including and subsequent to the step described above using FIG. 30 in Embodiment 2 described above, the plurality of MIS transistors having the gate insulating films of different thicknesses which are the same as in the above-mentioned structure shown in FIG. 21 can be formed.

Thus, in the manufacturing method of the semiconductor device of Embodiment 4, the high-breakdown-voltage insulating film IH4 is first formed thick, and the surface thereof is abraded so that the insulating film thinner than the high-breakdown-voltage insulating film IH4 is formed in the other region. In this point, the manufacturing method of the semiconductor device of Embodiment 4 is the same as the manufacturing method of the semiconductor device of Embodiment 1. In terms of operation and effect also, the manufacturing method of the semiconductor device of Embodiment 4 is the same as the manufacturing method of the semiconductor device of Embodiment 1. As a result, it is possible to improve the manufacturing yield of the semiconductor device having the transistors in which the gate insulating films have different thicknesses.

Further, in the manufacturing method of the semiconductor device of Embodiment 4 also, in the same manner as in the manufacturing method of Embodiment 1, the isolation portions are formed after the formation of the gate insulating films by the SA-STI step. In this point also, the same operation and effect as those in the description of Embodiment 1 given above are provided. As a result, it is possible to further improve the manufacturing yield of the semiconductor device having the transistors in which the gate insulating films have different thicknesses.

Moreover, in the manufacturing method of the semiconductor device of Embodiment 4, the high-breakdown-voltage insulating film IH4 is formed in the depressed portion HL3 lower in level than the other region. By thus forming the high-breakdown-voltage insulating film IH4, the high-breakdown-voltage insulating film IH4 which should be formed first can be formed thinner than in the case where the depressed portion HL3 is not provided. In this point, the manufacturing method of Embodiment 4 is the same as the manufacturing method of Embodiment 2. In terms of operation and effect also, the manufacturing method of Embodiment 4 is the same as the manufacturing method of Embodiment 2. As a result, it is possible to further improve the manufacturing yield of the semiconductor device having the transistors in which the gate insulating films have different thicknesses. Besides, the manufacturing method of Embodiment 4 is also the same as the manufacturing method of Embodiment 2 described above in the effect obtained by thinning the high-breakdown-voltage insulating film IH4 formed in the depressed portion HL3, and then performing the ion implantation for modulating the concentration of the high-breakdown-voltage channel region Hch and the like.

Furthermore, in the manufacturing method of the semiconductor device of Embodiment 4, the depressed portion HL3 is formed by a technique which removes, by wet etching, the thermally oxidized silicon film IT1 formed also inside the silicon substrate 1 by thermal oxidation. In the case of aiming at the formation of the depressed portion HL3 by this technique, it is possible to give a higher quality to the gate insulating film of the high-breakdown-voltage MIS transistor QH than in the case of forming the depressed portions HL1 and HL2 by dry etching as in Embodiment 2 or 3 described above. This is because the surface of the depressed portion HL3 formed by wet etching, not by dry etching, is less likely to incur damage resulting from a plasma or the like. By forming the high-breakdown-voltage insulating film IH4 over a portion with less damage, a higher quality can be given to the gate insulating film of the high-breakdown-voltage MIS transistor QH. As a result, it is possible to further improve the manufacturing yield of the semiconductor device having the transistors in which the gate insulating films have different thicknesses.

Embodiment 5

A manufacturing method of a semiconductor device of Embodiment 5 of the present invention will be described. In the manufacturing method of Embodiment 5 also, in the same manner as in Embodiments 1 to 4 described above, the high-breakdown-voltage MIS transistor QH, the middle-breakdown-voltage MIS transistor QM, and the low-breakdown-voltage MIS transistor QL which have the gate insulating films of different thicknesses are formed respectively in the high-breakdown-voltage region HV, the middle-breakdown-voltage region MV, and the low-breakdown-voltage region LV in the silicon substrate 1.

Figure 40:
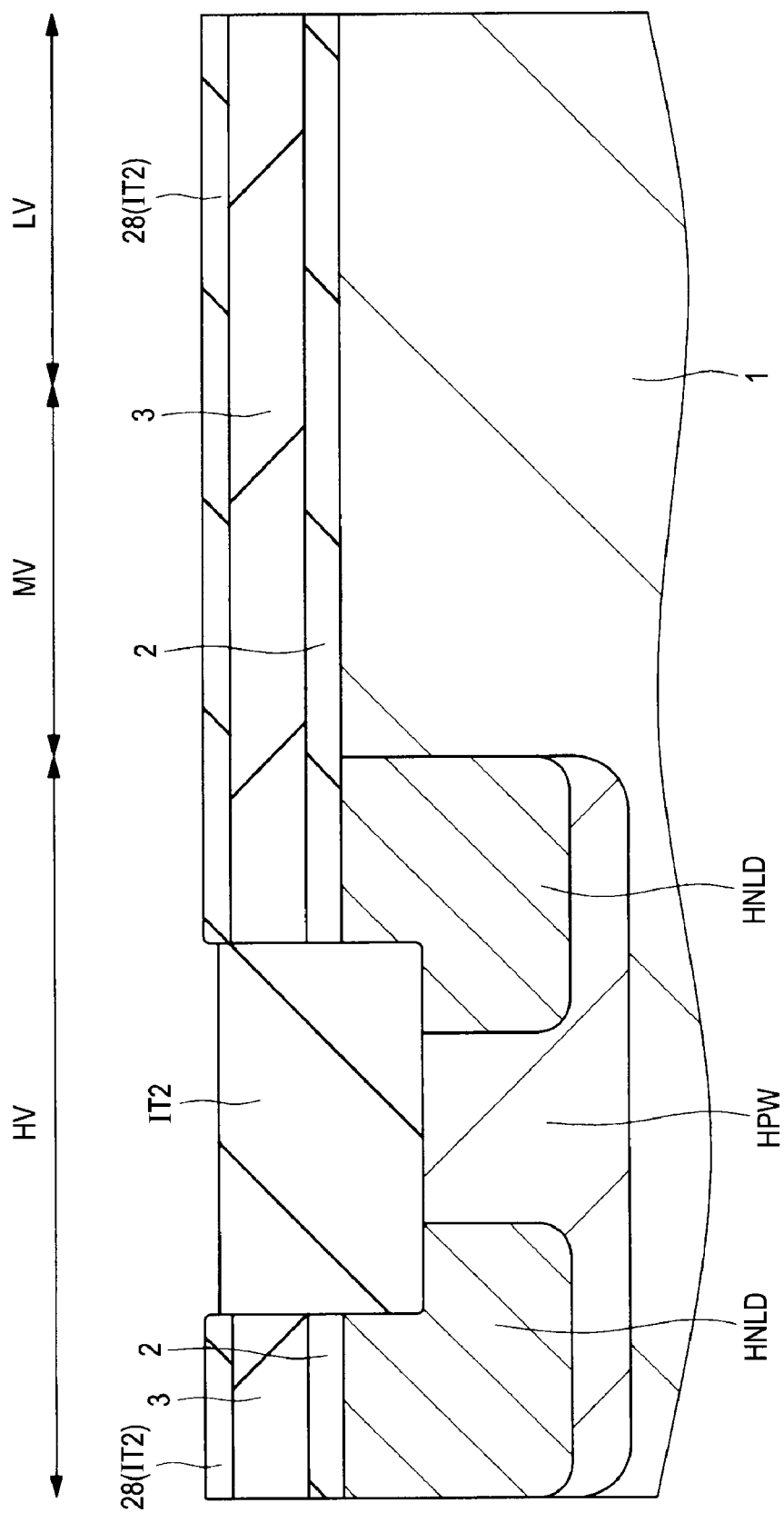
FIG. 40 is a principal-portion cross-sectional view of the semiconductor device of Embodiment 3 of the present invention during the manufacturing process thereof.

First, as shown in FIG. 40, in the same manner as in the method described above using FIGS. 1 to 4, the pad oxide film 2, the high-breakdown-voltage p-well region HPW, the high-breakdown-voltage n-type source/drain regions HNLD, and the protective nitride film 3 are formed, and the protective nitride film 3 and the pad oxide film 2 are patterned. Here, the patterning of the protective nitride film 3 and the pad oxide film 2 is performed so as to open a region where a high-breakdown-voltage insulating film as the gate insulating film of the high-breakdown-voltage MIS transistor is formed in a subsequent step.

Subsequently, a thermally oxidized silicon film IT2 is formed in the portion of the silicon substrate 1 exposed in the openings of the protective nitride film 3 and the pad oxide film 2. Here, the thermally oxidized silicon film IT2 is formed by a thermal oxidation method as an insulating film containing silicon dioxide as a main component, and having a thickness of about 160 nm so as to extend from the inside of the main surface of the silicon substrate 1 to the outside thereof. At this time, the surface of the protective nitride film 3 is also slightly oxidized to form a silicon dioxide film 28.

Figure 41:
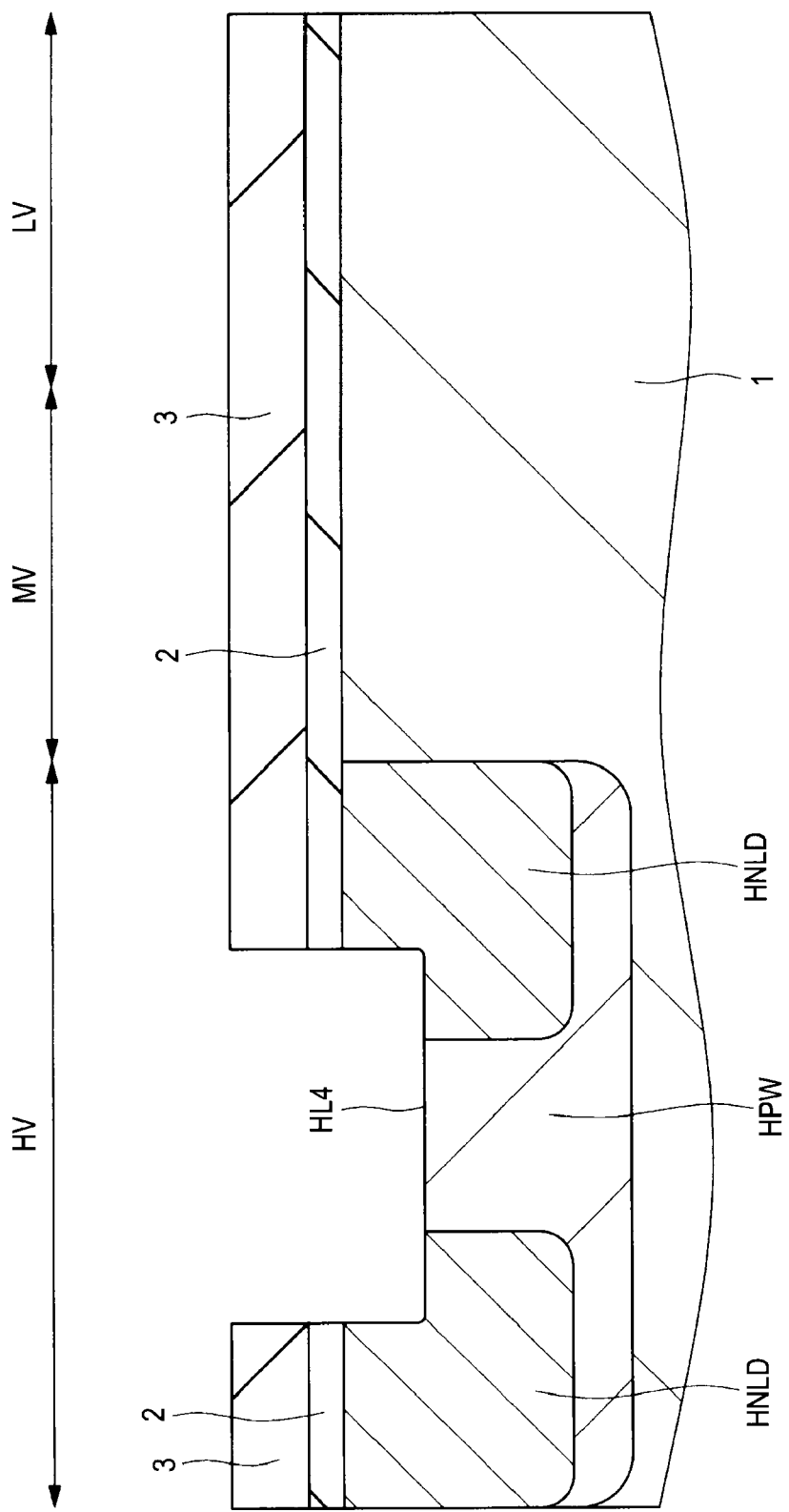
FIG. 41 is a principal-portion cross-sectional view of the semiconductor device during the manufacturing process thereof, which is subsequent to FIG. 40.

In the subsequent step, the thermally oxidized silicon film IT2 is removed to provide the structure shown in FIG. 41. That is, in the region of the silicon substrate 1 where the thermally oxidized silicon film IT2 is formed, by removing the thermally oxidized silicon film IT2, a depressed portion HL4 lower in level than the other region is formed. Here, the thermally oxidized silicon film IT2 is removed by wet etching. When the thermally oxidized silicon film IT2 having a thickness of about 160 to 200 nm is thus formed, thermal oxidation proceeds in such a manner as to go inside of the main surface of the silicon substrate 1 by a distance of 70 to 90 nm. Accordingly, the depth of the depressed portion HL4 after the thermally oxidized silicon film IT2 is removed is about 70 to 90 nm.

The foregoing steps are the same as the steps of forming the thermally oxidized silicon film IT1 and the depressed portion HL3 in Embodiment 4 described above except for the thickness of the thermally oxidized silicon film IT2 and the depth of the depressed portion HL4.

Figure 42:
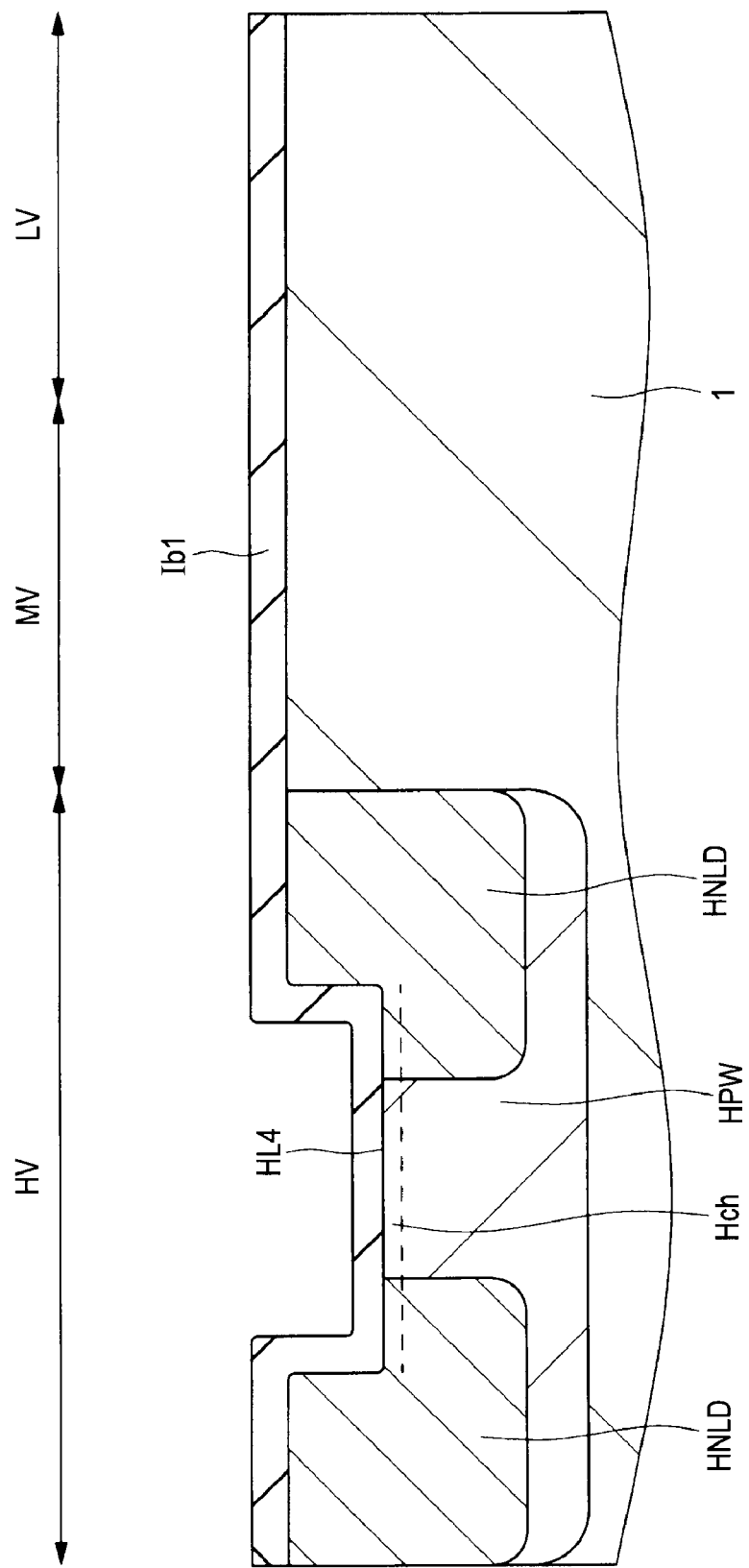
FIG. 42 is a principal-portion cross-sectional view of the semiconductor device during the manufacturing process thereof, which is subsequent to FIG. 41.

Next, as shown in FIG. 42, a first silicon dioxide film Ib1 is formed over the entire surface of the silicon substrate 1 so as to cover at least the bottom of the depressed portion HL4. This involves the formation of the first silicon dioxide film Ib1 made of an insulating film containing silicon dioxide as a main component, and having a thickness of about 10 to 30 nm by a thermal oxidation method. The first silicon dioxide film Ib1 is an insulating film serving as the gate insulating film of a high-breakdown-voltage MIS transistor formed later.

In the subsequent step, the impurity concentration of the region of the silicon substrate 1 located under the first silicon dioxide film Ib1 is adjusted. As described above, since the first silicon dioxide film Ib1 is a member serving as the gate insulating film of the high-breakdown-voltage MIS transistor, the region of the silicon substrate 1 located thereunder is a portion serving as the high-breakdown-voltage channel region Hch. By adjusting the impurity concentration of the high-breakdown-voltage channel region Hch by the present step, it is possible to adjust a characteristic (such as, e.g., threshold voltage) of the high-breakdown-voltage MIS transistor. For the adjustment, ion implantation is performed with respect to the silicon substrate 1 in such a manner as to allow the transmission of ions through the first silicon dioxide film Ib1.

Figure 43:
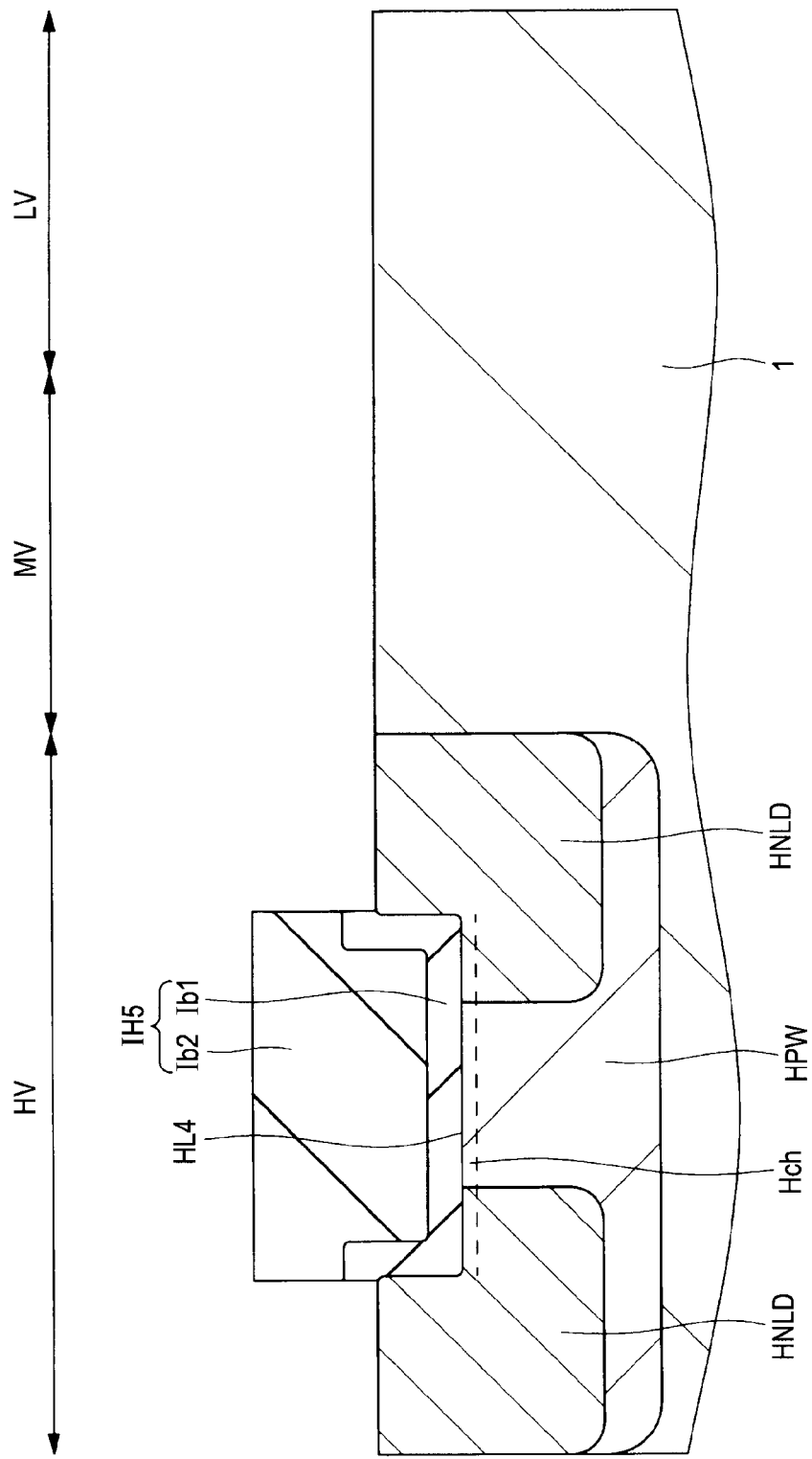
FIG. 43 is a principal-portion cross-sectional view of the semiconductor device during the manufacturing process thereof, which is subsequent to FIG. 42.

Next, as shown in FIG. 43, a second silicon dioxide film Ib2 is formed over the entire surface of the silicon substrate 1 so as to fill at least the depressed portion HL4. To form the second silicon dioxide film Ib2, an insulating film containing silicon dioxide as a main component is deposited to a thickness of about 90 to 110 nm by a CVD method using tetra ethyl ortho silicate (TEOS) as a raw material. In a CVD method using TEOS as a raw material, a silicon dioxide film can be formed at a temperature lower than a temperature at which a silicon dioxide film is formed by a typical thermal oxidation method or the like. However, the silicon dioxide film is formed not in such a manner as to go inside a silicon substrate, but by being deposited over the silicon substrate.

Subsequently, the second silicon dioxide film Ib2 deposited over a portion of the silicon substrate 1 other than in the depressed portion HL4 is removed. To thus remove the second silicon dioxide film Ib2, etching is performed with respect to the second silicon dioxide film Ib2 using a photoresist film (not shown) patterned so as to cover the portion of the second silicon dioxide film Ib2 not desired to be removed. Thereafter, the exposed portion of the first silicon dioxide film Ib1 is similarly removed by etching. Since the first silicon dioxide film Ib1 is the same silicon dioxide film as the second silicon dioxide film 1b2, it is unnecessary to vary etching conditions for the both silicon dioxide films. In this manner, a high-breakdown-voltage insulating film IH5 including the first silicon dioxide film Ib1 and the second silicon dioxide film Ib2 is formed.

The foregoing step of forming the high-breakdown-voltage insulating film IH5 including the first and second silicon dioxide films Ib1 and Ib2 in Embodiment 5 is the same as the step of forming the high-breakdown-voltage insulating film IH3 including the first and second silicon dioxide films Ia1 and Ia2 in Embodiment 3 described above.

In the subsequent step, by performing the same steps as the steps including and subsequent to the step described above using FIG. 7 in Embodiment 1 described above, the plurality of MIS transistors having the gate insulating films of different thicknesses which are the same as in the above-mentioned structure shown in FIG. 21 can be formed.

Thus, in the manufacturing method of the semiconductor device of Embodiment 5, the high-breakdown-voltage insulating film IH5 is first formed thick, and the surface thereof is abraded so that the insulating film thinner than the high-breakdown-voltage insulating film IH5 is formed in the other region. In this point, the manufacturing method of the semiconductor device of Embodiment 5 is the same as the manufacturing method of the semiconductor device of Embodiment 1. In terms of operation and effect also, the manufacturing method of the semiconductor device of Embodiment 5 is the same as the manufacturing method of the semiconductor device of Embodiment 1. As a result, it is possible to improve the manufacturing yield of the semiconductor device having the transistors in which the gate insulating films have different thicknesses.

Further, in the manufacturing method of the semiconductor device of Embodiment 5 also, in the same manner as in the manufacturing method of Embodiment 1, the isolation portions are formed after the formation of the gate insulating films by the SA-STI step. In this point also, the same operation and effect as those in the description of Embodiment 1 given above are provided. As a result, it is possible to further improve the manufacturing yield of the semiconductor device having the transistors in which the gate insulating films have different thicknesses.

Moreover, in the manufacturing method of the semiconductor device of Embodiment 5 also, in the same manner as in the manufacturing method of Embodiment 3 described above, the high-breakdown-voltage insulating film IH5 is formed in the two separate layers of the first silicon dioxide film Ib1 and the second silicon dioxide film Ib2. This structure provides the same operation and effect as those described above in Embodiment 3. As a result, it is possible to further improve the manufacturing yield of the semiconductor device having the transistors in which the gate insulating films have different thicknesses.

Furthermore, in the manufacturing method of the semiconductor device of Embodiment 5 also, in the same manner as in the manufacturing method of Embodiment 4, the depressed portion HL4 is formed in the silicon substrate 1 by removing the thermally oxidized silicon film IT2. This structure provides the same operation and effect as those described above in Embodiment 4. As a result, it is possible to further improve the manufacturing yield of the semiconductor device having the transistors in which the gate insulating films have different thicknesses.

While the invention achieved by the present inventors has been specifically described heretofore based on the embodiments thereof, the present invention is not limited thereto. It will be easily appreciated that various modification and changes can be made in the invention without departing from the gist thereof.

For example, in Embodiments 1 to 5 described above, the description has been given on the assumption that the MIS transistors to be formed are of an n-channel type. However, the present invention is similarly effective even when applied to MIS transistors of a p-channel type. In that case, the present technology is applied by reversing the respective polarities of the individual wells and source/drain regions.

The present invention is applicable to a semiconductor industry which is necessary for performing information processing in, e.g., a personal computer, mobile equipment, and the like.

What is claimed is:

1. A method of manufacturing a semiconductor device which has a first MISFET and a second MISFET, comprising steps of:
   (a) forming a first gate insulating film of the first MISFET over a first region of a semiconductor substrate;
   (b) forming a second gate insulating film of the second MISFET over a second region of the semiconductor substrate;
   (c) forming a first conductive film over the first and second gate insulating films;
   (d) after the step (c), patterning the first conductive film in order to be kept on the first and second gate insulating films, respectively;
   (e) after the step (d), forming a plurality of grooves in the first and second regions of the semiconductor substrate by using the first conductive films as a mask;
   (f) after the step (e), forming a plurality of element isolations in the grooves by embedding insulating films in the grooves;
   (g) after the step (f), forming a second conductive film over the first conductive film of the first region, the first conductive film of the second region, element isolations of the first region and element isolations of the second region;
   (h) after the step (g), patterning the second conductive film of the first region in order to be kept on the first conductive film of the first region; and
   (i) after the step (g), patterning the second conductive film of the second region and the first conductive film of the second region,
   wherein the first and second conductive films of the first region constitute a gate electrode of the first MISFET,
   wherein the first and second conductive films of the second region constitute a gate electrode of the second MISFET,
   wherein a thickness of the first gate insulating film is larger than a thickness of the second gate insulating film,
   wherein, in a gate length direction of the first MISFET, both edges of the second conductive film of the first region are arranged over the element isolations of the first region, and
   wherein, in a gate length direction of the second MISFET, both edges of the first and second conductive films of the second region are arranged over the semiconductor substrate.

2. A method of manufacturing a semiconductor device according to the claim 1, wherein the steps (h) and (i) are performed at the same time.

3. A method of manufacturing a semiconductor device according to the claim 1, wherein a thickness of the second conductive film is larger than a thickness of the first conductive film.

4. A method of manufacturing a semiconductor device according to the claim 1, wherein the first and second conductive films include poly silicon films, respectively.

5. A method of manufacturing a semiconductor device according to the claim 1, wherein the first and second gate insulating films include silicon oxide films, respectively.

6. A method of manufacturing a semiconductor device according to the claim 1, wherein each of the insulating films includes a silicon oxide film.

7. A method of manufacturing a semiconductor device according to the claim 1, wherein the semiconductor device constitutes a liquid crystal display driver.

8. A method of manufacturing a semiconductor device which has a first MISFET, a second MISFET, and a third MISFET, comprising steps of:
   (a) forming a first gate insulating film of the first MISFET over a first region of a semiconductor substrate;
   (b) forming a second gate insulating film of the second MISFET over a second region of the semiconductor substrate;
   (c) forming a third gate insulating film of the third MISFET over a third region of the semiconductor substrate;
   (d) forming a first conductive film over the first, second, and third gate insulating films;

(f) after the step (d), patterning the first conductive film in order to be kept on the first, second, and third gate insulating films, respectively;

(g) after the step (f), forming a plurality of grooves in the first, second and third regions of the semiconductor substrate by using the first conductive films as a mask;

(h) after the step (g), forming a plurality of element isolations in the grooves by embedding insulating films in the grooves;

(i) after the step (h), forming a second conductive film over the first conductive films of the first, second, and third regions and element isolations of the first, second, and third regions;

(j) after the step (i), patterning the second conductive film of the first region in order to be kept on the first conductive film of the first region;

(k) after the step (i), patterning the second conductive film of the second region and the first conductive film of the second region; and (l) after the step (i), patterning the second conductive film of the third region and the first conductive film of the third region, wherein the first and second conductive films of the first region constitute a gate electrode of the first MISFET, wherein the first and second conductive films of the second region constitute a gate electrode of the second MISFET, wherein the first and second conductive films of the third region constitute a gate electrode of the third MISFET, wherein a thickness of the second gate insulating film is smaller than a thickness of the first gate insulating film and is larger than a thickness of the third gate insulating film, wherein, in a gate length direction of the first MISFET, both edges of the second conductive film of the first region are arranged over the element isolations of the first region, wherein, in a gate length direction of the second MISFET, both edges of the first and second conductive films of the second region are arranged over the semiconductor substrate, and wherein, in a gate length direction of the third MISFET, both edges of the first and second conductive films of the third region are arranged over the semiconductor substrate.

9. A method of manufacturing a semiconductor device according to the claim 8, wherein the steps (j), (k), and (l) are performed at the same time.

10. A method of manufacturing a semiconductor device according to the claim 8, wherein a thickness of the second conductive film is larger than a thickness of the first conductive film.

11. A method of manufacturing a semiconductor device according to the claim 8, wherein the first and second conductive films include poly silicon films, respectively.

12. A method of manufacturing a semiconductor device according to the claim 8, wherein the first, second, and third gate insulating films include silicon oxide films, respectively.

13. A method of manufacturing a semiconductor device according to the claim 8, wherein each of the insulating films includes a silicon oxide film.

14. A method of manufacturing a semiconductor device according to the claim 8, wherein the semiconductor device constitutes a liquid crystal display driver.

* * * * *